United States Patent
Mishra et al.

(10) Patent No.: US 9,650,461 B2
(45) Date of Patent: *May 16, 2017

(54) SEMICONDUCTOR MATERIALS PREPARED FROM DITHIENYLVINYLENE COPOLYMERS

(71) Applicants: BASF SE, Ludwigshafen (DE); FLEXTERRA, INC., Skokie, IL (US)

(72) Inventors: Ashok Kumar Mishra, Singapore (SG); Subramanian Vaidyanathan, Singapore (SG); Hiroyoshi Noguchi, Singapore (SG); Florian Doetz, Singapore (SG); Silke Koehler, Mannheim (DE); Marcel Kastler, Mannheim (DE)

(73) Assignees: BASF SE, Ludwigshafen (DE); FLEXTERRA, INC., Skokie, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/946,190

(22) Filed: Nov. 19, 2015

(65) Prior Publication Data

US 2016/0075808 A1    Mar. 17, 2016

Related U.S. Application Data

(63) Continuation of application No. 13/140,595, filed as application No. PCT/EP2009/067330 on Dec. 16, 2009, now Pat. No. 9,221,944.

(30) Foreign Application Priority Data

Dec. 18, 2008  (EP) ..................................... 08172061
Sep. 2, 2009   (EP) ..................................... 09169242

(51) Int. Cl.
C08G 75/00      (2006.01)
C08F 228/06     (2006.01)
(Continued)

(52) U.S. Cl.
CPC .......... *C08F 228/06* (2013.01); *C08G 61/126* (2013.01); *C08K 3/0008* (2013.01);
(Continued)

(58) Field of Classification Search
CPC .......... C08G 61/126; C08G 2261/3243; C08G 2261/3223; C08G 2261/124; C08G 2261/414; C08G 2261/91; C08G 2261/95
See application file for complete search history.

(56) References Cited

U.S. PATENT DOCUMENTS 5,597,890 A    1/1997  Jenekhe
6,855,950 B2   2/2005  McCreery
(Continued)

FOREIGN PATENT DOCUMENTS

CN    2 432 837 A    6/2007
CN    1989169 A      6/2007
(Continued)

OTHER PUBLICATIONS

Lim et al., Adv. Mater. 2009, 21, 2808-2814.*
(Continued)

*Primary Examiner* — Shane Fang
(74) *Attorney, Agent, or Firm* — Oblon, McClelland, Maier & Neustadt, L.L.P.

(57) ABSTRACT

Disclosed herein are new semiconductor materials prepared from dithienylvinylene copolymers with aromatic or heteroaromatic π-conjugated systems. Such copolymers, with little or no post-deposition heat treatment, can exhibit high charge carrier mobility and/or good current modulation characteristics. In addition, the polymers of the present disclosure can possess certain processing advantages such as improved solution-processability and low annealing temperature.

14 Claims, 8 Drawing Sheets

(51) Int. Cl.
| | |
|---|---|
| C08G 61/12 | (2006.01) |
| C09K 11/06 | (2006.01) |
| H01L 51/00 | (2006.01) |
| C08K 3/00 | (2006.01) |
| C08K 5/00 | (2006.01) |
| H01L 51/05 | (2006.01) |
| H01L 51/42 | (2006.01) |

(52) U.S. Cl.
CPC .......... *C08K 5/0008* (2013.01); *C09K 11/06* (2013.01); *H01L 51/0036* (2013.01); *H01L 51/0043* (2013.01); *C08G 2261/124* (2013.01); *C08G 2261/18* (2013.01); *C08G 2261/3223* (2013.01); *C08G 2261/3327* (2013.01); *C08G 2261/344* (2013.01); *C08G 2261/364* (2013.01); *C08G 2261/414* (2013.01); *C08G 2261/512* (2013.01); *C08G 2261/5222* (2013.01); *C08G 2261/91* (2013.01); *C08G 2261/92* (2013.01); *C09K 2211/1416* (2013.01); *C09K 2211/1425* (2013.01); *C09K 2211/1458* (2013.01); *C09K 2211/1491* (2013.01); *H01L 51/0545* (2013.01); *H01L 51/0558* (2013.01); *H01L 51/42* (2013.01); *Y02E 10/549* (2013.01); *Y02P 70/521* (2015.11)

(56) References Cited

U.S. PATENT DOCUMENTS

| | | |
|---|---|---|
| 7,105,237 B2 | 9/2006 | Sotzing |
| 2006/0202195 A1 | 9/2006 | Marks et al. |
| 2007/0181961 A1 | 8/2007 | Marks et al. |
| 2007/0232812 A1 | 10/2007 | Heeney et al. |
| 2008/0003422 A1 | 1/2008 | Ueda |
| 2010/0283047 A1 | 11/2010 | Facchetti et al. |
| 2010/0326527 A1 | 12/2010 | Facchetti et al. |
| 2011/0101329 A1 | 5/2011 | Kastler et al. |
| 2011/0120558 A1 | 5/2011 | Facchetti et al. |
| 2011/0136333 A1 | 6/2011 | Facchetti et al. |
| 2011/0136973 A1 | 6/2011 | Kastler et al. |
| 2011/0155248 A1 | 6/2011 | Kastler et al. |
| 2011/0168264 A1 | 7/2011 | Kastler et al. |

FOREIGN PATENT DOCUMENTS

| | | |
|---|---|---|
| WO | 9404592 | 3/1994 |
| WO | 2009 098253 | 8/2009 |

OTHER PUBLICATIONS

He, Y., et al., "Poly(thienylene-benzothiadiazole-thienylene-vinylene): A narrow bandgap polymer with broad absorption from visible to infrared region," POLYMER, vol. 50, pp. 5055-5058, (Sep. 6, 2009) XP 026667703.
Yang, C.-J., et al., "Electronic engergy transfer in new polymer nanocomposite assemblies," Supramolecular Science, vol. 1, No. 2, pp. 91-101, (1994) XP 022720573.
Goldoni, F., et al., "Synthesis and Characterization of New Copolymers of Thiophene and Vinylene: Poly(thienylenevinylene)s and Poly(terthienylenevinylene)s with Thioether Side Chains," Journal of Polymer Science: Part A: Polymer Chemistry, vol. 37, pp. 4629-4639, (1999) XP 008106987.
Asawapirom, U., et al., "Dialkylfluorene—Oligothiophene and Dialkylfluorene—Dithienylvinylene Alternating Copolymers," Synthesis, No. 9, pp. 1136-1142, (Jul. 1, 2002) XP 001537816.
Bouachrine, M., et al., "Synthese de polymeres conjugues par voie organometallique," J. Chim. Phys., vol. 95, pp. 1176-1179, (1998) XP 002574083.
Lee, J., et al., "Emission color tuning of new fluorene-based alternating copolymers containing low band gap dyes," Synthetic Metals, vol. 155, pp. 73-79, (Oct. 13, 2005) XP 025270848.
Pina, J., et al., "Spectral and Photophysical Studies of Poly[2,6-(1,5-dioctylnaphthalene)]thiophenes," J. Phys. Chem. C, vol. 111, pp. 7185-7191, (Apr. 24, 2007) XP 002527470.
Beaupre, S., et al., "Fluorene-Based Copolymers for Red-Light-Emitting Diodes," Advanced Functional Materials, vol. 12, No. 3, pp. 192-196, (Mar. 2002) XP 001123889.
Chung, D.S., et al., "High Performance Amorphous Polymeric Thin-Film Transistors Based on Poly[(1,2-bis-(2'-thienyl)vinyl-5',5"-diyl)-*alt*-(9,9-dioctylfluorene-2,7-diyl] Semiconductors," Chem. Mater., vol. 20, pp. 3450-3456, (Apr. 24, 2008) XP 002590151.
Ong, B.S., et al., "High-Performance Semiconducting Polythiophenes for Organic Thin-Film Transistors," J. Am. Chem. Soc., vol. 126, No. 11, pp. 3378-3379, (Mar. 2, 2004).
McCulloch, I., et al., "Liquid-crystalline semiconducting polymers with high charge-carrier mobility," Nature Materials, vol. 5, pp. 328-333, (Mar. 19, 2006).
Pan, H., et al., "Benzodithiophene Copolymer—A Low-Temperature, Solution-Processed High-Performance Semiconductor for Thin-Film Transistors," Advanced Functional Materials, vol. 17, pp. 3574-3579, (2007).
International Search Report issued Jul. 28, 2010 in PCT/EP09/067330 filed Dec. 16, 2009.
J. H. Burroughes, et al., "Light—Emitting Diodes Based on Conjugated Polymers", Nature, vol. 347, Oct. 11, 1990, pp. 539-541 (with cover page).
Arno Kraft, et al., "Electroluminescent Conjugated Polymers-Seeing Polymers in a New Light", Angew. Chem. Int. Ed., 1998, 37, pp. 402-428.
H. Fuchigami, et al., "Polythienylenevinylene Thin-Film Transistor with High Carrier Mobility", Appl. Phys. Lett., 63,(10), Sep. 6, 1993, p. 1372-1374 (with cover page).
Paulette Prins, et al., "Electron and Hole Dynamics on Isolated Chains of a Solution-Processable Poly (thienylenevinylene) Derivative in Dilute Solution", Adv. Mater., 2005, 17, No. 6, pp. 718-723.
S. Gillissen, et al., "Synthesis of a Processable High Molecular Weight Poly (Thienylene Vinylene), Polymerisation and Thin-Film Transistor Properties", Synthetic Metals, 135-136, 2003, pp. 255-256.
Shingetsu Yamada, et al., "New Conducting Polymer Film: Poly(2,5-Thienylenevinylene) Prepared Via a Soluble Precursor Polymer", J. Chem. Soc. Commun., 1987, pp. 1448-1449 (with cover page).
Extended Search Report issued Jul. 15, 2013 in European Application No. 13164964.2.
Dierschke et al. "A hybrid polymer of polyaniline and phthalimide dyes" Synthetic Metals 2006, 156, 433-443. Year of Publication: 2006.
Witzel et al. "New Poly(arylene ethynylene)s Consisting of Electron-Deficient Aryleneimide Untis" Macromol. Rapid Commun. 2005, 26, 889-894. Date of online publication: May 27, 2005.

* cited by examiner

SEMICONDUCTOR MATERIALS PREPARED FROM DITHIENYLVINYLENE COPOLYMERS

CROSS-REFERENCE TO RELATED APPLICATIONS

This application is a Continuation of U.S. application Ser. No. 13/140,595, which was filed on Jun. 17, 2011. U.S. application Ser. No. 13/140,595 is a National Stage of PCT/EP2009/067330, which was filed on Dec. 16, 2009. This application is based upon and claims the benefit of priority to European Application No. 08172061.7, which was filed on Dec. 18, 2008, and to European Application No. 09169242.6, which was filed on Sep. 2, 2009.

BACKGROUND OF THE INVENTION

Since the beginning of the electronic era, the primary building blocks in electronics and microelectronics have been field-effect transistors (FETs) based on inorganic electrodes, insulators, and semiconductors. These materials have proven to be reliable and highly efficient, providing performance that improves continually according to Moore's law. More recently, organic materials have been developed as both active and passive materials in electronic circuitry. Instead of competing with conventional silicon technologies, organic FETs (OFETs) based on molecular and polymeric materials are desired in niche applications, for example, in low-end radio-frequency technologies, sensors, and light emission, as well as in integrated optoelectronic devices such as pixel drives and switching elements in displays. These systems have been widely pursued for the advantages they offer, which include processability via vapor/solution-phase fabrication, good compatibility with different substrates (e.g., flexible plastics), and opportunities for structural tailoring. This trend is further driven by the continued demand for low-cost, large-area, flexible and lightweight devices, and the possibility to process these materials at much lower substrate temperatures compared to inorganic semiconductors.

The simplest and most common OFET device configuration is that of a thin-film transistor (TFT), in which a thin film of the organic semiconductor is deposited on top of a dielectric with an underlying gate (G) electrode. Charge-injecting drain-source (D-S) electrodes providing the contacts are defined either on top of the organic film (top-configuration) or on the surface of the FET dielectric prior to the deposition of the semiconductor (bottom-configuration). The current between the S and D electrodes is low when no voltage ($V_g$) is applied between the G and D electrodes, and the device is in the so called "off" state. When $V_g$ is applied, charges can be induced in the semiconductor at the interface with the dielectric layer. As a result, current ($I_d$) flows in the channel between the S and D electrodes when a source-drain bias ($V_d$) is applied, thus providing the "on" state of a transistor. Key parameters in characterizing FET performance are the field-effect mobility ($\mu$), which quantifies the average charge carrier drift velocity per unit electric field, and the current on/off ratio ($I_{on}:I_{off}$), which is the D-S current ratio between the "on" and "off" states. For a high-performance OFET, the field-effect mobility and on/off ratio should both be as high as possible, for example, having at least $\mu \sim 0.1$-$1$ cm$^2$V$^{-1}$s$^{-1}$ and $I_{on}/I_{off} \sim 10^6$.

Most OFETs operate in p-type accumulation mode, meaning that the semiconductor acts as a hole-transporting material. For most practical applications, the mobility of the field-induced charges should be greater than about 0.01 cm$^2$/Vs. To achieve high performance, the organic semiconductors should satisfy stringent criteria relating to both the injection and current-carrying capacity; in particular: (i) the HOMO/LUMO energies of the material should be appropriate for hole/electron injection at practical voltages; (ii) the crystal structure of the material should provide sufficient overlap of the frontier orbitals (e.g., π-stacking and edge-to-face contacts) to allow charges to migrate among neighboring molecules; (iii) the compound should be very pure as impurities can hinder the mobility of charge carriers; (iv) the conjugated core of the material should be preferentially oriented to allow charge transport in the plane of the TFT substrate (the most efficient charge transport occurs along the direction of intermolecular π-π stacking); and (v) the domains of the crystalline semiconductor should uniformly cover the area between the source and drain contacts, hence the film should have a single crystal-like morphology.

Among the organic p-type semiconductors used in OFETs, the classes of (oligo, poly)thiophenes and acenes are the most investigated. For instance, the first report on a polyheterocycle-based FET was on polythiophene, and poly(3-hexyl)thiophene and α,ω-dialkyloligothiophenes were the first high-mobility polymer and small molecules, respectively. Over the years, chemical modifications of the π-conjugated core, variations in ring-to-ring connectivity and substitution pattern have resulted in the synthesis and testing of a considerable number of semiconductiong materials with improved mobilities.

In order to take full advantage of the cost effciencies of solution processing methods such as spin coating, stamping, ink-jet printing or mass printing such as gravure and offset printing, polymeric organic semiconductors would seem to be the material of choice. Among polythiophenes, soluble regioregular polythiophenes such as poly(3-hexylthiophenes) (P3HT), or poly(3,3'''-didodecylquaterthiophene), poly(2,5-bis-(3-dodecylthiophen-2-yl)-thieno-(3,2-b)thiophene, poly(4,8-didodecyl-2,6-bis-(3-methylthiophen-2-yl)-benzo[1,2-b:4,5-b']dithiophene) and their variants are most promising for OTFT applications due to their high charge carrier mobilities. See for eg. Ong, B. S. et al. *J. Am. Chem. Soc.* 2004, 126, 3378-3379; McCulloch, I. et. al. *Nat. Mater.* 2006, 5, 328-333 and Pan, H. et. al. *Adv. Funct. Mater.* 2007, 17, 3574-3579.

Despite recent advances one of the major drawbacks of these polymers is the need for post deposition annealing to achieve their high mobilities. The annealing temperature can range from 120° C. to 200° C. for between 15 minutes to a few hours. For flexible electronics, if the annealing temperature of organic semiconductor is higher than the glass transition temperature or melting point of the plastic substrate, then the substrate softens before the semiconductor mobility is optimized. Further, adapting even relatively low annealing temperatures for a prolonged period of time in a reel to reel process involves significant costs and lower throughput.

Another drawback with the state-of-the-art high performing semiconductors is the poor solubility in common organic solvents at room temperature. These polymers are sufficiently soluble only in high boiling point chlorinated solvents such as dichlorobenzene and sometimes only at elevated temperature.

Hence, for reel to reel, low cost production of organic electronics, polymeric semiconductors that can be formulated in reasonably high concentrations in common organic solvents and that do not require high and extensive annealing are necessary.

Vinylene moieties in polymers are advantageous as they reduce the aromaticity of the backbone and hence improve charge delocalization, leading to lower band gaps, better conjugation and improved charge transport. Also, the incorporation of vinyl moiety in the semiconductor backbone is expected to afford a certain degree of rotational freedom between its neighbouring aromatic units, which should a priori help to improve the solubility and hence processability of the polymer and, further, to reduce the energy requirement for molecular packing in the solid state (annealing temperature/time). This, in turn offers advantages in fabricating solution processed electronic components such as OTFTs, OLEDs and OPVs.

However, the use of vinyl moieties in polymers has been limited to poly(phenylene vinylenes) and poly(thiophene vinylenes) (PTVs) and variants which have been synthesized and developed. Among the earliest reports of semiconducting polymers are poly(para-phenylenevinylene)s (PPVs) and their derivatives used as active materials in organic light emitting diodes (OLEDs). See eg. Burroughes, J. H. et al. Nature 1990, 347, 539-541 and Kraft, A. et al. Angew. Chem. Int. Ed. 1998, 37, 402-428. PPVs have a relatively large band gap, and poor hole mobilities. For this reason, PTVs and its derivatives were adopted for use in OTFTs. See eg. Fuchigami, H. T. et al. *Appl. Phys. Lett.* 1993, 63, 1372; Prins, P. et. al *Adv. Mater.* 2005, 17, 718; Gillissen, S. et al. *Synth. Met.* 2003, 135-136, 255 and Yamada, S. *J. Chem. Soc., Chem. Commun.* 1987, 1448. It is expected that the high proportion of the vinyl bonds along the polymer backbone makes these polymers disordered in the solid state and this results in the observed hole mobilities of only $10^{-4}$-$10^{-2}$ cm$^2$/Vs.

BRIEF SUMMARY OF THE INVENTION

In light of the foregoing, the present teachings provide organic semiconductor materials and associated compositions, composites, and/or devices that can address various deficiencies and shortcomings of the state-of-the-art, including those outlined above.

More specifically, the present teachings provide polymers having semiconducting activity and semiconductor materials prepared from these polymers, wherein the polymers can be A-B copolymers of optionally substituted dithienylvinylenes (monomer A) in conjugation with aromatic or heteroaromatic cyclic moieties (monomer B). It should be understood that the polymers of the present teachings can be referred to herein as either polymers or copolymers. Further, the polymers can be embedded with other components for utilization in other semiconductor-based devices. The polymers of the present teachings can be used to prepare either p-type or n-type semiconductor materials, which in turn can be used to fabricate various organic electronic articles, structures and devices, including field-effect transistors, unipolar circuitries, complementary circuitries, photovoltaic devices, and light emitting devices.

The polymers of the present teachings can exhibit semiconductor behavior such as high carrier mobility and/or good current modulation characteristics in a field-effect device, and light absorption/charge separation in a photovoltaic device. Similarly, other organic semiconductor based devices such as OPVs, OLETs, and OLEDs can be fabricated efficiently using the polymeric materials described herein. In addition, the present polymers can possess certain processing advantages such as solution-processability and/or reduced annealing temperatures/time.

The polymers of the present teachings have the formula I:

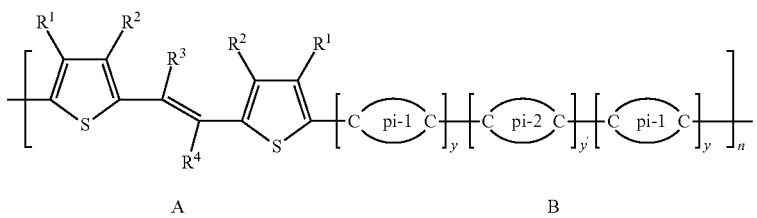

A                                B or the formula I':

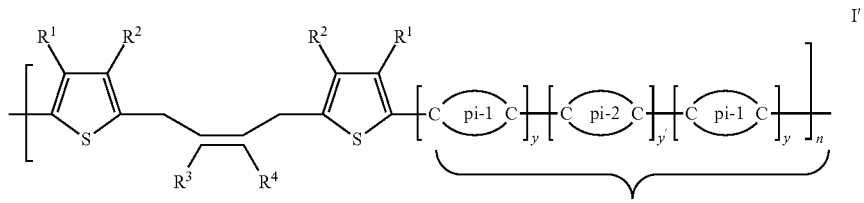

wherein pi-1, pi-2, R$^1$, R$^2$, R$^3$, R$^4$, y, y' and n are as defined herein below.

The present teachings also provide methods of preparing such polymers and semiconductor materials, as well as various compositions, composites, and devices that incorporate the polymers and semiconductor materials disclosed herein.

The foregoing as well as other features and advantages of the present teachings, will be more fully understood from the following figures, description, and claims.

BRIEF DESCRIPTION OF DRAWINGS

It should be understood that the drawings described below are for illustration purpose only. The drawings are not necessarily to scale and are not intended to limit the scope of the present teachings in any way.

Figure 1:
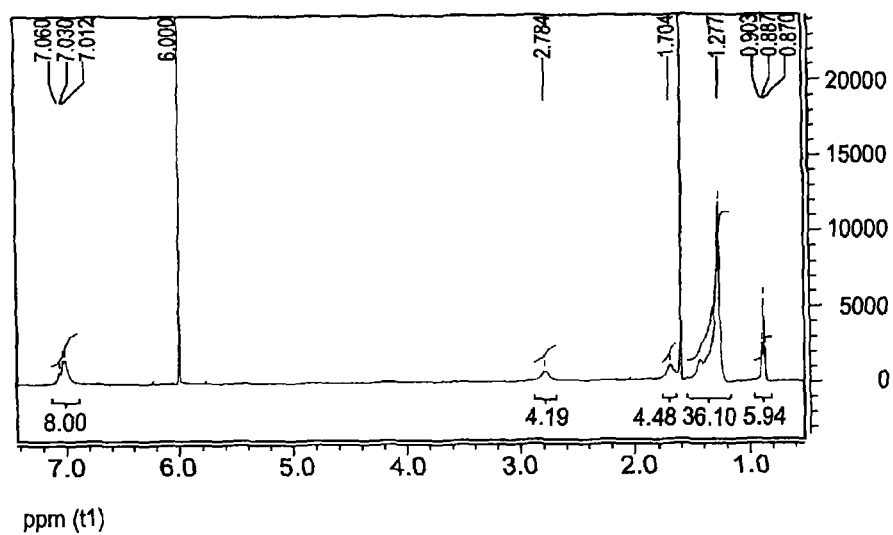
FIG. 1 shows the $^1$H NMR spectra of a polymer of the present teachings (P(T2-12-TVT)), in $CD_2Cl_2$.
Figure 2:
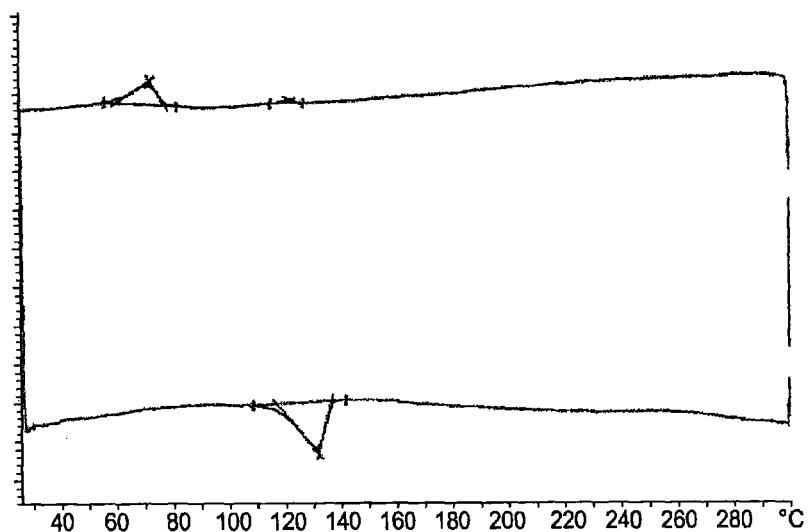
FIG. 2 shows a representative differential scanning calorimetry thermogram of a polymer of the present teachings (P(T2-12-TVT)), obtained under nitrogen with a scanning rate of 10° C./minute.
Figure 3A:
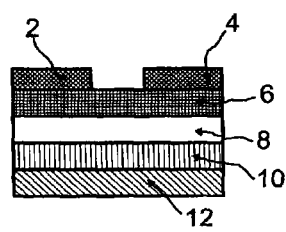
FIG. 3 illustrates four different configurations of thin film transistors: a) bottom-gate top contact, b) bottom-gate bottom-contact, c) top-gate bottom-contact, and d) top-gate top contact; each of which can be used to incorporate polymers of the present teachings.
Figure 3B:
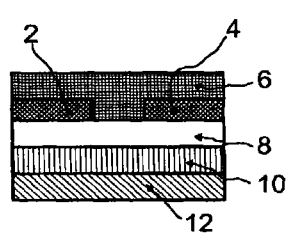
Figure 3C:
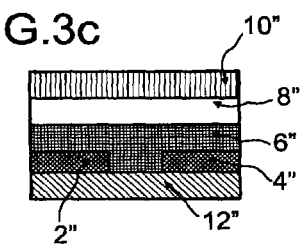
Figure 3D:
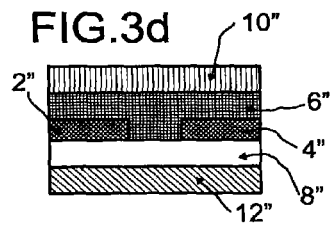
Figure 4:
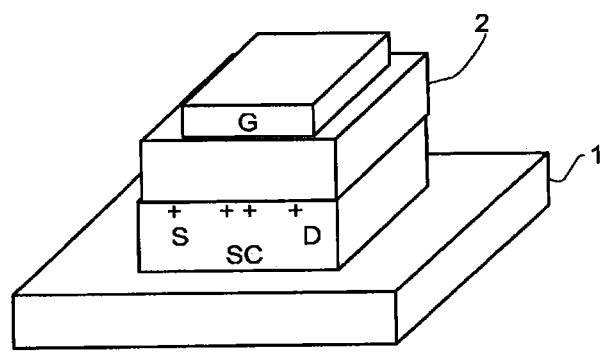
FIG. 4 shows the transistor structure used in Example 3A. Reference numeral 1 denotes the substrate, reference numeral 2 the dielectric layer.

Table 1 summarizes the structure, the material for the different components, and the method of fabrication of various exemplary TFTs incorporating representative polymers of the present teachings.

Table 2 summarizes the hole mobilities of an exemplary polymer of the current teachings (P(TS8TVT)) measured for different annealing temperatures for the semiconductor under ambient conditions and compares this with a state-of-the art polymer structure (P(TS8T2))

DETAILED DESCRIPTION OF THE INVENTION

The present teachings relate to semiconductor materials prepared from dithienylvinylene based copolymers. The present teachings further relate to methods for preparing these copolymers and semiconductor materials, as well as to compositions, composites, materials, articles, structures, and devices that incorporate such copolymers and semiconductor materials.

Accordingly, one aspect of the present teachings provides polymers having semiconducting activity and semiconductor materials prepared from these polymers. More specifically, the polymers can be A-B copolymers comprising a first repeating unit (moiety A) that comprises a dithienylvinylene derivative, and a second repeating unit (moiety B) that includes one or more electron-accepting or electron-donating cyclic moieties. Both moiety A and moiety B typically include an aromatic or otherwise highly conjugated cyclic (carbocyclic or heterocyclic) core, where such cyclic core can be optionally substituted or functionalized with one or more electron-withdrawing, electron-donating and/or solubilizing groups. The pairing of moieties A and B, and any functionalization on either moiety can be affected by one or more of the following considerations: 1) modulation of the majority carrier type depending on the electronic structure of monomers A and B; 2) regiochemistry of the polymerization possibly affording regioregular polymers; 3) the core planarity and linearity of the polymer chain; 4) the capability of additional functionalization of the π-conjugated core; 5) the potential for increased solubility of the polymer for solution processing; 6) achieving strong π-π interactions/intermolecular electronic coupling; and 7) capability of the resulting polymer to crystallize at least partially when processed from solution. The resulting polymers and related methods can be employed to enhance the performance of an associated device (e.g., an organic field effect transistor, a light-emitting transistor, a solar cell, or the like).

Throughout the description, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited processing steps.

In the application, where an element or component is said to be included in and/or selected from a list of recited elements or components, it should be understood that the element or component can be any one of the recited elements or components and can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise.

It should be understood that the order of steps or order for performing certain actions is immaterial so long as the present teachings remain operable. Moreover, two or more steps or actions may be conducted simultaneously.

As used herein, a "p-type semiconductor material" or "p-type semiconductor" refers to a semiconducting material, for example, an organic semiconducting material, having holes as the majority current carriers. In some embodiments, when deposited on a substrate, a p-type semiconductor can provide a hole mobility in excess of about $10^{-5}$ $cm^2/Vs$. In the case of field-effect devices, a p-type semiconductor material also should exhibit a current on/off ratio of greater than about 1000.

As used herein, a "n-type semiconductor material" or "n-type semiconductor" refers to a semiconducting material, for example, an organic semiconducting material, having electrons as the majority current carriers. In some embodiments, when deposited on a substrate, an n-type semiconductor can provide an electron mobility in excess of about $10^{-5}$ cm$^2$/Vs. In the case of field-effect devices, a n-type semiconductor material also should exhibit a current on/off ratio of greater than about 1000.

As used herein, "solution-processable" refers to compounds, materials, or compositions that can be used in various solution-phase processes including spin-coating, printing (e.g., inkjet printing, gravure printing, offset printing), spray coating, electrospray coating, drop casting, dip coating, and blade coating.

As used herein, "polymer" or "polymeric compound" refers to a molecule including at least two or more repeating units connected by covalent chemical bonds. The polymer or polymeric compound can have only one type of repeating unit as well as two or more types of different repeating units. In the former case, the polymer can be referred to as a homopolymer. In the latter case, the term "copolymer" or "copolymeric compound" can be used herein instead, especially when the polymer includes chemically significantly different repeating units. Unless specified otherwise, the assembly of the repeating units in the copolymer can be head-to-tail, head-to-head, or tail-to-tail. In addition, unless specified otherwise, the copolymer can be a random copolymer, an alternating copolymer, or a block copolymer.

As used herein, a "fused ring" or a "fused ring moiety" refers to a polycyclic ring system having at least two rings wherein at least one of the rings is aromatic and such aromatic ring (carbocyclic or heterocyclic) has a bond in common with at least one other ring that can be aromatic or non-aromatic, and carbocyclic or heterocyclic. These polycyclic ring systems can be highly π-conjugated and can include polycyclic aromatic hydrocarbons such as rylenes having the formula:

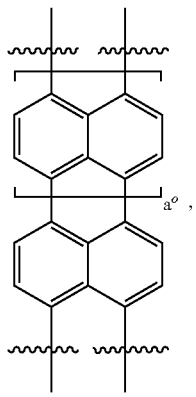

where a° can be an integer in the range of 0-3; coronenes having the formula:

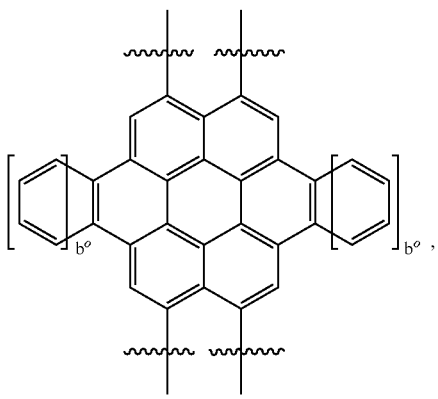

where b° can be an integer in the range of 0-3; and linear acenes having the formula:

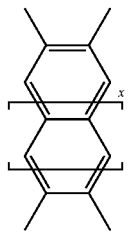

where x can be an integer in the range of 0-4. The fused ring moiety can be optionally substituted as described herein.

As used herein, a "cyclic moiety" can include one or more (e.g., 1-6) carbocyclic or heterocyclic rings. In embodiments where the cyclic moiety is a polycyclic moiety, the polycyclic system can include one or more rings fused to each other (i.e., sharing a common bond) and/or connected to each other via a spiro atom. The cyclic moiety can be a cycloalkyl group, a heterocycloalkyl group, an aryl group, or a heteroaryl group, and can be optionally substituted as described herein.

As used herein, "halo" or "halogen" refers to fluoro, chloro, bromo, and iodo.

As used herein, "alkyl" refers to a straight-chain or branched saturated hydrocarbon group. Examples of alkyl groups include methyl (Me), ethyl (Et), propyl (e.g., n-propyl and isopropyl), butyl (e.g., n-butyl, isobutyl, sec-butyl, tert-butyl), pentyl groups (e.g., n-pentyl, isopentyl, neopentyl), and the like. In various embodiments, an alkyl group can have 1 to 20 carbon atoms, i.e., a $C_{1-20}$ alkyl group. In some embodiments, an alkyl group can have 1 to 6 carbon atoms, and can be referred to as a "lower alkyl group." Examples of lower alkyl groups include methyl, ethyl, propyl (e.g., n-propyl and isopropyl), and butyl groups (e.g. n-butyl, isobutyl, sec-butyl, tert-butyl). In some embodiments, alkyl groups can be substituted as disclosed herein. An alkyl group is generally not substituted with another alkyl group or an alkenyl or alkynyl group.

As used herein, "haloalkyl" refers to an alkyl group having one or more halogen substituents. Examples of haloalkyl groups include $CF_3$, $C_2F_5$, $CHF_2$, $CH_2F$, $CCl_3$, $CHCl_2$, $CH_2Cl$, $C_2Cl_5$, and the like. Perhaloalkyl groups, i.e., alkyl groups wherein all of the hydrogen atoms are replaced with halogen atoms (e.g., $CF_3$ and $C_2F_5$), are included within the definition of "haloalkyl." For example, a $C_{1-20}$ haloalkyl group can have the formula —$C_mX_{2t}$— or —$C_mH_{2m-t}X_t$—, wherein X is F, Cl, Br, or I, m is an integer in the range of 1 to 20, and t is an integer in the range of 0 to 40, provided that m is less than or equal to 2t. Haloalkyl groups that are not perhaloalkyl groups can be optionally substituted as disclosed herein.

As used herein, "arylalkyl" refers to an -alkyl-aryl group, wherein the arylalkyl group is covalently linked to the defined chemical structure via the alkyl group. An arylalkyl group is within the definition of an —Y—$C_{6-14}$ aryl group, where Y is as defined herein. An example of an arylalkyl group is a benzyl group (—$CH_2$—$C_6H_5$). An arylalkyl group can be optionally substituted, i.e. the aryl group and/or the alkyl group can be substituted as disclosed herein.

As used herein, "alkenyl" refers to a straight-chain or branched alkyl group having one or more carbon-carbon double bonds. Examples of alkenyl groups include ethenyl, propenyl, butenyl, pentenyl, hexenyl, butadienyl, pentadienyl, hexadienyl groups, and the like. The one or more carbon-carbon double bonds can be internal (such as in 2-butene) or terminal (such as in 1-butene). In various embodiments, an alkenyl group can have 2 to 20 carbon atoms, i.e., a $C_{2-20}$ alkenyl group. In some embodiments, alkenyl groups can be substituted as disclosed herein. An alkenyl group is generally not substituted with another alkenyl group or an alkyl or alkynyl group.

As used herein, "alkynyl" refers to a straight-chain or branched alkyl group having one or more triple carbon-carbon bonds. Examples of alkynyl groups include ethynyl, propynyl, butynyl, pentynyl, and the like. The one or more triple carbon-carbon bonds can be internal (such as in 2-butyne) or terminal (such as in 1-butyne). In various embodiments, an alkynyl group can have 2 to 20 carbon atoms, i.e., a $C_{2-20}$ alkynyl group. In some embodiments, alkynyl groups can be substituted as disclosed herein. An alkynyl group is generally not substituted with another alkynyl group or an alkyl or alkenyl group.

As used herein, "cycloalkyl" refers to a non-aromatic carbocyclic group including cyclized alkyl, alkenyl, and alkynyl groups. A cycloalkyl group can be monocyclic (e.g., cyclohexyl) or polycyclic (e.g., containing fused, bridged, and/or spiro ring systems), wherein the carbon atoms are located inside or outside of the ring system. Any suitable ring position of the cycloalkyl group can be covalently linked to the defined chemical structure. Examples of cycloalkyl groups include cyclopropyl, cyclopropylmethyl, cyclobutyl, cyclopentyl, cyclohexyl, cyclohexylmethyl, cyclohexylethyl, cycloheptyl, cyclopentenyl, cyclohexenyl, cyclohexadienyl, cycloheptatrienyl, norbornyl, norpinyl, norcaryl, adamantyl, and spiro[4.5]decanyl groups, as well as their homologs, isomers, and the like. In some embodiments, cycloalkyl groups can be substituted as disclosed herein.

As used herein, "heteroatom" refers to an atom of any element other than carbon or hydrogen and includes, for example, nitrogen, oxygen, silicon, sulfur, phosphorus, and selenium.

As used herein, "cycloheteroalkyl" refers to a non-aromatic cycloalkyl group that contains at least one ring heteroatom selected from O, N and S, and optionally contains one or more double or triple bonds. One or more N or S atoms in a cycloheteroalkyl ring can be oxidized (e.g., morpholine N-oxide, thiomorpholine S-oxide, thiomorpholine S,S-dioxide). In some embodiments, nitrogen atoms of cycloheteroalkyl groups can bear a substituent, for example, a hydrogen atom, an alkyl group, or other substituents as described herein. Cycloheteroalkyl groups can also contain one or more oxo groups, such as piperidone, oxazolidinone, pyrimidine-2,4(1H,3H)-dione, pyridin-2(1H)-one, and the like. Examples of cycloheteroalkyl groups include, among others, morpholine, thiomorpholine, pyran, imidazolidine, imidazoline, oxazolidine, pyrazolidine, pyrazoline, pyrrolidine, pyrroline, tetrahydrofuran, tetrahydrothiophene, piperidine, piperazine, and the like. In some embodiments, cycloheteroalkyl groups can be substituted as disclosed herein.

As used herein, "aryl" refers to an aromatic monocyclic hydrocarbon ring system or a polycyclic ring system in which two or more aromatic hydrocarbon rings are fused (i.e., having a bond in common with) together or at least one aromatic monocyclic hydrocarbon ring is fused to one or more cycloalkyl and/or cycloheteroalkyl rings. An aryl group can have from 6 to 30 carbon atoms in its ring system, which can include multiple fused rings. In some embodiments, a polycyclic aryl group can have from 8 to 14 carbon atoms. Any suitable ring position of the aryl group can be covalently linked to the defined chemical structure. Examples of aryl groups having only aromatic carbocyclic ring(s) include phenyl, 1-naphthyl (bicyclic), 2-naphthyl (bicyclic), anthracenyl (tricyclic), phenanthrenyl (tricyclic), and like groups. Examples of polycyclic ring systems in which at least one aromatic carbocyclic ring is fused to one or more cycloalkyl and/or cycloheteroalkyl rings include, among others, benzo derivatives of cyclopentane (i.e., an indanyl group, which is a 5,6-bicyclic cycloalkyl/aromatic ring system), cyclohexane (i.e., a tetrahydronaphthyl group, which is a 6,6-bicyclic cycloalkyl/aromatic ring system), imidazoline (i.e., a benzimidazolinyl group, which is a 5,6-bicyclic cycloheteroalkyl/aromatic ring system), and pyran (i.e., a chromenyl group, which is a 6,6-bicyclic cycloheteroalkyl/aromatic ring system). Other examples of aryl groups include benzodioxanyl, benzodioxolyl, chromanyl, indolinyl groups, and the like. In some embodiments, aryl groups can be substituted as disclosed herein. In some embodiments, an aryl group can have one or more halogen substituents, and can be referred to as a "haloaryl" group. Perhaloaryl groups, i.e., aryl groups wherein all of the hydrogen atoms are replaced with halogen atoms (e.g., —$C_6F_5$), are included within the definition of "haloaryl." In certain embodiments, an aryl group is substituted with another aryl group and can be referred to as a biaryl group. Each of the aryl groups in the biaryl group can be substituted as disclosed herein.

As used herein, "heteroaryl" refers to an aromatic monocyclic ring system containing at least 1 ring heteroatom selected from oxygen (O), nitrogen (N), sulfur (S), selenium (Se) and arsenic (As) or a polycyclic ring system where at least one of the rings present in the ring system is aromatic and contains at least 1 ring heteroatom. Polycyclic heteroaryl groups include two or more heteroaryl rings fused together and monocyclic heteroaryl rings fused to one or more aromatic carbocyclic rings, non-aromatic carbocyclic rings, and/or non-aromatic cycloheteroalkyl rings. A heteroaryl group, as a whole, can have, for example, from 5 to 14 ring atoms and contain 1-5 ring heteroatoms. The heteroaryl group can be attached to the defined chemical structure at any heteroatom or carbon atom that results in a stable structure. Generally, heteroaryl rings do not contain O—O, S—S, or S—O bonds. However, one or more N or S atoms in a heteroaryl group can be oxidized (e.g., pyridine N-oxide, thiophene S-oxide, thiophene S,S-dioxide). Examples of heteroaryl groups include, for example, the 5-membered monocyclic and 5-6 bicyclic ring systems shown below:

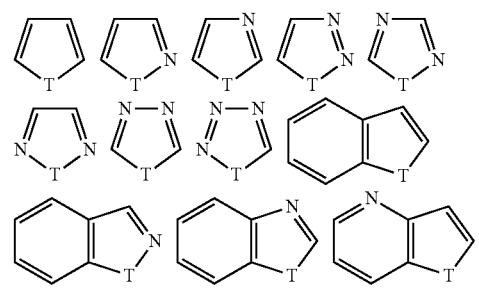

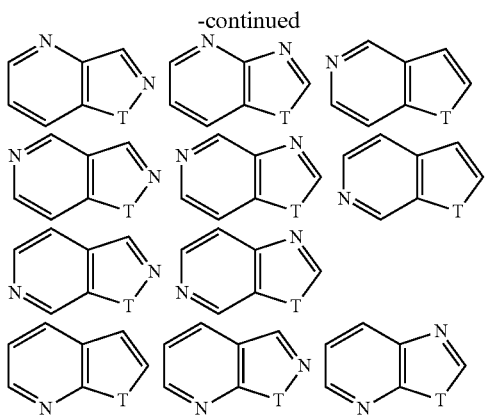

where T is O, S, NH, N-alkyl, N-aryl, or N-(arylalkyl) (e.g., N-benzyl). Examples of such heteroaryl rings include pyrrolyl, furyl, thienyl, pyridyl, pyrimidyl, pyridazinyl, pyrazinyl, triazolyl, tetrazolyl, pyrazolyl, imidazolyl, isothiazolyl, thiazolyl, thiadiazolyl, isoxazolyl, oxazolyl, oxadiazolyl, indolyl, isoindolyl, benzofuryl, benzothienyl, quinolyl, 2-methylquinolyl, isoquinolyl, quinoxalyl, quinazolyl, benzotriazolyl, benzimidazolyl, benzothiazolyl, benzisothiazolyl, benzisoxazolyl, benzoxadiazolyl, benzoxazolyl, cinnolinyl, 1H-indazolyl, 2H-indazolyl, indolizinyl, isobenzofuyl, naphthyridinyl, phthalazinyl, pteridinyl, purinyl, oxazolopyridinyl, thiazolopyridinyl, imidazopyridinyl, furopyridinyl, thienopyridinyl, pyridopyrimidinyl, pyridopyrazinyl, pyridopyridazinyl, thienothiazolyl, thienoxazolyl, thienoimidazolyl groups, and the like. Further examples of heteroaryl groups include 4,5,6,7-tetrahydroindolyl, tetrahydroquinolinyl, benzothienopyridinyl, benzofuropyridinyl groups, and the like. In some embodiments, heteroaryl groups can be substituted as disclosed herein.

As used herein, "solubilizing group" refers to a functional group that makes the resultant molecule more soluble in most common organic solvents than a hydrogen atom would if it occupied the same position in a molecule (for the same molecule-solvent combinations). Examples of solubilizing groups include, but are not limited to alkyl (eg. methyl, ethyl, i-propyl, n-propyl, i-butyl, s-butyl, n-butyl, hexyl, 2-methyl hexyl, octyl, 3,7-dimethyl octyl, decyl, dodecyl, tetradecyl, hexadecyl), alkoxy (eg. methoxy, ethoxy, i-propoxy, n-propoxy, i-butyloxy, s-butyloxy, n-butyloxy, hexyloxy, 2-methyl hexyloxy, octyloxy, 3,7-dimethyl octyloxy, decyloxy, dodecyloxy, tetradecyloxy, hexadecyloxy), thioalkyl (e.g thiooctyl), alkylethers, thioethers.

The electron-donating or electron-withdrawing properties of several hundred of the most common substituents, reflecting all common classes of substituents have been determined, quantified, and published. The most common quantification of electron-donating and electronwithdrawing properties is in terms of Hammett σ values. Hydrogen has a Hammett σ value of zero, while other substituents have Hammett σ values that increase positively or negatively in direct relation to their electron-withdrawing or electron-donating characteristics. Substituents with negative Hammett σ values are considered electron-donating, while those with positive Hammett σ values are considered electron-withdrawing. See Lange's Handbook of Chemistry, 12th ed., McGraw Hill, 1979, Table 3-12, pp. 3-134 to 3-138, which lists Hammett σ values for a large number of commonly encountered substituents and is incorporated by reference herein.

It should be understood that the term "electron-accepting group" can be used synonymously herein with "electron acceptor" and "electron-withdrawing group". In particular, an "electron-withdrawing group" ("EWG") or an "electron-accepting group" or an "electronacceptor" refers to a functional group that draws electrons to itself more than a hydrogen atom would if it occupied the same position in a molecule. Examples of electron withdrawing groups include, but are not limited to, halogen or halo (e.g., F, Cl, Br, I), —NO$_2$, —CN, —NC, —S(R$^o$)$_2$$^+$, —N(R$^o$)$_3$$^+$, —SO$_3$H, —SO$_2$R$^o$, —SO$_3$R$^o$, —SO$_2$NHR$^o$, —SO$_2$N(R$^o$)$_2$, —COOH, —COR$^o$, —COOR$^o$, —CONHR$^o$, —CON(R$^o$)$_2$, $C_{1-40}$ haloalkyl groups, $C_{6-14}$ aryl groups, and 5-14 membered electron poor heteroaryl groups; where R$^o$ is a $C_{1-20}$ alkyl group, a $C_{2-20}$ alkenyl group, a $C_{2-20}$ alkynyl group, a $C_{1-20}$ haloalkyl group, a $C_{1-20}$ alkoxy group, a $C_{6-14}$ aryl group, a $C_{3-14}$ cycloalkyl group, a 3-14 membered cycloheteroalkyl group, and a 5-14 membered heteroaryl group, each of which can be optionally substituted as described herein. For example, each of the $C_{1-20}$ alkyl group, the $C_{2-20}$ alkenyl group, the $C_{2-20}$ alkynyl group, the $C_{1-20}$ haloalkyl group, the $C_{1-20}$ alkoxy group, the $C_{6-14}$ aryl group, the $C_{3-14}$ cycloalkyl group, the 3-14 membered cycloheteroalkyl group, and the 5-14 membered heteroaryl group can be optionally substituted with 1-5 small electronwithdrawing groups such as F, Cl, Br, —NO$_2$, —CN, —NC, —S(R$^o$)$_2$$^+$, —N(R$^o$)$_3$$^+$, —SO$_3$H, —SO$_2$R$^o$, —SO$_3$R$^o$, —SO$_2$NHR$^o$, —SO$_2$N(R$^o$)$_2$, —COOH, —COR$^o$, —COOR$^o$, —CONHR$^o$, —CON(R$^o$)$_2$ It should be understood that the term "electron-donating group" can be used synonymously herein with "electron donor". In particular, an "electron-donating group" or an "electron-donor" refers to a functional group that donates electrons to a neighboring atom more than a hydrogen atom would if it occupied the same position in a molecule. Examples of electron-donating groups include —OH, —OR$^o$, —NH2, —NHR$^o$, —N(R$^o$)$_2$, and 5-14 membered electron-rich heteroaryl groups, where R$^o$ is a $C_{1-20}$ alkyl group, a $C_{2-20}$ alkenyl group, a $C_{2-20}$ alkynyl group, a $C_{6-14}$ aryl group, or a $C_{3-14}$ cycloalkyl group.

Various unsubstituted heteroaryl groups can be described as electron-rich (or π-excessive) or electron-poor (or π-deficient). Such classification is based on the average electron density on each ring atom as compared to that of a carbon atom in benzene. Examples of electron-rich systems include 5-membered heteroaryl groups having one heteroatom such as furan, pyrrole, and thiophene; and their benzofused counterparts such as benzofuran, benzopyrrole, and benzothiophene. Examples of electron-poor systems include 6-membered heteroaryl groups having one or more heteroatoms such as pyridine, pyrazine, pyridazine, and pyrimidine; as well as their benzofused counterparts such as quinoline, isoquinoline, quinoxaline, cinnoline, phthalazine, naphthyridine, quinazoline, phenanthridine, acridine, and purine. Mixed heteroaromatic rings can belong to either class depending on the type, number, and position of the one or more heteroatom(s) in the ring. See Katritzky, A. R and Lagowski, J. M., *Heterocyclic Chemistry* (John Wiley & Sons, New York, 1960).

As used herein, "semicrystalline polymer" refers to a polymer that has an inherent tendency to crystallize at least partially either when cooled from the melt or deposited from solution, when subjected to kinetically favorable conditions such as slow cooling, or low solvent evaporation rate etc. The crystallization or lack thereof can be readily identified by an expert in the field-of-art by using several analytical methods, for eg. differential scanning calorimetry (DSC) and/or X-ray diffraction (XRD).

As used herein, "annealing" refers to a post-deposition heat treatment in to the semicrystalline polymer film in ambient or under reduced/increased pressure for a time duration of more than 100 seconds, and "annealing temperature" refers to the maximum temperature that the polymer film is exposed to for at least 60 seconds during this process of annealing. Without wishing to be bound by any particular theory, it is believed that annealing results in an increase of crystallinity in the polymer film where possible, thereby increasing field effect mobility. The increase in crystallinity can be monitored by several methods, for eg. by comparing the differential scanning calorimetry (DSC) or X-ray diffraction (XRD) measurements of the as-deposited and the annealed films.

At various places in the present specification, substituents of compounds are disclosed in groups or in ranges. It is specifically intended that the description include each and every individual subcombination of the members of such groups and ranges. For example, the term "$C_{1-6}$ alkyl" is specifically intended to individually disclose $C_1$, $C_2$, $C_3$, $C_4$, $C_5$, $C_6$, $C_1$-$C_6$, $C_1$-$C_5$, $C_1$-$C_4$, $C_1$-$C_3$, $C_1$-$C_2$, $C_2$-$C_6$, $C_2$-$C_5$, $C_2$-$C_4$, $C_2$-$C_3$, $C_3$-$C_6$, $C_3$-$C_5$, $C_3$-$C_4$, $C_4$-$C_6$, $C_4$-$C_5$, and $C_5$-$C_6$ alkyl. By way of other examples, an integer in the range of 0 to 40 is specifically intended to individually disclose 0, 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, and 40, and an integer in the range of 1 to 20 is specifically intended to individually disclose 1, 2, 3, 4, 5, 6, 7, 8, 9, 10, 11, 12, 13, 14, 15, 16, 17, 18, 19, and 20. Additional examples include that the phrase "optionally substituted with 1-5 substituents" is specifically intended to individually disclose a chemical group that can include 0, 1, 2, 3, 4, 5, 0-5, 0-4, 0-3, 0-2, 0-1, 1-5, 1-4, 1-3, 1-2, 2-5, 2-4, 2-3, 3-5, 3-4, and 4-5 substituents.

Polymers described herein can contain an asymmetric atom (also referred as a chiral center) and some of the compounds can contain two or more asymmetric atoms or centers, which can thus give rise to optical isomers (enantiomers) and diastereomers (geometric isomers). The present teachings include such optical isomers and diastereomers, including their respective resolved enantiomerically or diastereomerically pure isomers (e.g., (+) or (−) stereoisomer) and their racemic mixtures, as well as other mixtures of the enantiomers and diastereomers. In some embodiments, optical isomers can be obtained in enantiomerically enriched or pure form by standard procedures known to those skilled in the art, which include, for example, chiral separation, diastereomeric salt formation, kinetic resolution, and asymmetric synthesis. The present teachings also encompass cis- and trans-isomers of polymers containing alkenyl moieties (e.g., alkenes, azo, and imines). It also should be understood that the polymers of the present teachings encompass all possible regioisomers in pure form and mixtures thereof. It may be possible to separate such isomers, for example, using standard separation procedures known to those skilled in the art, for example, column chromatography, thin-layer chromatography, simulated moving-bed chromatography, and high-performance liquid chromatography. However, mixtures of regioisomers can be used similarly to the uses of each individual regioisomer of the present teachings. For example, dithienylvinylene-based polymers of the present teachings can include any geometrical isomer of the dithienylvinylene in its pure form (eg. cis- and/or trans-) or mixtures thereof.

It is specifically contemplated that the depiction of one regioisomer includes any other regioisomers and any regioisomeric mixtures unless specifically stated otherwise.

Throughout the specification, structures may or may not be presented with chemical names. Where any question arises as to nomenclature, the structure prevails.

The present teachings provide A-B copolymers wherein the polymers can be A-B copolymers of optionally substituted dithienylvinylenes (monomer A) in conjugation with aromatic and/or heteroaromatic cyclic moieties (monomer B). The present teachings provide A-B copolymers, wherein monomer A is an optionally substituted dithienylvinylene and monomer B is a π-conjugated moiety optionally functionalized with one or more electron withdrawing, electron donating or solubilizing groups. Monomer A and the cyclic core pi-1 (π-1) of monomer B are typically bonded to each other via carbon atoms. Specifically, the polymers of the present teachings have formula I:

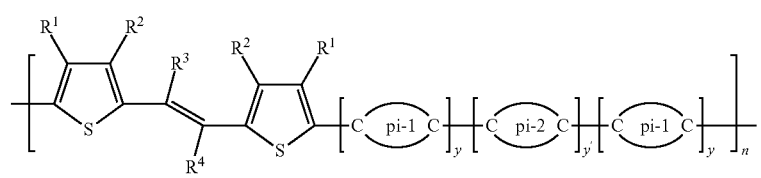

or of the formula I':

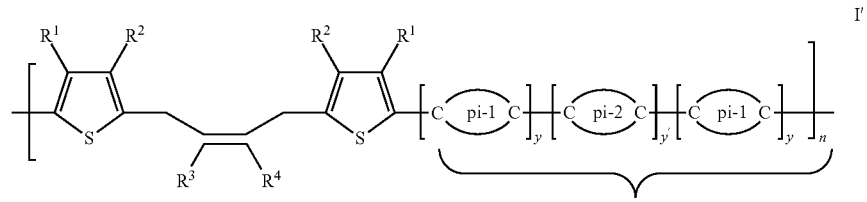

wherein:
pi-1, pi-2 are independently a monocyclic or polycyclic moiety optionally substituted with 1-4 $R^a$ groups;
   wherein:
      $R^a$, at each occurrence, is independently a) a halogen, b) —CN, c) —NO$_2$, d) oxo, e) —OH, f) =C($R^b$)$_2$; g) a C$_{1-20}$ alkyl group, h) a C$_{2-20}$ alkenyl group, i) a C$_{2-20}$ alkynyl group, j) a C$_{1-20}$ alkoxy group, k) a C$_{1-20}$ alkylthio group, l) a C$_{1-20}$ haloalkyl group, m) —Y-a C$_{3-10}$ cycloalkyl group, n) C$_{6-14}$ aryl group, o) a —Y-3-12 membered cycloheteroalkyl group, or p) a —Y-5-14 membered heteroaryl group, wherein each of the C$_{1-20}$ alkyl group, the C$_{2-20}$ alkenyl group, the C$_{2-20}$ alkynyl group, the C$_{3-10}$ cycloalkyl group, the C$_{6-14}$ aryl or haloaryl group, the 3-12 membered cycloheteroalkyl group, and the 5-14 membered heteroaryl group is optionally substituted with 1-4 $R^b$ groups;
      $R^b$, at each occurrence, is independently a) a halogen, b) —CN, c) —NO$_2$, d) oxo, e) —OH, f) —NH$_2$, g) —NH(C$_{1-20}$ alkyl), h) —N(C$_{1-20}$ alkyl)$_2$, i) —N(C$_{1-20}$ alkyl)-C$_{6-14}$ aryl, j) —N(C$_{6-14}$ aryl)$_2$, k) —S(O)$_m$H, l) —S(O)$_m$—C$_{1-20}$ alkyl, m) —S(O)$_2$OH, n) —S(O)$_m$—OC$_{1-20}$ alkyl,
      o) —S(O)$_m$—OC$_{6-14}$ aryl, p) —CHO, q) —C(O)—C$_{1-20}$ alkyl, r) —C(O)—C$_{6-14}$ aryl, s) —C(O)OH, t) —C(O)—OC$_{1-20}$ alkyl, u) —C(O)—OC$_{6-14}$ aryl, v) —C(O)NH$_2$, w) —C(O)NH—C$_{1-20}$ alkyl, x) —C(O)N(C$_{1-20}$ alkyl)$_2$, y) —C(O)NH—C$_{6-14}$ aryl, z) —C(O)N(C$_{1-20}$ alkyl)-C$_{6-14}$ aryl,
      aa) —C(O)N(C$_{6-14}$ aryl)$_2$, ab) —C(S)NH$_2$, ac) —C(S)NH—C$_{1-20}$ alkyl, ad) —C(S)N(C$_{1-20}$ alkyl)$_2$, ae) —C(S)N(C$_{6-14}$ aryl)$_2$, af) —C(S)N(C$_{1-20}$ alkyl)-C$_{6-14}$ aryl, ag) —C(S)NH—C$_{6-14}$ aryl, ah) —S(O)$_m$NH$_2$, ai) —S(O)$_m$NH(C$_{1-20}$ alkyl), aj) —S(O)$_m$N(C$_{1-20}$ alkyl)$_2$, ak) —S(O)$_m$NH(C$_{6-14}$ aryl), al) —S(O)$_m$N(C$_{1-20}$ alkyl)-C$_{6-14}$ aryl, am) —S(O)$_m$N(C$_{6-14}$ aryl)$_2$, an) SiH$_3$, ao) SiH(C$_{1-20}$ alkyl)$_2$, ap) SiH$_2$(C$_{1-20}$ alkyl), ar) —Si(C$_{1-20}$ alkyl)$_3$, as) a C$_{1-20}$ alkyl group, at) a C$_{2-20}$ alkenyl group, au) a C$_{2-20}$ alkynyl group, av) a C$_{1-20}$ alkoxy group, aw) a C$_{1-20}$ alkylthio group, ax) a C$_{1-20}$ haloalkyl group, ay) a C$_{3-10}$ cycloalkyl group, az) a C$_{6-14}$ aryl or haloaryl group, ba) a 3-12 membered cycloheteroalkyl group, or bb) a 5-14 membered heteroaryl group;
   Y, at each occurrence, is independently a divalent C$_{1-6}$ alkyl group, a divalent C$_{1-6}$ haloalkyl group, or a covalent bond; and
   m, at each occurrence, is independently 0, 1 or 2;
$R^1$, $R^2$, at each occurrence, are independently H, halogen, CN, a C$_{1-30}$ alkyl group, a C$_{2-30}$ alkenyl group, a C$_{1-30}$ haloalkyl group, -L-Ar$^1$, -L-Ar$^1$—Ar$^1$, -L-Ar$^1$—$R^{11}$, or -L-Ar$^1$—Ar$^1$—$R^{11}$;
   wherein:
      L, at each occurrence, is independently —O—, —Y—O—Y—, —S—, —S(O)—, —Y—S—Y—, —C(O)—, —NR$^c$C(O)—, —NR$^c$—, —SiR$^c{_2}$—, —Y—[SiR$^c{_2}$]—Y—, a divalent C$_{1-30}$ alkyl group, a divalent C$_{1-30}$ alkenyl group, a divalent C$_{1-30}$ haloalkyl group, or a covalent bond;
      wherein:
         $R^c$, at each occurrence, is H, a C$_{1-20}$ alkyl group, or a —Y—C$_{6-14}$ aryl group;
      Ar$^1$, at each occurrence, is independently a C$_{6-14}$ aryl group or a 5-14 membered heteroaryl group, each optionally substituted with 1-5 substituents selected from a halogen, —CN, a C$_{1-6}$ alkyl group, a C$_{1-6}$ alkoxy group, and a C$_{1-6}$ haloalkyl group; and $R^{11}$, at each occurrence, is independently a C$_{1-20}$ alkyl group, a C$_{2-20}$ alkenyl group, a C$_{1-20}$ haloalkyl group, a C$_{1-20}$ alkoxy group, -L'-Ar$^2$, -L'-Ar$^2$—Ar$^2$, -L'-Ar$^2$—$R^{12}$, or
-L'-Ar$^2$—Ar$^2$—$R^{12}$;
   wherein:
      L', at each occurrence, is independently —O—, —Y—O—Y—, —S—, —S(O)—, —Y—S—Y—, —C(O)—, —NR$^c$C(O)—, —SiR$^c{_2}$—, —Y—[SiR$^c{_2}$]—Y—, a divalent C$_{1-20}$ alkyl group, a divalent C$_{1-20}$ alkenyl group, a divalent C$_{1-20}$ haloalkyl group, or a covalent bond;
      Ar$^2$, at each occurrence, is independently a C$_{6-14}$ aryl group or a 5-14 membered heteroaryl group, each optionally substituted with 1-5 substituents selected from a halogen, —CN, a C$_{1-6}$ alkyl group, a C$_{1-6}$ alkoxy group, and a C$_{1-6}$ haloalkyl group; and
      $R^{12}$ at each occurrence, is a C$_{1-20}$ alkyl group, a C$_{2-20}$ alkenyl group, a C$_{1-20}$ haloalkyl group, or a C$_{1-20}$ alkoxy group;
$R^3$, $R^4$, at each occurrence, are independently H, CN, a C$_{1-30}$ alkyl group, a C$_{2-30}$ alkenyl group, a C$_{1-30}$ haloalkyl group, or -L-$R^{11}$;
   wherein:
      L, at each occurrence, is independently —O—, —Y—O—Y—, —S—, —S(O)—, —Y—S—Y—, —C(O)—, —NR$^c$C(O)—, —NR$^c$—, a divalent C$_{1-30}$ alkyl group, a divalent C$_{1-30}$ alkenyl group, a divalent C$_{1-30}$ haloalkyl group, or a covalent bond;
   wherein:
      $R^c$, at each occurrence, is H, a C$_{1-20}$ alkyl group,
      $R^{11}$, at each occurrence, is independently a C$_{1-20}$ alkyl group, a C$_{2-20}$ alkenyl group, a C$_{1-20}$ haloalkyl group;
Y, at each occurrence, is independently a divalent C$_{1-6}$ alkyl group, a divalent C$_{1-6}$ haloalkyl group, or a covalent bond;
y and y' at each occurrence are independently 0, 1 or 2 provided that y+y'>0,
n is an integer greater than 1.

In some preferred embodiments, $R^1$ and $R^2$ are selected from the group consisting of H, halogen, CN, a C$_{1-30}$ alkyl group, a C$_{2-30}$ alkenyl group, a C$_{1-30}$ haloalkyl group, a C$_{1-20}$ alkoxy group, and a C$_{1-20}$ alkylthio group.

In some preferred embodiments, $R^3$ and $R^4$ are selected from the group consisting of $R^3$, $R^4$, at each occurrence, are independently H, CN, halogen, a C$_{1-30}$ alkyl group, a C$_{2-30}$ alkenyl group, a C$_{1-30}$ haloalkyl group, a C$_{1-20}$ alkoxy group and a C$_{1-20}$ alkylthio group.

In a preferred embodiment the polymers of the present teachings can have the formula I as defined above with the proviso that if y+y'=1, and if $R^3$=$R^4$=H, neither pi-1 nor pi-2 is unsubstituted, N-monosubstituted or N,N'-disubstituted 1,4,5,8-naphthalene diimide-2,6-diyl or is unsubstituted or N-monosubstituted 1,8-naphthalene monoimide-2,6-diyl or is monosubstituted or N,N'-disubstituted 1,4,5,8-naphthalene diimide-2,7-diyl or is unsubstituted or N-monosubstituted 1,8-naphthalene monoimide-3,6-diyl or is unsubstituted, N-monosubstituted or N,N'-disubstituted 3,4,9,10-perylenediimide-1,7-diyl or is unsubstituted, N-monosubstituted or N,N'-disubstituted 3,4,9,10-perylenediimide-1,6-diyl or is unsubstituted or N-monosubstituted and/or 9,10 disubstituted 3,4-perylene monoimide-1,7-diyl or is unsubstituted or N-monosubstituted and/or 9,10 disubstituted 3,4-perylene monoimide-1,6-diyl.

Furthermore, to aid solubility and without causing disruption of the intrachain π-conjugation and interchain stacking, alkyl chains (and similar groups such as haloalkyl groups, arylalkyl groups, heteroarylalkyl groups and so forth) can be substituted symmetrically on one or both positions of the thiophene rings and/or on the vinyl linkage. Accordingly, in certain preferred embodiments, $R^1$, $R^2$, $R^3$ and $R^4$ can independently be a linear or branched $C_{1-20}$ alkyl group or a linear or branched $C_{2-20}$ alkenyl group. For example, $R^1$, $R^2$, $R^3$, $R^4$ at each occurrence independently can be selected from n-hexyl, n-octyl, n-decyl, n-dodecyl, n-tetradecyl and n-hexadecyl. In certain embodiments, at least one of $R^1$ and $R^2$ can be H.

In some embodiments, pi-1 and pi-2 can independently be a planar and highly conjugated cyclic core, wherein the ring atoms are covalently bonded with alternating single and double bonds. The highly conjugated and planar nature of such cores can promote π-electron delocalization (thereby increasing stability and lowering LUMO energy), and provide good intermolecular π-stacking. Examples of suitable cyclic cores include benzene, naphthalene, anthracene, tetracene, pentacene, perylene, pyrene, coronene, fluorene, indacene, indenofluorene, and tetraphenylene, as well as their analogs in which one or more carbon atoms are replaced with a heteroatom such as O, S, Si, Se, N or P.

In some embodiments, pi-1 can be an optionally substituted monocyclic, bicyclic or heterocyclic moiety selected from:

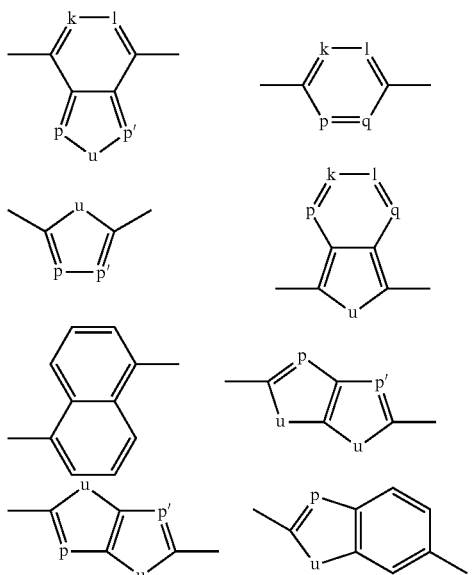

wherein:
k, l, p, p' and u independently are selected from —S—, —O—, —CH=, =CH—, —CR¹³=, =CR¹³—, —C(O)—, —C(C(CN)₂)—, —N=, =N—, —NH— and —NR¹³ and pi-2 can be an optionally substituted monocyclic, heterocyclic or polycyclic moiety selected from:

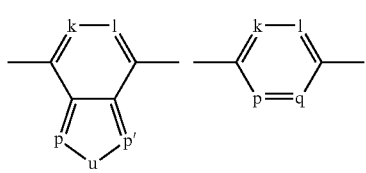

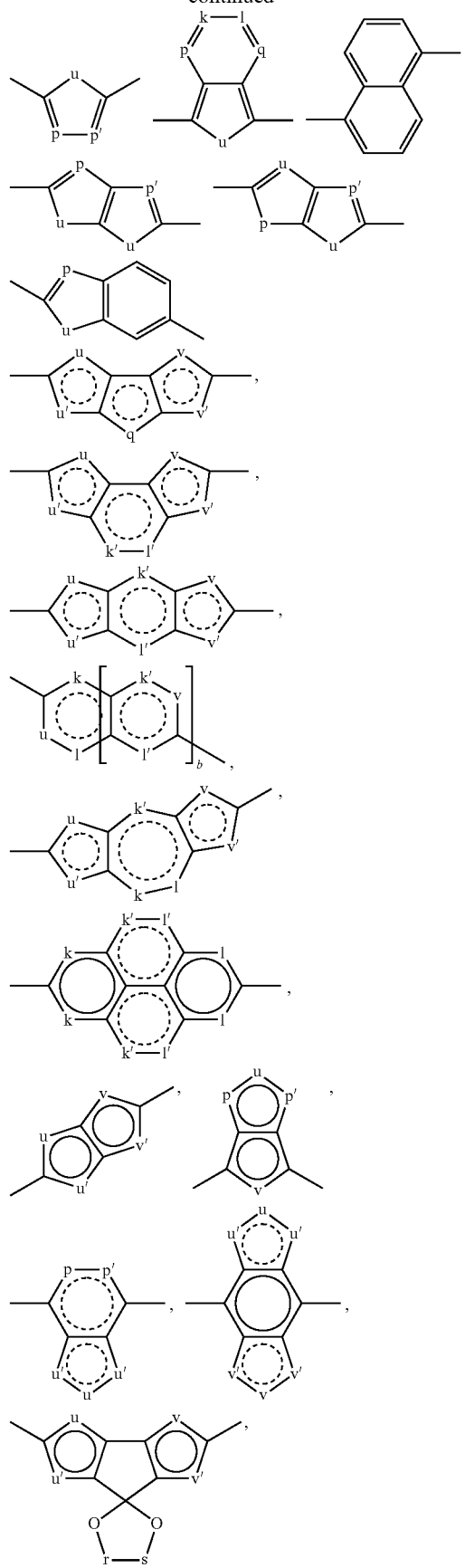

-continued

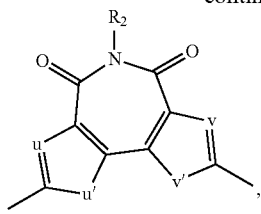

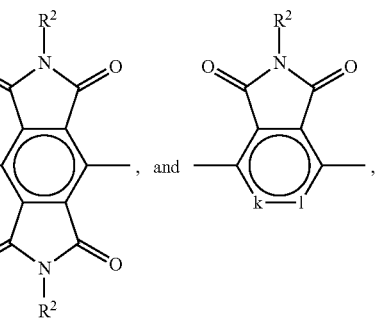

wherein:
- k, k', l, l', p, p', q, u, u', v and v' independently are selected from —S—, —O—, —CH=, =CH—, —CR¹³=, =CR¹³—, —C(O)—, —C(C(CN)₂)—, —N=, =N—, —NH—, —NR¹³—, —SiR¹⁴=, =SiR¹⁴—, and —SiR¹⁴R¹⁴—;
- R¹³, at each occurrence, is independently selected from a) halogen, b) —CN, c) —NO₂, d) N(R^c)₂, e) —OR^c, f) —C(O)R^c, g) —C(O)OR^c, h) —C(O)N(R^c)₂, i) a $C_{1-40}$ alkyl group, j) a $C_{2-40}$ alkenyl group, k) a $C_{2-40}$ alkynyl group, l) a $C_{1-40}$ alkoxy group, m) a $C_{1-40}$ alkylthio group, n) a $C_{1-40}$ haloalkyl group, o) a —Y—$C_{3-14}$ cycloalkyl group, p) a —Y—$C_{6-14}$ aryl group, q) a —Y-3-14 membered cycloheteroalkyl group, and r) a —Y-5-14 membered heteroaryl group, wherein each of the $C_{1-40}$ alkyl group, the $C_{2-40}$ alkenyl group, the $C_{2-40}$ alkynyl group, the $C_{3-14}$ cycloalkyl group, the $C_{6-14}$ aryl group, and the 3-14 membered cycloheteroalkyl group and Y and R^c are as defined herein.
- R¹⁴, at each occurrence, independently can be H or R^c, wherein R^c is as defined herein;
- r and s independently can be —CR²R²— or —C(C(CN)₂)—; and
- b is 1, 2, 3 or 4.

In certain embodiments be pi-1 (π-1) can be monocyclic, bicyclic or heterocyclic moiety including one or more thienyl, thiazolyl, or phenyl groups, where each of these groups can be optionally substituted as disclosed herein. For example, pi-1 can be selected from

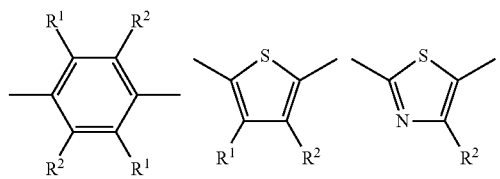

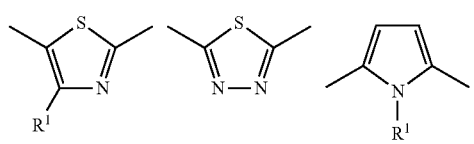

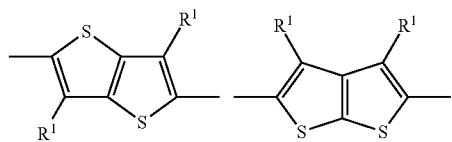

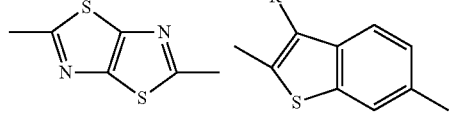

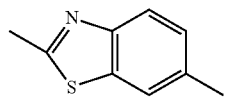 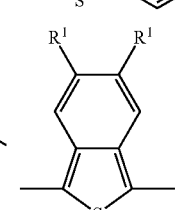

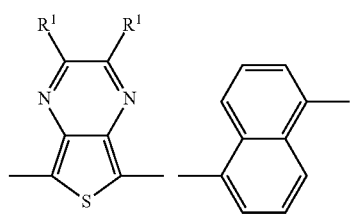

wherein R¹ and R² at each occurrence are as defined herein.

In certain embodiments pi-2 (π-2) can be monocyclic, polycyclic or heterocyclic moiety including one or more thienyl, thiazolyl, or phenyl groups, where each of these groups can be optionally substituted as disclosed herein. For example, pi-2 can be selected from

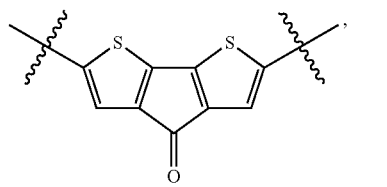

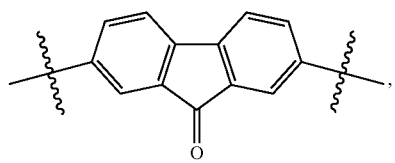

21
-continued
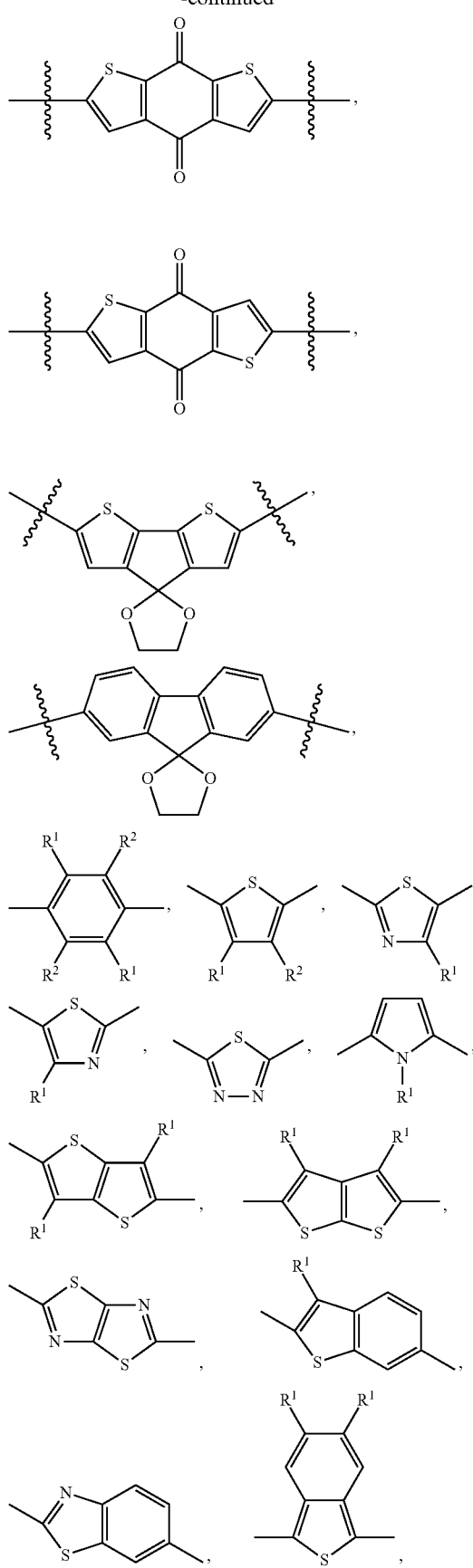
22
-continued
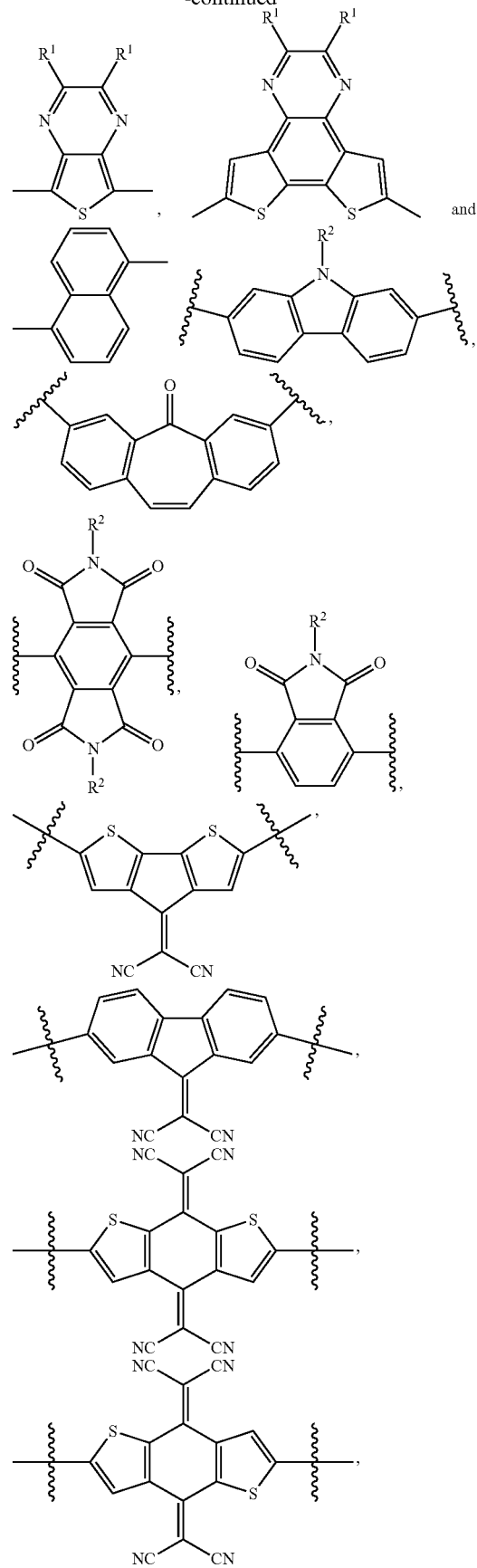
and

-continued
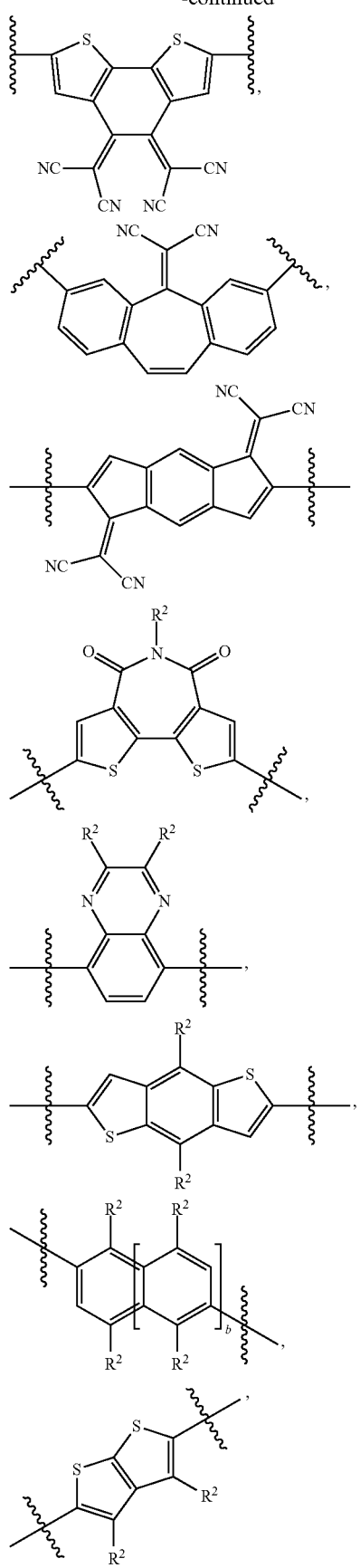
-continued
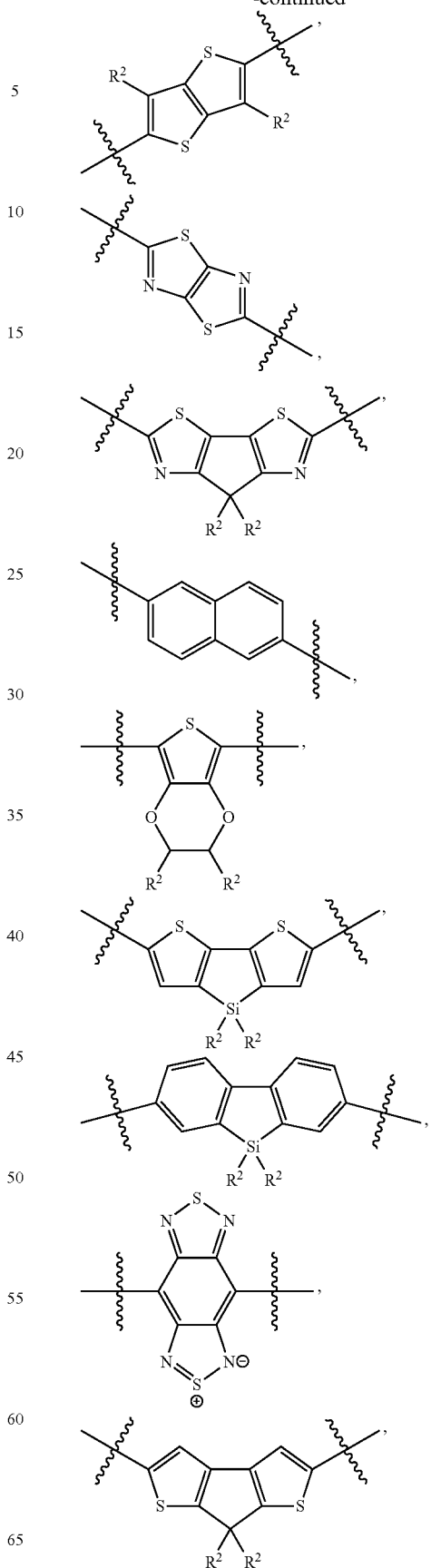

-continued

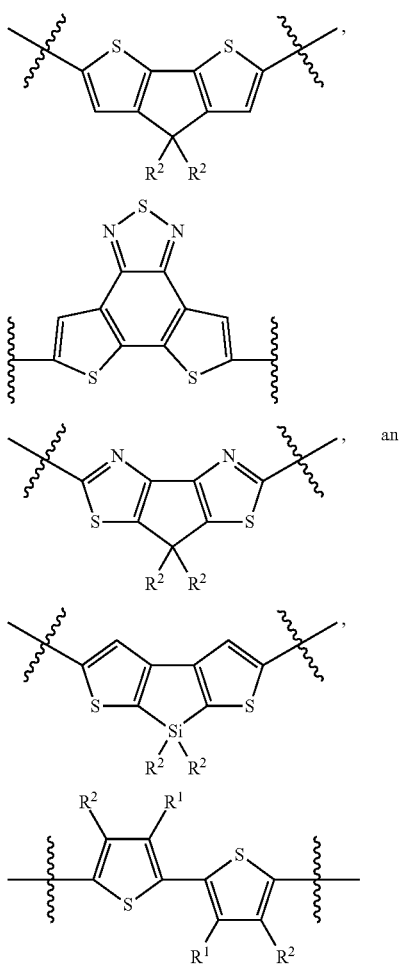

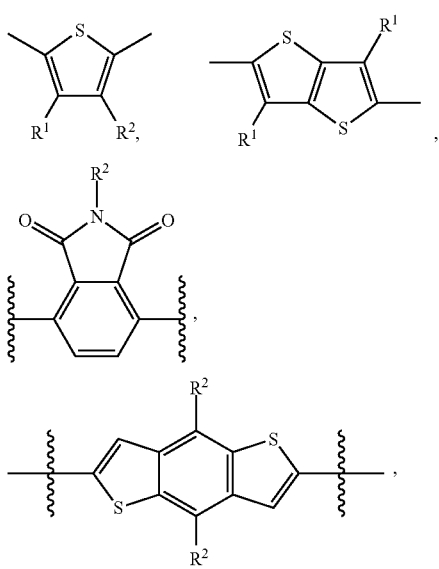

wherein R¹ and R² at each occurrence are as defined herein.

In some preferred embodiments, y=0 and pi-2 is selected from the group consisting of -continued

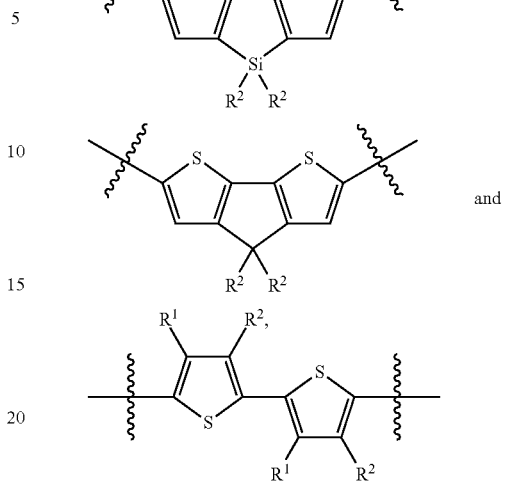

It should be understood that the present teachings can exclude certain embodiments of compounds within the genus of compounds of formula I described above. For example, it should be understood that embodiments of the present teachings can exclude a polymer of formula I wherein comonomer B is one monocyclic unit. As an example, embodiments of the present teachings can exclude a polymer of formula I wherein monomer B is

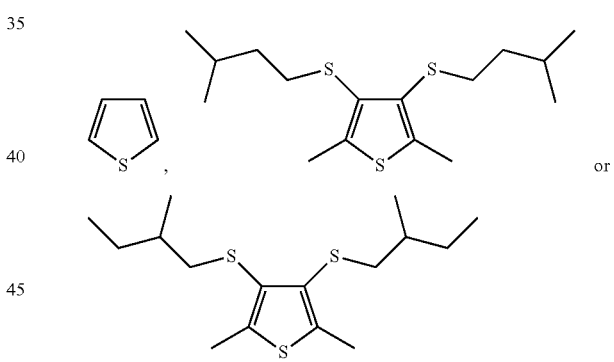

As a further example, it should be understood that embodiments of the present teachings can exclude a polymer of formula I wherein comonomer B is a bicyclic or tricyclic unit without a nitrogen atom and without a sulfur atom in the cyclic moiety. As an example, embodiments of the present teachings can exclude a polymer of formula I wherein monomer B is

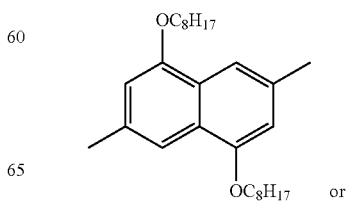

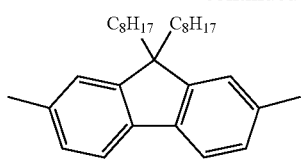

As a further example, it should be understood that embodiments of the present teachings can exclude a polymer of formula I, wherein comonomer B consists of a benzathiazole moiety. In particular, embodiments of the present teachings can exclude a polymer of formula I wherein B is

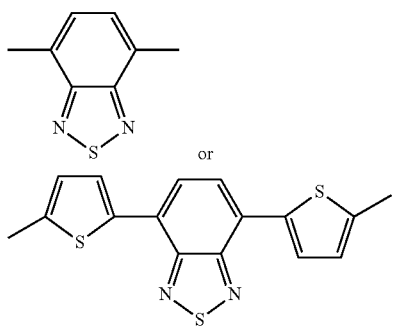

For the various polymers described above, n can be an integer between 2 and 5000. In some embodiments, n can be 4-5000, 5-5000, 6-5000, 7-5000, 8-5000, 9-5000, or 10-5000. For example, n can be 8-4000, 8-2000, 8-500, or 8-200. In certain embodiments, n can be 8-100.

Accordingly, in certain embodiments, the polymers of present teaching can include repeating units of Formula Ia or Ia'

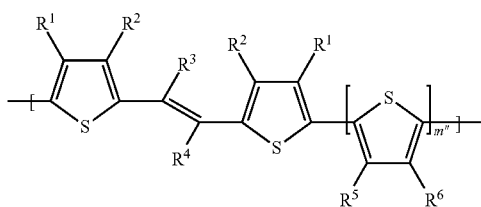

wherein $R^1$, $R^2$, $R^3$, and $R^4$, are as defined herein, $R^5$ and $R^6$ are defined as $R^1$, and m" is 1, 2, 3, 4, 5, 6, 7, 8, 9 or 10.

For example in certain embodiments, polymers of the present teaching can include repeating units of one or more of Formulae Ib, Ic, Id, Ie, If, Ig, Ih, Ii, and Ij

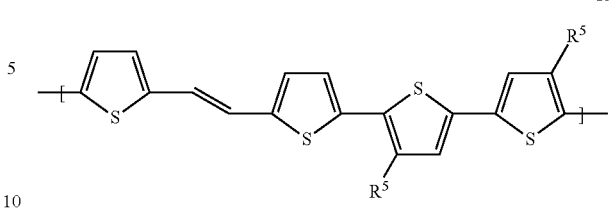

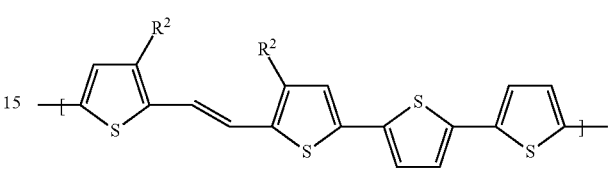

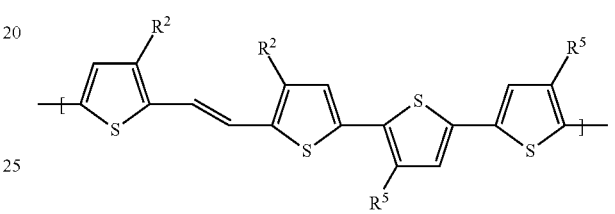

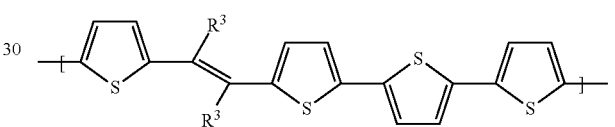

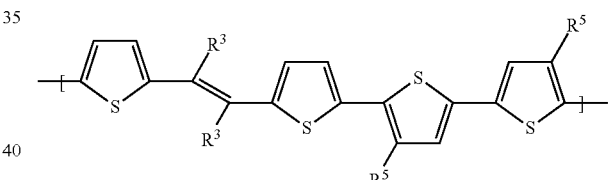

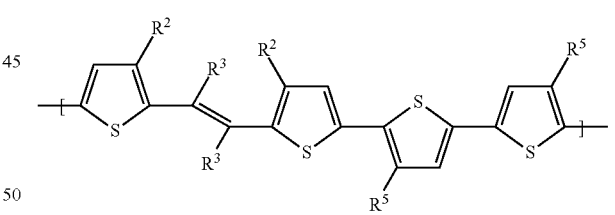

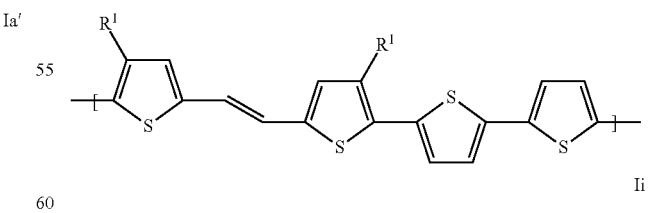

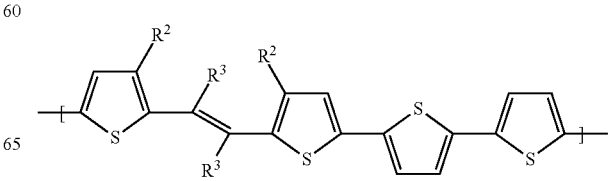

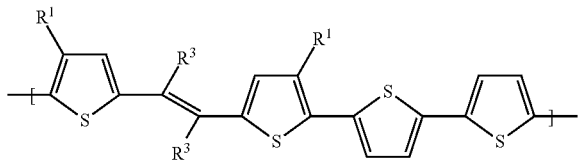
Ij wherein $R^1$, $R^2$, $R^3$ and $R^5$ are as defined herein. For example, $R^3$ at each occurrence, can be independently selected from —CN, a $C_{1-40}$ alkyl group, $C_{1-40}$ alkoxy group and $C_{1-40}$ alkylthiol group.

As a further example, certain embodiments of the polymers of the present teachings can include repeating units of one or more of Formulae Ik, Il, Im, In, Io, Ip, Iq, Ir, Is, It, Iu, Iv, Iw, Ix, Iy, Iz, Iaa, Iab and Iac:

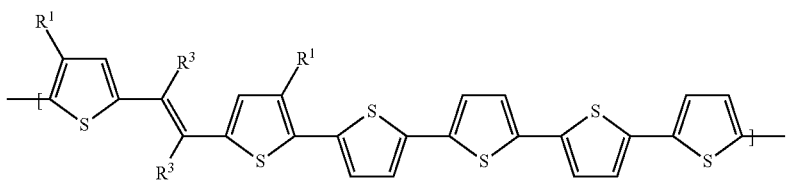
Ik

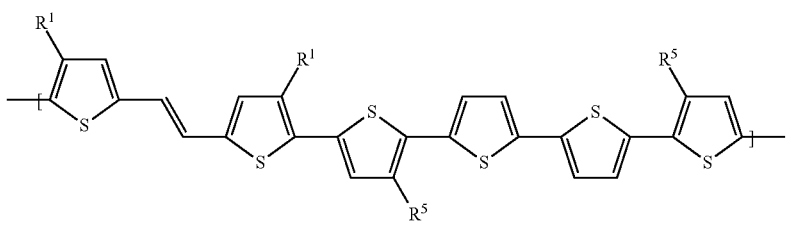
Il

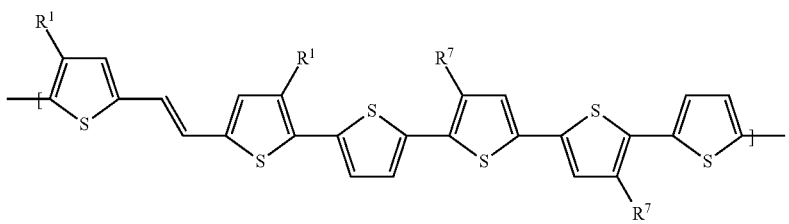
Im

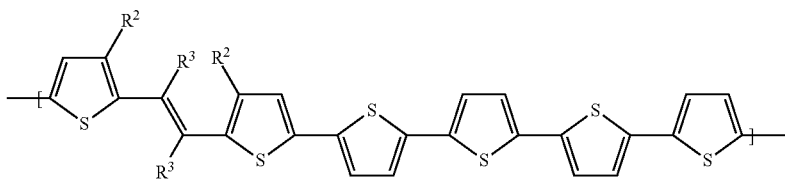
In

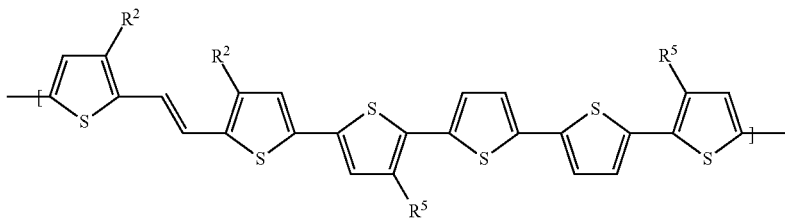
Io

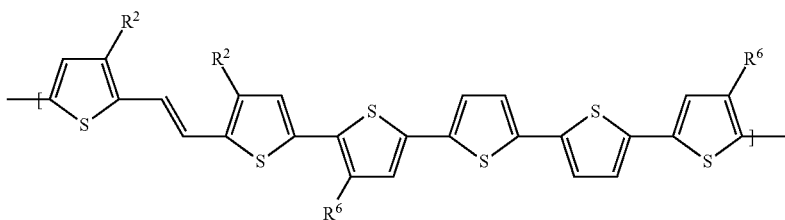
Ip

-continued
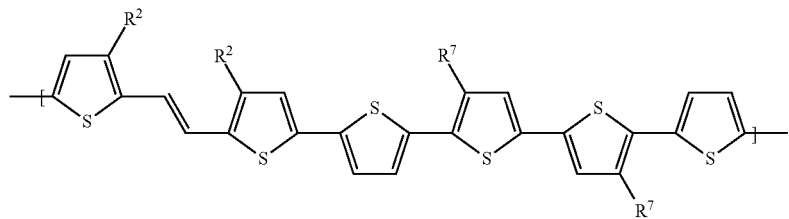
Iq
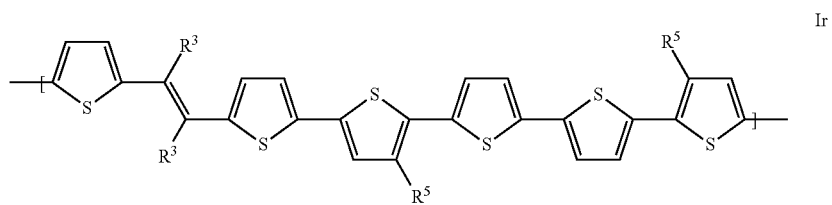
Ir
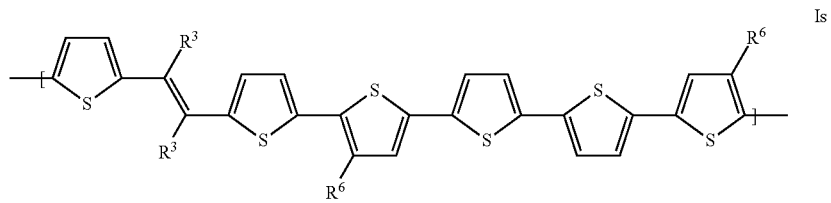
Is
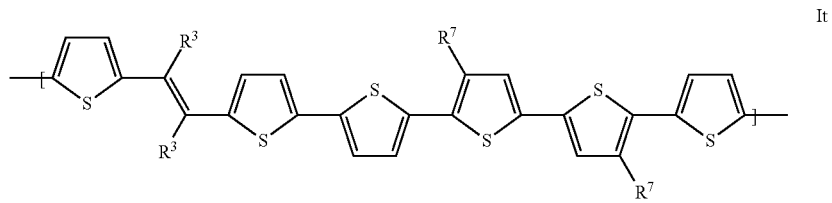
It
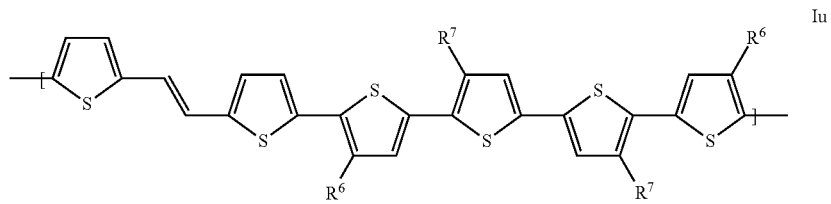
Iu
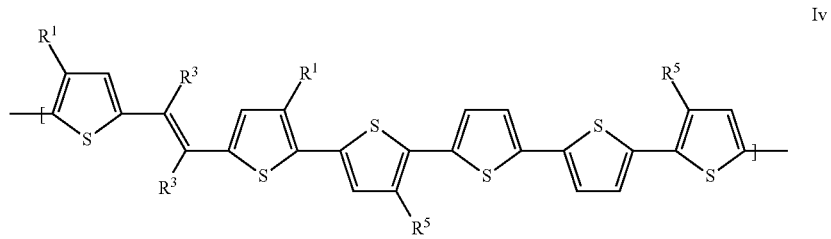
Iv
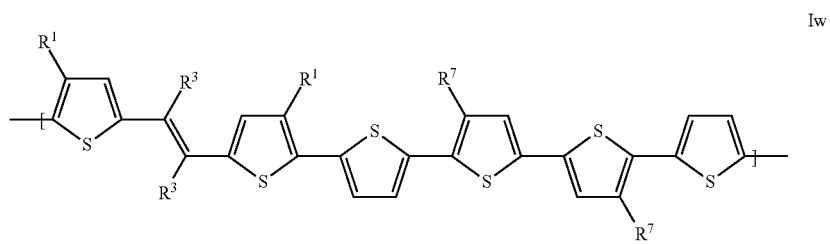
Iw

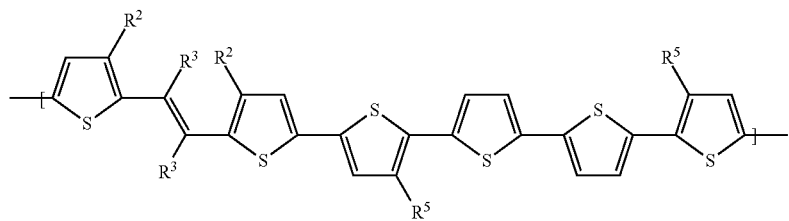
Ix
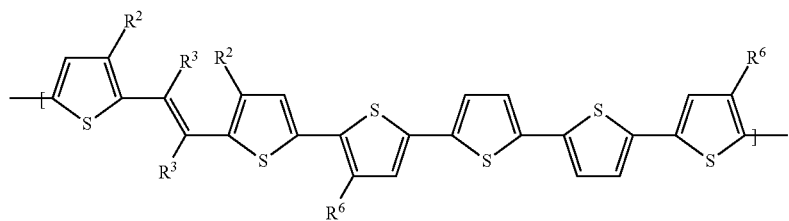
Iy
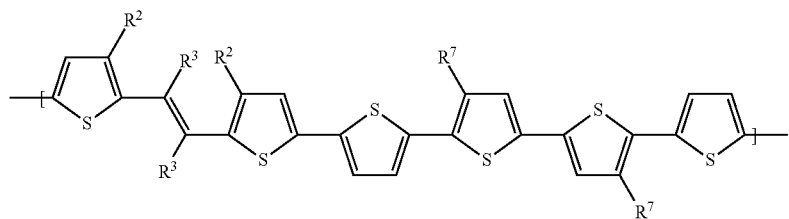
Iz
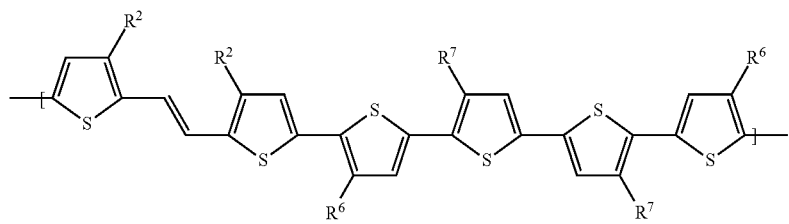
Iaa
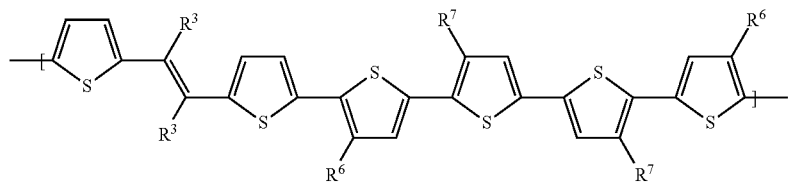
Iab
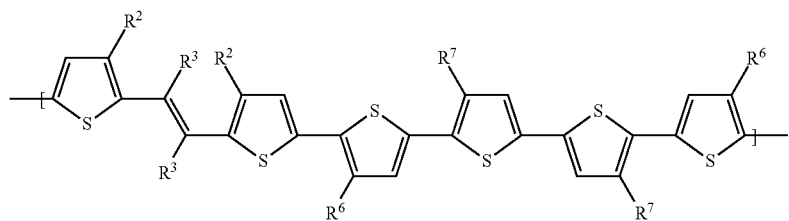
Iac wherein $R^1$, $R^2$, $R^3$, $R^5$ and $R^6$ are as defined herein. $R^7$ is defined as $R^1$. For example, $R^3$ at each occurrence, can be independently selected from —CN, a $C_{1-30}$ alkyl group, $C_{1-20}$ alkoxy group and $C_{1-20}$ alkylthiol group.

As a further example, certain embodiments of the polymers of the present teaching include repeating units of the formula Iad:

Iad

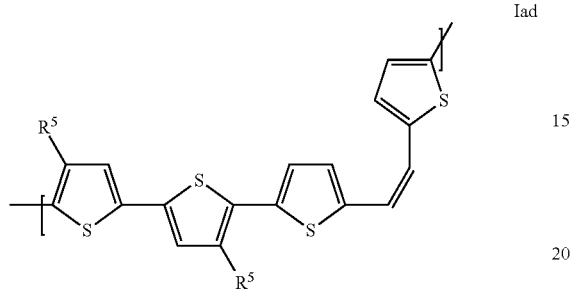

wherein $R^5$ is as defined herein.

As a still further example, certain embodiments of the polymers of the present teaching include repeating units of the formula Iae and Iaf:

Iae

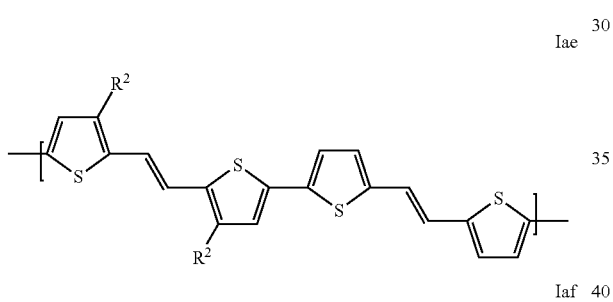

Iaf

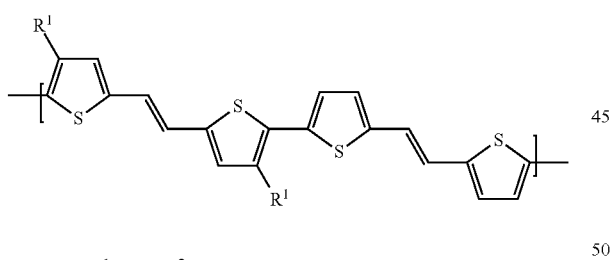

wherein $R^1$ and $R^2$ are as defined herein.

As a still further example, certain embodiments of the polymers of the present teaching include repeating units of the formula Iag, Iah, Iai, Iak and Ial Iag

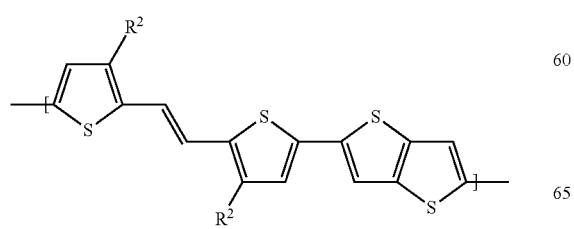

Iah

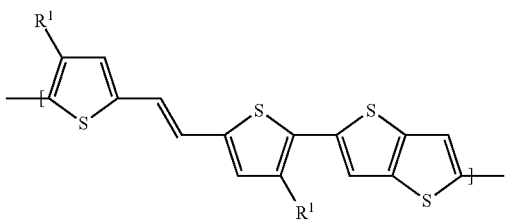

Iai

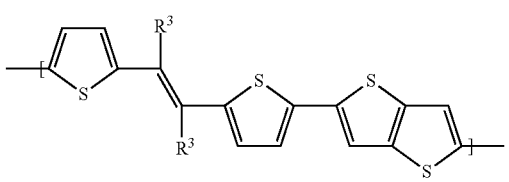

Iak

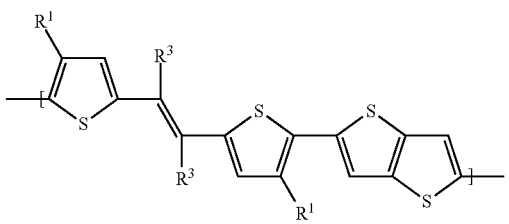

Ial

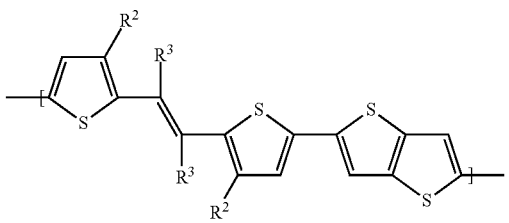

Iam

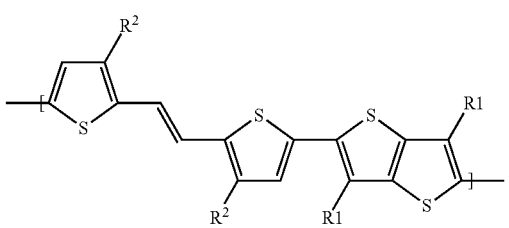

Ian
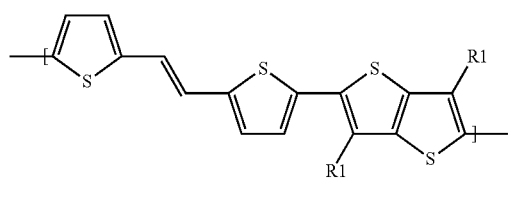
Iao
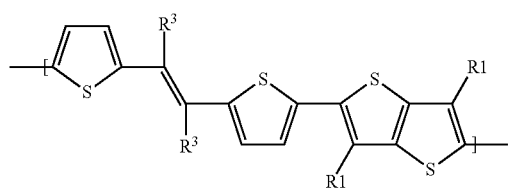
Iap
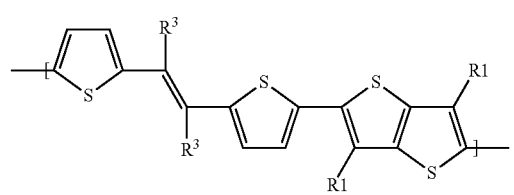
wherein $R^1$, $R^2$ and $R^3$ are as defined herein.
Further, in certain embodiments, the polymers of present teaching can include repeating units of Formulae IIa and IIa'
IIa
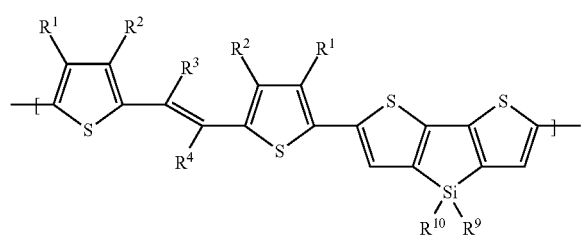
IIa'
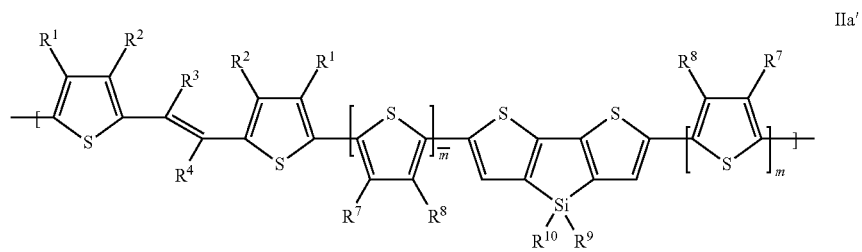

wherein $R^1$, $R^2$, $R^3$, $R^4$, and $R^7$ are as defined herein,
$R^8$ is defined as $R^1$,
$R^9$ and $R^{10}$ can be independently selected from —H or a $C_{1-40}$ alkyl, haloalkyl or alkylthiol group. For example, $R^3$ at each occurrence, can be independently selected from —CN, a $C_{1-30}$ alkyl group, $C_{1-20}$ alkoxy group and $C_{1-20}$ alkylthiol group.
and m is 1, 2, 3, 4, 5 or 6.

For example in certain embodiments, polymers of the present teaching can include repeating units of one or more of Formulae IIb, IIc, IId, IIe, IIf and IIg.

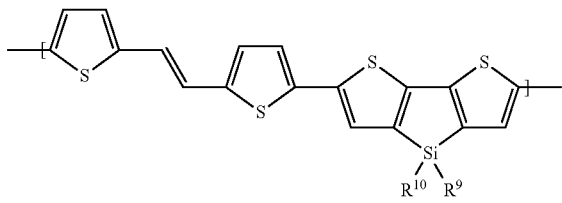

IIb

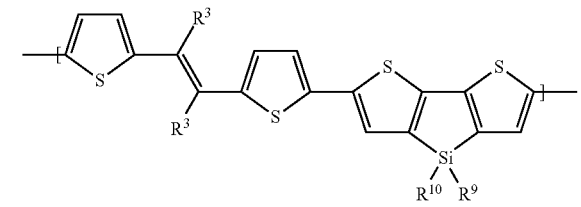

IIe

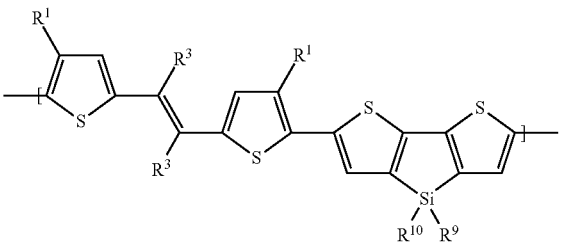

IIf

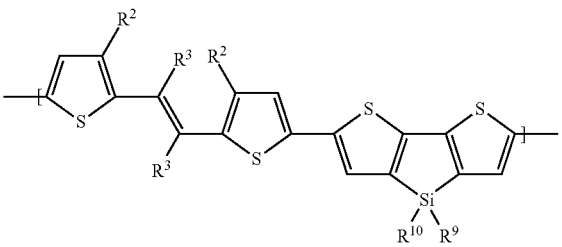

IIg

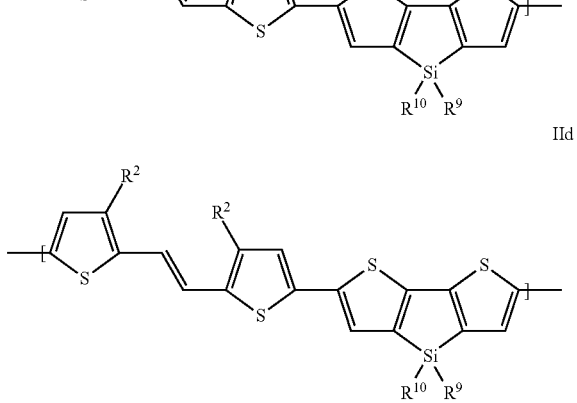

IIc

IId wherein $R^1$, $R^2$, $R^3$, $R^9$ and $R^{10}$ are as defined herein. For example, $R^3$ at each occurrence, can be independently selected from —CN, a $C_{1-30}$ alkyl group, $C_{1-20}$ alkoxy group and $C_{1-20}$ alkylthiol group.

As a further example, in certain embodiments, polymers of the present teaching can include repeating units of one or more of Formulae IIb', IIc', IId', IIe', IIf', IIg', IIh', IIi', IIj', IIk', IIl', IIm', IIn', IIo' and IIp'.

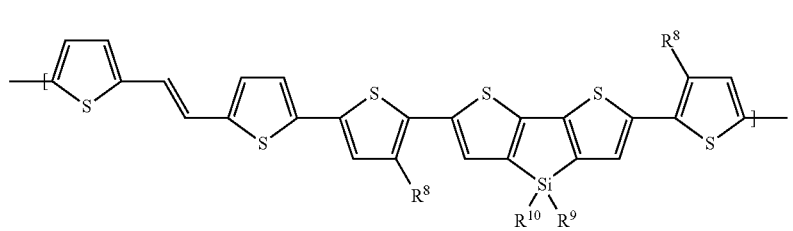

IIb'

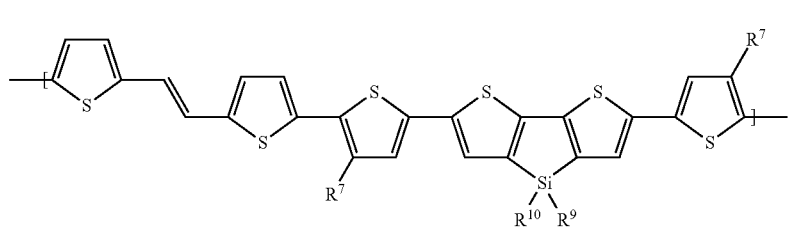

IIc'

-continued
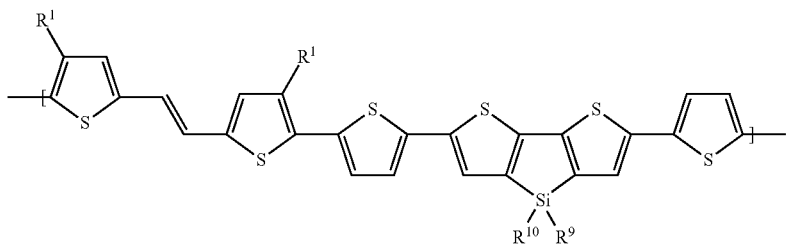
IId'
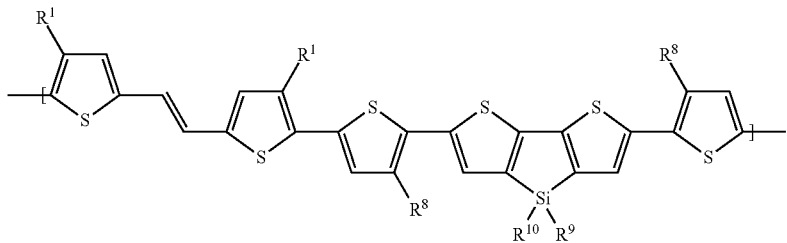
IIe'
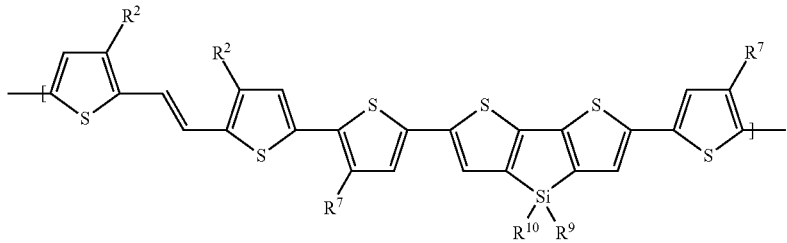
IIf'
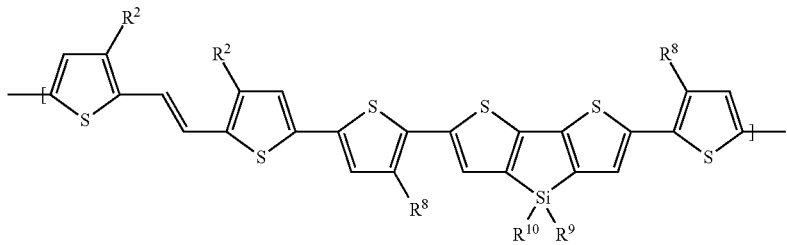
IIg'
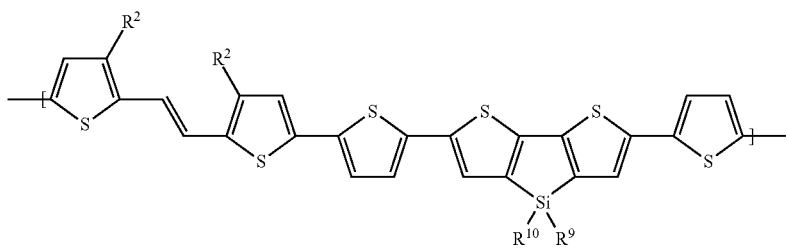
IIh'
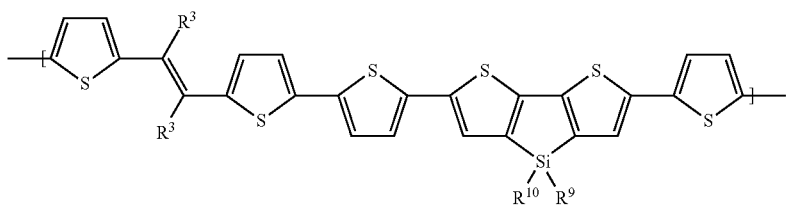
IIi'

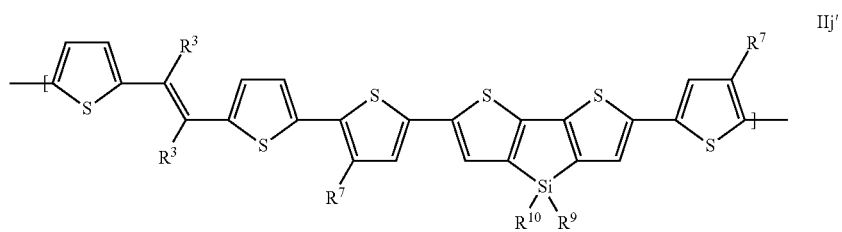
IIj'
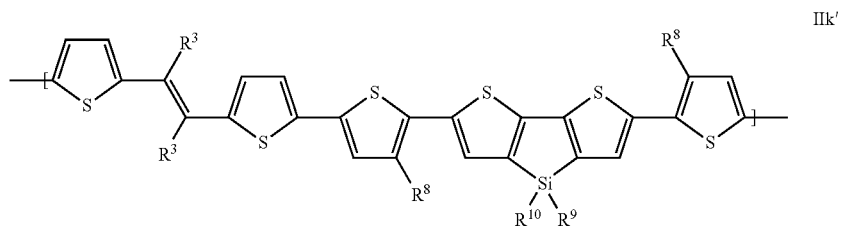
IIk'
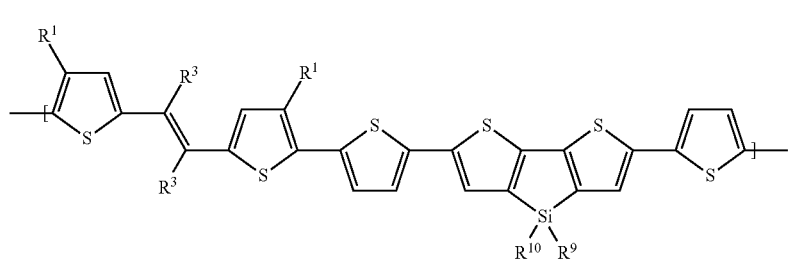
III'
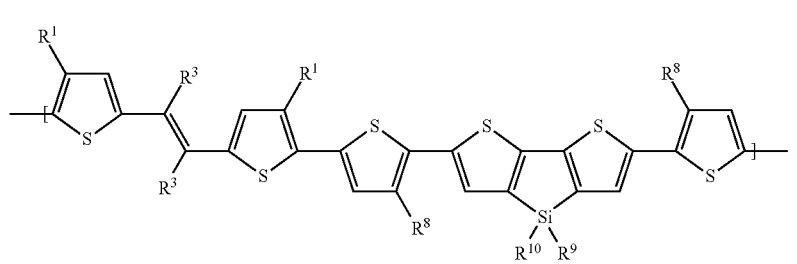
IIm'
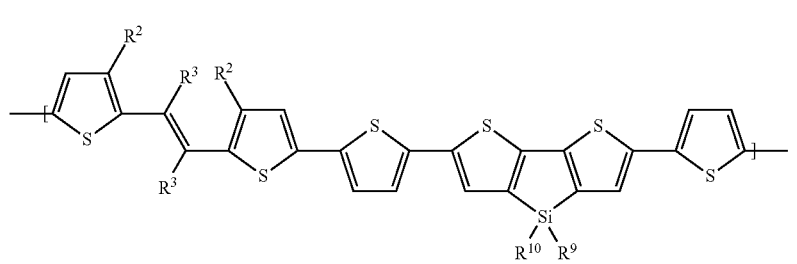
IIn'
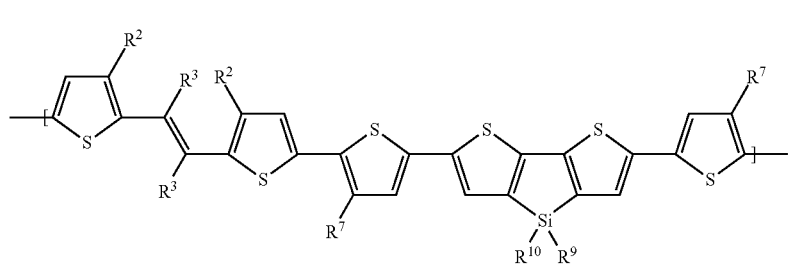
IIo'

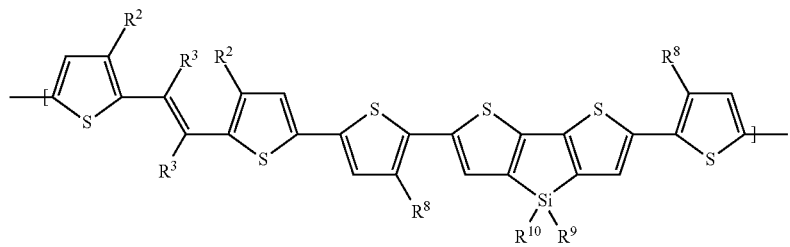
IIp' wherein $R^1$, $R^2$, $R^3$, $R^7$, $R^8$, $R^9$ and $R^{10}$ are as defined herein.

Further, in certain embodiments, the polymers of present teaching can include repeating units of Formulae IIIa and IIIa'

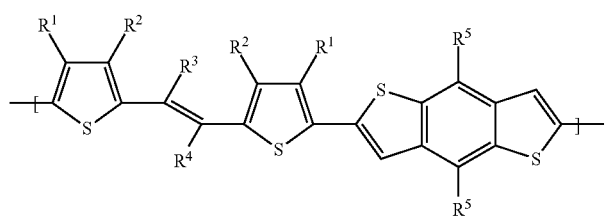
IIIa

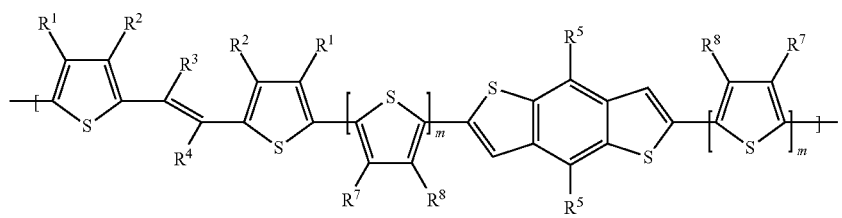
IIIa' wherein $R^1$, $R^2$, $R^3$, $R^4$, $R^5$, $R^6$, $R^7$, $R^8$ and m are as defined herein.

For example in certain embodiments, polymers of the present teaching can include repeating units of one or more of Formulae IIIb, IIIc, IIId, IIIe, IIIf and IIIg.

IIIb

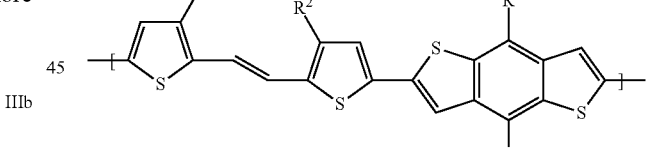

IIIc

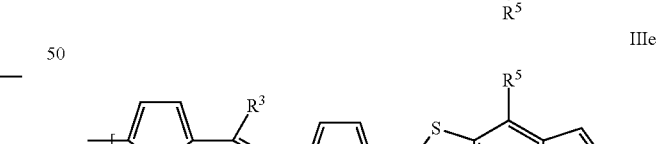

IIId

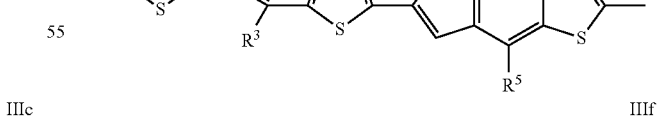

IIIe

IIIf

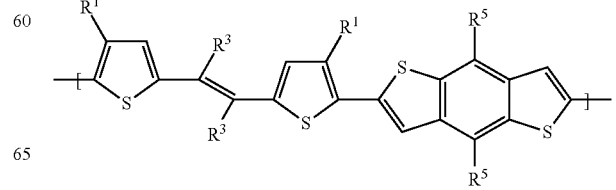

IIIg

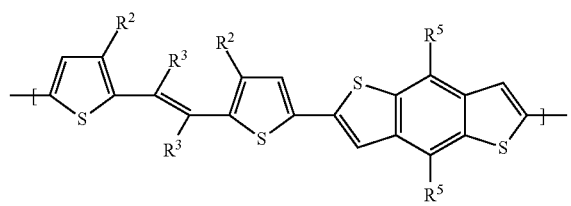

wherein $R^1$, $R^2$, $R^3$ and $R^5$ are as defined herein. For example, $R^3$ at each occurrence can be independently selected from —CN, a $C_{1-30}$ alkyl group, $C_{1-20}$ alkoxy group and $C_{1-20}$ alkylthiol group.

As a further example, in certain embodiments, polymers of the present teaching can include repeating units of one or more of Formulae IIIb', IIIc', IIId', IIIe', IIIf', IIIg', IIIh', IIIi', IIIj', IIIk', IIIl', IIIm', IIIn', IIIo' and IIIp'.

IIIb'

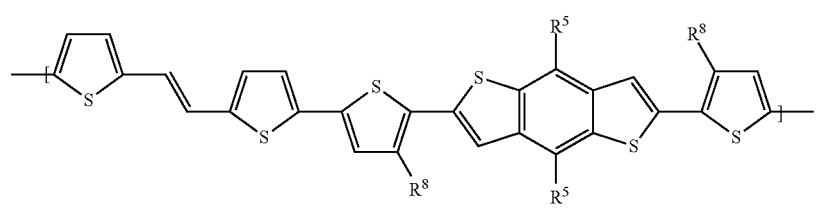

IIIc'

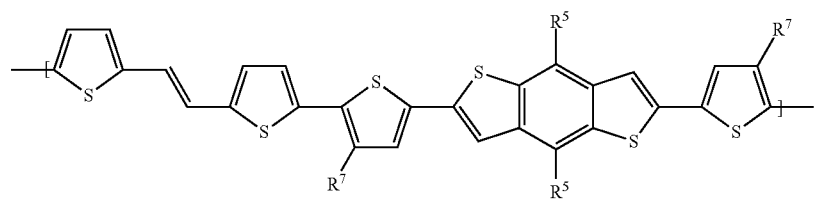

IIId'

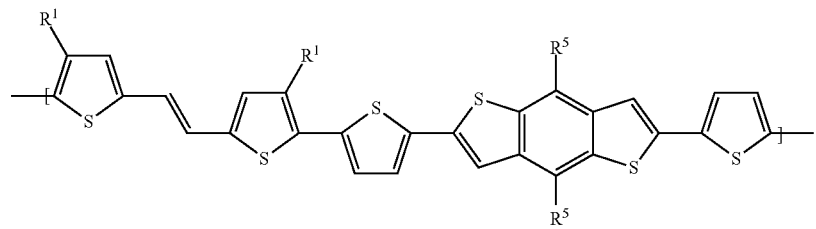

IIIe'

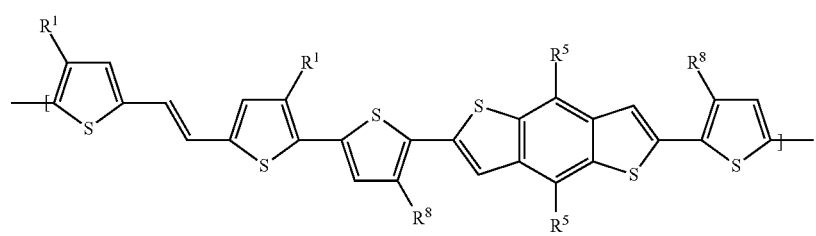

IIIf'

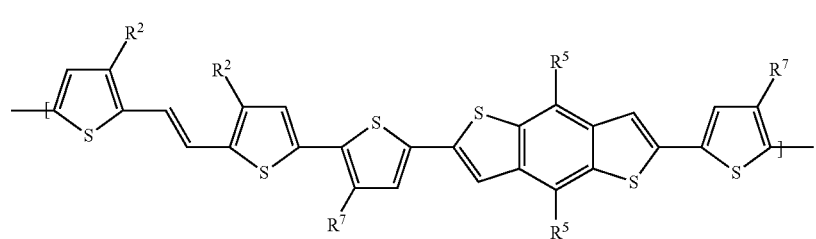

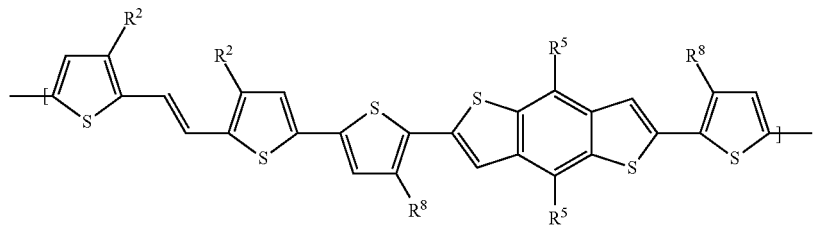
IIIg'
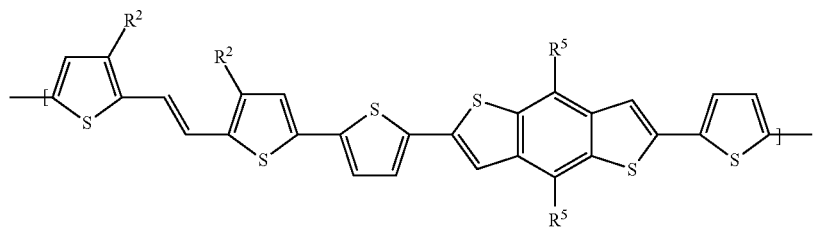
IIIh'
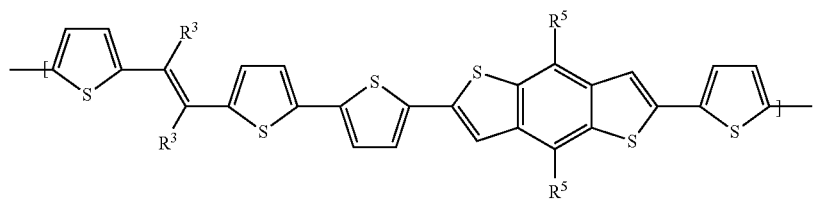
IIIi'
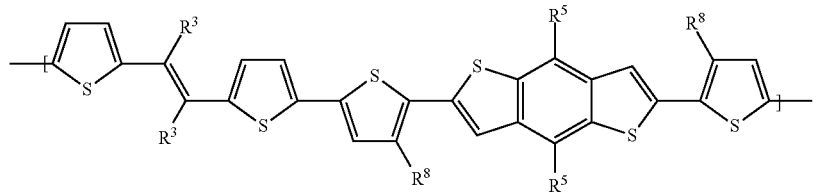
IIIj'
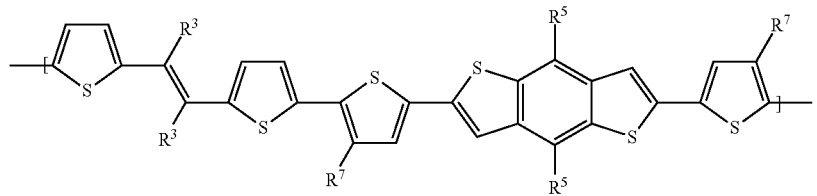
IIIk'
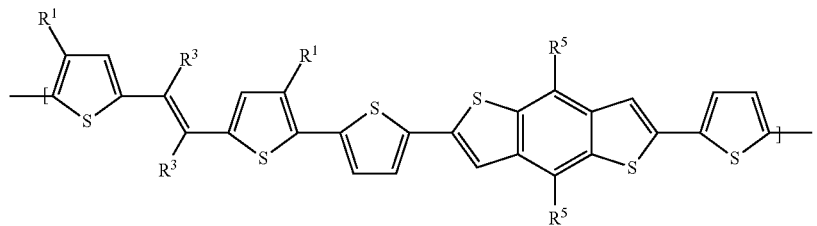
IIIl'
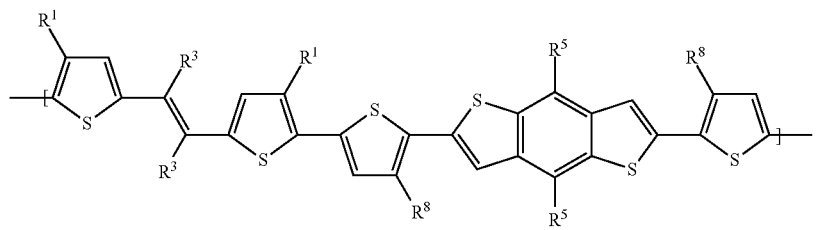
IIIm'

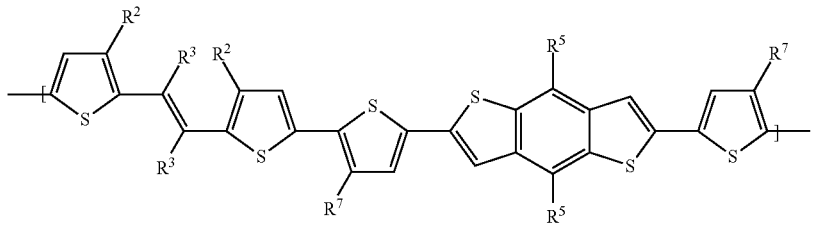

IIIn'

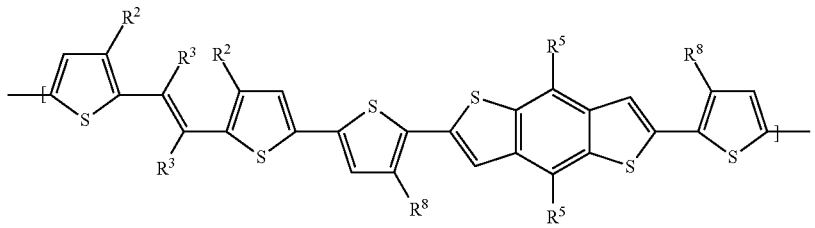

IIIo'

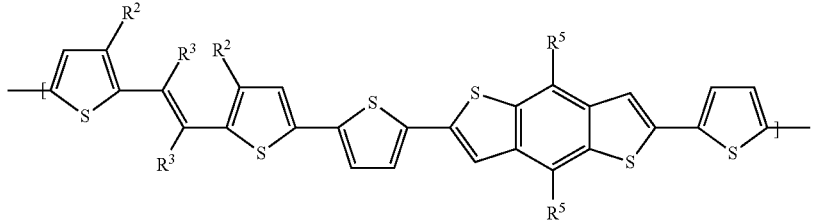

IIIp' wherein $R^1$, $R^2$, $R^3$, $R^5$, $R^7$ and $R^8$ are as defined herein. For example, $R^3$ at each occurrence, can be independently selected from —CN, halogen, a $C_{1-20}$ haloalkyl group, a $C_{1-30}$ alkyl group, $C_{1-20}$ alkoxy group and $C_{1-20}$ alkylthiol group.

Certain embodiments of the present polymers can be prepared in accordance with the procedures outlined in Scheme 1 below:

Scheme 1

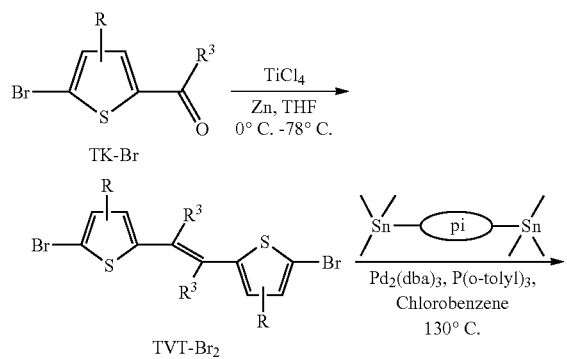

TK-Br

TVT-Br$_2$

-continued

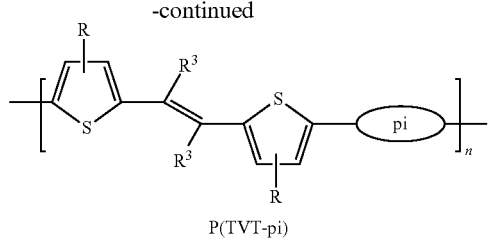

P(TVT-pi)

Referring to Scheme 1, certain embodiments of the present polymers can be synthesized via a metal catalyzed Stille polymerization. In particular, an acyl chloride can be reacted with alkyl-bromothiophene under Friedel-Craft's reaction condtions to yield the monobromo-keto derivative of thiophene (TK-Br). McMurray homocoupling of the TK-Br provides the desired monomer TVT-Br2. Polymerization of TVT-Br2 with the appropriate organotin compound in the presence of metal catalyst such as Tris(dibenzylideneacetone)dipalladium(0) Pd$_2$(dba)$_3$ leads to the desired polymer. Endcapping of the polymer chains can be done by addition of 1-10% monobromo or mono(trialkylstannyl) aromatic or heteroaromatic units before workup of the polymerization mixture.

Scheme 2 below shows an alternative synthesis for preparing certain embodiments of the present polymers:

Scheme 2

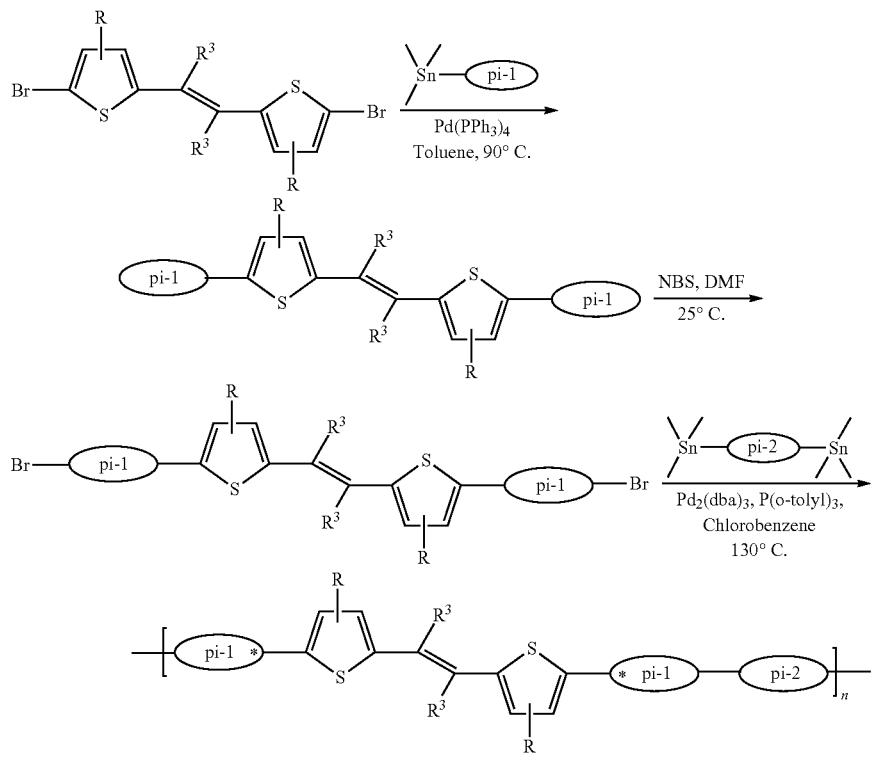

Other polymers of the present teachings can be prepared in accordance with the procedures analogous to those described in Schemes 1 and 2. Alternatively, the present polymers can be prepared from commercially available starting materials, compounds known in the literature, or readily prepared intermediates, by employing standard synthetic methods and procedures known to those skilled in the art. Standard synthetic methods and procedures for the preparation of organic molecules and functional group transformations and manipulations can be readily obtained from the relevant scientific literature or from standard textbooks in the field. It will be appreciated that where typical or preferred process conditions (i.e., reaction temperatures, times, mole ratios of reactants, solvents, pressures, etc.) are given, other process conditions can also be used unless otherwise stated. Optimum reaction conditions can vary with the particular reactants or solvent used, but such conditions can be determined by one skilled in the art by routine optimization procedures. Those skilled in the art of organic synthesis will recognize that the nature and order of the synthetic steps presented can be varied for the purpose of optimizing the formation of the compounds described herein.

The processes described herein can be monitored according to any suitable method known in the art. For example, product formation can be monitored by spectroscopic means, such as nuclear magnetic resonance spectroscopy (NMR, e.g., $^1$H or $^{13}$C), infrared spectroscopy (IR), spectrophotometry (e.g., UV-visible), mass spectrometry (MS), or by chromatography such as high pressure liquid chromatograpy (HPLC), gas chromatography (GC), gel-permeation chromatography (GPC), or thin layer chromatography (TLC).

The reactions or the processes described herein can be carried out in suitable solvents which can be readily selected by one skilled in the art of organic synthesis. Suitable solvents typically are substantially nonreactive with the reactants, intermediates, and/or products at the temperatures at which the reactions are carried out, i.e., temperatures that can range from the solvent's freezing temperature to the solvent's boiling temperature. A given reaction can be carried out in one solvent or a mixture of more than one solvent. Depending on the particular reaction step, suitable solvents for a particular reaction step can be selected.

Exemplary polymers from the present teachings include P(TS8TVT) (P1), P(BDT12TVT) (P2), P(T2-14-TVT) (P3), and P(T2-12-TVT) (P4), the structures of which are shown below.

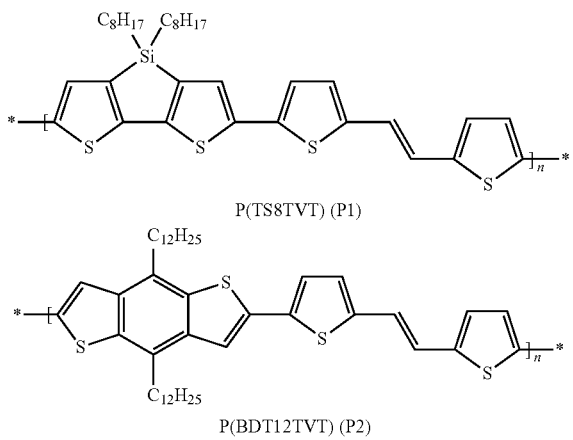

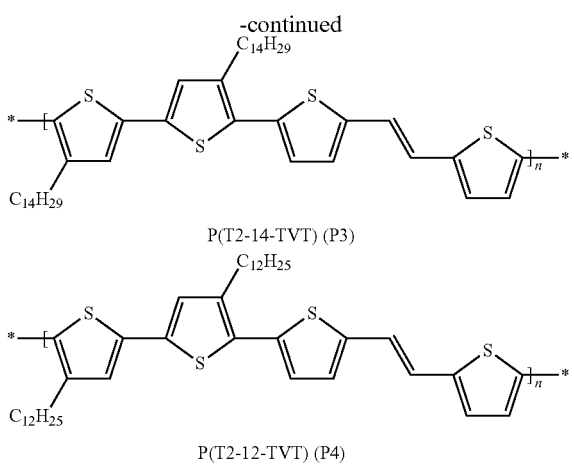

P(T2-14-TVT) (P3)

P(T2-12-TVT) (P4)

Without limiting the scope of present teachings in anyway and only for the purpose of illustration, certain embodiments of the polymers of the present teachings can be characterized by one and more of the physical properties described herein below. Further, for the purpose of comparison two bithiophene containing copolymers may be discussed along with the polymers of the present teachings. The structures of the two bithiophene containing copolymers are as follows:

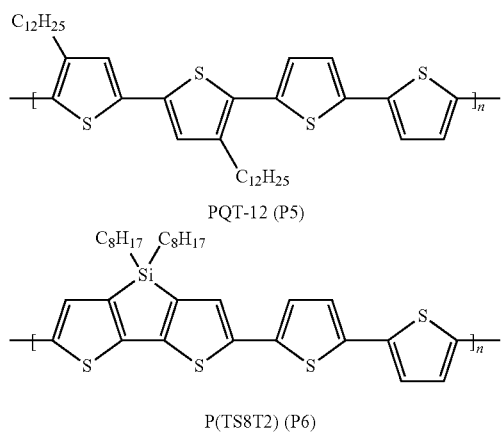

PQT-12 (P5)

P(TS8T2) (P6)

The molecular weights of the polymers of the present teachings can be determined using size exclusion chromatography (SEC). In an embodiment of polymer of Formula Ib where R5 is $C_{12}H_{25}$, specifically P4, its molecular weight ($M_n$) was determined by SEC to be $1.6 \times 10^4$ g/mol. Its polydispersity index (PDI) was determined to be 2.2. For another embodiment of polymer of Formula Ib where R5 is $C_{14}H_{29}$, specifically P3, its molecular weight ($M_n$) was determined by SEC to be $1.7 \times 10^4$ g/mol. Its polydispersity index (PDI) was determined to be 1.8. Similarly, for an embodiment of polymer of Formula IIb where R9 and R10 are $C_8H_{17}$, specifically P1, its molecular weight ($M_n$) was determined by SEC to be $4.1 \times 10^4$ g/mol. Its polydispersity index (PDI) was determined to be 5.6. Similarly, for an embodiment of polymer of Formula IIIb where R5 is $C_{12}H_{25}$, specifically P2, its molecular weight ($M_n$) was determined by SEC to be $2.5 \times 10^4$ g/mol. Its polydispersity index (PDI) was determined to be 1.4. Polymer P6 with $C_8H_{17}$ alkyl chain was also synthesized for comparison and its molecular weight ($M_n$) was determined by SEC to be $1.05 \times 10^5$ g/mol. Its polydispersity index (PDI) was determined to be 4.0.

Thermal properties of the polymers of the present teachings can also be examined by differential scanning calorimetry (DSC). For example, using a scanning speed of 10° C./min. under nitrogen, it was observed that an embodiment of polymer P4 exhibited an endothermic transition at 117° C. on heating and exothermic transitions at 77° C. and 124° C. on cooling, while an embodiment of polymer P3 exhibited an endothermic transition at 106° C. on heating and exothermic transitions at 66° C., 90° C. on cooling. Polymer P1 showed an endothermic transition at 256° C. on heating cycle, while P2 demonstrated an endothermic transition at 179° C. on heating, but these polymers did not show any exothermic transitions on the cooling cycle. Polymer P6 exhibited an endothermic transition at 247° C. on heating and exothermic transition at 241° C. on cooling.

Polymers of formula I can be used to prepare semiconductor materials (e.g., compositions and composites), which in turn can be used to fabricate various articles of manufacture, structures and devices. In some embodiments, semiconductor materials incorporating one or more polymers of the present teachings can exhibit n-type semiconducting activity and in some embodiments, semiconductor materials incorporating one or more polymers of the present teachings can exhibit p-type semiconducting activity.

Given their relatively high solubilities in common solvents, the compounds of the present teachings can offer processing advantages when used to fabricate electrical devices such as thin film semiconductors, field-effect devices, organic light emitting diodes (OLEDs), organic photovoltaics, photodetectors, capacitors, and sensors. As used herein, a compound can be considered soluble in a solvent when at least 0.1 mg of the compound is soluble in 1 mL of the solvent. Examples of common organic solvents include petroleum ethers; acetonitrile; aromatic hydrocarbons such as benzene, toluene, xylene, and mesitylene; ketones, such as acetone, and methyl ethyl ketone; ethers, such as tetrahydrofuran, dioxane, bis(2-methoxyethyl) ether, diethyl ether, diisopropyl ether, and t-butyl methyl ether; alcohols, such as methanol, ethanol, butanol, and isopropyl alcohol; aliphatic hydrocarbons, such as hexanes; acetates, such as methyl acetate, ethyl acetate, methyl formate, ethyl formate, isopropyl acetate, and butyl acetate; halogenated aliphatic and aromatic hydrocarbons, such as dichloromethane, chloroform, ethylene chloride, chlorobenzene, dichlorobenzene, and trichlorobenzene; and cyclic solvents such as cyclopentanone, cyclohexanone, and 2-methypyrrolidone.

Various deposition techniques, including various solution-processing techniques, have been used with organic electronics. For example, much of the printed electronics technology has focused on inkjet printing, primarily because this technique offers greater control over feature position and multilayer registration. Inkjet printing is a noncontact process, which offers the benefits of not requiring a preformed master (compared to contact printing techniques), as well as digital control of ink ejection, thereby providing drop-on-demand printing. However, contact printing techniques have the key advantage of being well-suited for very fast roll-to-roll processing. Exemplary contact printing techniques include screen-printing, gravure, offset, flexo, and microcontact printing. Other solution processing techniques include, for example, spin coating, drop-casting, zone casting, dip coating, and blade coating.

The present polymers can exhibit versatility in their processing. Formulations including the present polymers can be printable via different types of printing techniques including gravure printing, flexographic printing, and inkjet printing, providing smooth and uniform films that allow, for example, the formation of a pinhole-free dielectric film thereon, and consequently, the fabrication of all-printed devices.

The present teachings, therefore, further provide methods of preparing a semiconductor material. The methods can include preparing a composition that includes one or more polymers disclosed herein dissolved or dispersed in a liquid medium such as a solvent or a mixture of solvents, depositing the composition on a substrate to provide a semiconductor material precursor, and processing (e.g., heating) the semiconductor precursor to provide a semiconductor material (e.g., a thin film semiconductor) that includes a polymer disclosed herein. In some embodiments, the depositing step can be carried out by printing, including inkjet printing and various contact printing techniques (e.g., screen-printing, gravure, offset, pad, and microcontact printing). In other embodiments, the depositing step can be carried out by vacuum vapor deposition, spin coating, drop-casting, zone casting, dip coating, blade coating, or spraying.

The present teachings further provide articles of manufacture, for example, composites that include a semiconductor material of the present teachings and a substrate component and/or a dielectric component. The substrate component can be selected from materials including doped silicon, an indium tin oxide (ITO), ITO-coated glass, ITO-coated polyimide or other plastics, aluminum or other metals alone or coated on a polymer or other substrate, a doped polythiophene, and the like. The dielectric component can be prepared from inorganic dielectric materials such as various oxides (e.g., $SiO_2$, $Al_2O_3$, $HfO_2$), organic dielectric materials such as various polymeric materials (e.g., the crosslinked polymer blends described in U.S. patent application Ser. Nos. 11/315,076, 60/816,952, and 60/861,308, the entire disclosure of each of which is incorporated by reference herein) and a self-assembled superlattice/self-assembled nanodielectric (SAS/SAND) material (described in Yoon, M-H. et al., *PNAS*, 102 (13): 4678-4682 (2005), the entire disclosure of which is incorporated by reference herein), as well as a hybrid organic/inorganic dielectric material (described in U.S. patent application Ser. No. 11/642,504, the entire disclosure of which is incorporated by reference herein). The composite also can include one or more electrical contacts. Suitable materials for the source, drain, and gate electrodes include metals (e.g., Au, Al, Ni, Cu), transparent conducting oxides (e.g., ITO, IZO, ZITO, GZO, GIO, GITO), and conducting polymers (e.g., poly(3, 4-ethylenedioxythiophene) poly(styrenesulfonate) (PEDOT: PSS), polyaniline (PANI), polypyrrole (PPy)). One or more of the composites described herein can be embodied within various organic electronic, optical, and optoelectronic devices such as organic thin film transistors (OTFTs), specifically, organic field effect transistors (OFETs), as well as sensors, solar cells, capacitors, complementary circuits (e.g., inverter circuits), and the like.

Accordingly, an aspect of the present teachings relates to methods of fabricating an organic field effect transistor that incorporates a semiconductor material of the present teachings. The semiconductor materials of the present teachings can be used to fabricate various types of organic field effect transistors including top-gate top-contact capacitor structures, top-gate bottom-contact capacitor structures, bottom-gate top-contact capacitor structures, and bottomgate bottom-contact capacitor structures. FIG. 3 illustrates the four common types of OFET structures: (a) bottom-gate top-contact structure, (b) bottom-gate bottom-contact structure, (c) top-gate bottom-contact structure, and (d) top-gate top-contact structure. As shown in FIG. 3, an OFET can include a dielectric layer (e.g., shown as 8, 8', 8", and 8'" in FIGS. 3a, 3b, 3c, and 3d, respectively), a semiconductor layer (e.g., shown as 6, 6', 6", and 6'" in FIGS. 3a, 3b, 3c, and 3d, respectively), a gate contact (e.g., shown as 10, 10', 10", and 10'" in FIGS. 3a, 3b, 3c, and 3d, respectively), a substrate (e.g., shown as 12, 12', 12", and 12'" in FIGS. 3a, 3b, 3c, and 3d, respectively), and source and drain contacts (e.g., shown as 2, 2', 2", 2'", 4, 4', 4", and 4'" in FIGS. 3a, 3b, 3c, and 3d, respectively).

Another article of manufacture in which the polymers of the present teachings are useful is photovoltaics or solar cells. The polymers of the present teachings can exhibit broad optical absorption. Accordingly, depending on nature of the comonomer B unit, the polymers described herein can be used as an n-type or p-type semiconductor in a photovoltaic design, which includes an adjacent p-type or n-type semiconducting material respectively to form a p-n junction. The polymers can be in the form of a thin film semiconductor, which can be a composite of the thin film semiconductor deposited on a substrate. Exploitation of the polymers of the present teachings in such devices is within the knowledge of the skilled artisan.

Accordingly, another aspect of the present teachings relates to methods of fabricating an organic field effect transistor that incorporates a semiconductor material of the present teachings. The semiconductor materials of the present teachings can be used to fabricate various types of organic field effect transistors including top-gate top-contact capacitor structures, top-gate bottom-contact capacitor structures, bottom-gate top-contact capacitor structures, and bottom-gate bottom-contact capacitor structures. In certain embodiments, OTFT devices can be fabricated with the present compounds on doped silicon substrates, using $SiO_2$ as the dielectric, in top-contact geometries. In particular embodiments, the active semiconducting layer which incorporates at least a compound of the present teachings can be applied by spin-coating or jet printing. For top-contact devices, metallic contacts can be patterned on top of the films using shadow masks.

In certain embodiments, OTFT devices can be fabricated with the present polymers on plastic foils, using polymers as the dielectric, in top-gate bottom-contact geometries. In particular embodiments, the active semiconducting layer which incorporates at least a polymer of the present teachings can be deposited at room temperature or at an elevated temperature. In other embodiments, the active semiconducting layer which incorporates at least a polymer of the present teachings can be applied by spin-coating or printing as described herein. Gate and source/drain contacts can be made of Au, other metals, or conducting polymers and deposited by vapor-deposition and/or printing.

The following examples are provided to illustrate further and to facilitate the understanding of the present teachings and are not in any way intended to limit the invention.

Example 1

Polymer Synthesis

The following examples describe the preparation of certain polymers of the present teaching and related intermediates All reagents were purchased from commercial sources and used without further purification unless otherwise noted. Conventional Schlenk techniques were used, and reactions were carried out under $N_2$ unless otherwise noted. NMR spectra were recorded on a Varian 400MR spectrometer ($^1$H, 400 MHz). Polymer molecular weights were determined on Agilent 1200 series with refractive index detector in THF at room temperature versus polystyrene standards. The thermal characteristics of polymer were studied using a differential scanning calorimeter (DSC) (Mettler Toledo, DSC/823e/500/404) with a scanning rate of 10° C./min. Elemental analyses were performed at the National University of Singapore. 5,5'-dibromo-4,4'-bi(dodecyl)-2,2'-bithiophene (McCulloch, I.; Heeney, M.; Genevicius, K.; MacDonald, I.; Shkunov, M.; Sparrowe, D.; Tierney, S.; Wagner, R.; Zhang, W.; Chabinyc, M. L.; Kline, R. J.; McGehee, M. D.; Toney, F. M. *Nat. Mater.* 2006, 5, 328), 3,3'-dibromo-2,2'-bithiophene (Lu, G.; Usta, H.; Risko, C.; Wang, L.; Facchetti, A.; Ratner, M. A.; Marks, T. J. *J. Am. Chem. Soc.* 2008, 130, 7670-7685) and 2,6-Dibromo-4,8-didodecylbenzo[1,2-b:4,5-b']dithiophene (H. Pan, Y. Li, Y. Wu, P. Liu, B. S. Ong, S. Zhu, G. Xu, *Chem. Mater.* 2006, 18, 3237) were prepared according to literature procedures.

Example 1A

Preparation of poly[(1,2-bis-(2'-thienyl)vinyl-5',5''-diyl)-alt-(3,3'-di-n-octylsilylene-2,2'-bithiophene-5,5'-diyl)]

Preparation of 5,5'-bis(trimethylstannyl)-[1,2-bis(2'-thienyl)vinyl]

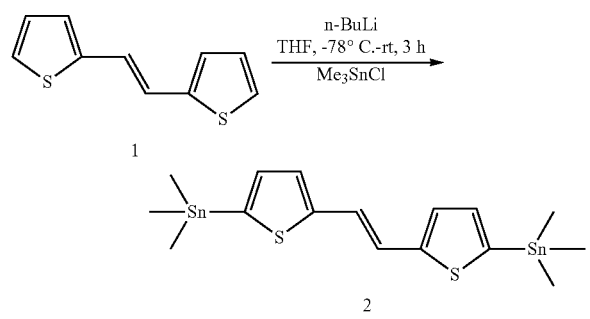

Trans-1,2-di(2-thienyl)ethylene (1) (10.4 mmol, 2.00 g) was dissolved in anhydrous THF (43.2 mL) and cooled to −78° C. under nitrogen. n-Butyllithium (21.84 mmol, 13.7 mL) was then added dropwise. The resulting solution was warmed to room temperature over 30 min and stirred at that temperature for 3 h. The mixture was then cooled to −78° C. before trimethyltin chloride (21.84 mmol, 4.35 g) in anhydrous THF (26 mL) was added dropwise. After addition, the mixture was warmed to room temperature over 4 h and stirred for additional 20 h at room temperature. The reaction mixture was poured into saturated $NH_4Cl$ solution (100 mL) and the aqueous layer was extracted with diethyl ether. The combined organic layers were washed with water, dried over $Na_2SO_4$ and concentrated under reduced pressure. The crude solid was recrystallized from ethanol to give desired compound 2 in 73% yield. $^1$H-NMR ($CDCl_3$) (400 MHz) ppm 7.12 (d, 2H) ppm 7.09 (s, 2H) ppm 7.07 (d, 2H) ppm 0.38 (s, 18H).

Preparation of 3,3'-di-n-octylsilylene-2,2'-bithiophene

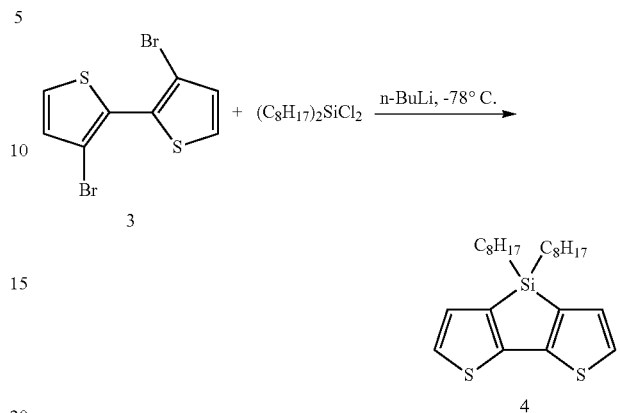

To a solution of n-BuLi in hexane (60 mmol, 24 mL) in anhydrous THF (500 mL) at −78° C. was added dropwise under vigorous stirring a solution of 3,3'-dibromo-2,2'-bithiophene (3) (30 mmol, 9.720 g) in anhydrous THF (100 mL) over 30 min. The mixture was then stirred at −78° C. for 1 h, resulting in a white suspension. Next, a solution of dichlorodioctylsilane (30 mmol, 9.76 g) in THF (100 mL) was added dropwise. The reaction mixture was stirred at −78° C. for five additional hours, allowed to warm to room temperature, and stirred overnight. The reaction was next quenched by adding saturated aqueous $NH_4Cl$ solution (300 mL). The aqueous layer was extracted with ether (3×100 mL). The organic phases were then combined and washed with water and dried over $MgSO_4$. After filtration, the solvent was removed, and the crude product was purified by column chromatography to yield a light yellow liquid 4 (8.17 g, 65%). $^1$H NMR ($CDCl_3$): ppm 0.85-0.93 (m, 10H), ppm 1.24-1.41 (m, 24H), ppm 7.06 (d, 2H, J=5 Hz), ppm 7.21 (d, 2H, J=5 Hz).

Preparation of 5,5'-dibromo-3,3'-di-n-octylsilylene-2,2'-bithiophene

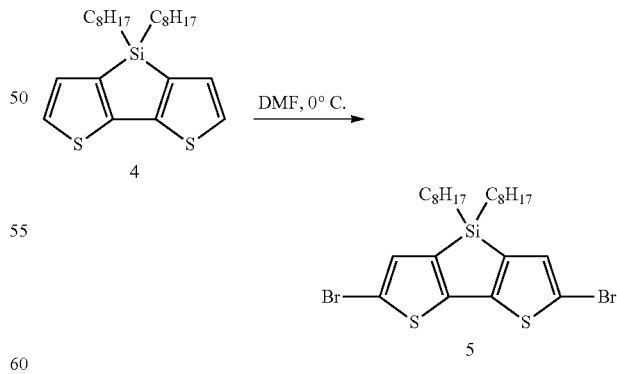

To a solution of 3,3'-di-n-octylsilylene-2,2'-bithiophene (4) (1.63 g, 5.0 mmol) in DMF (40 mL) was added NBS (1.98 g, 11.0 mmol) in many portion. The mixture was stirred at room temperature for 10 min, and then water (50 mL) was added to quench the reaction. The reaction mixture was extracted with ether (3×50 mL). The combined organic phase was washed with water (50 mL) and dried over MgSO$_4$. After filtration, the ether was removed, and the product was purified by column chromatography using hexane as eluent to give a green liquid 5 (2.05 g, 71%). $^1$H NMR (CDCl$_3$): ppm 0.86-0.88 (m, 10H), ppm 1.32-1.22 (m, 24H), ppm 7.00 (s, 2H).

Preparation of poly[(1,2-bis-(2'-thienyl)vinyl-5',5"-diyl)-alt-(3,3'-di-n-octylsilylene-2,2'-bithiophene-5,5'-diyl)](Polymer P1)

Example 1B

Preparation of poly[(1,2-bis-(2'-thienyl)vinyl-5',5"-diyl)-alt-(4,8-didodecylbenzo-[1,2-b:4,5-b']-dithiophene-2,6-diyl)] (Polymer P2)

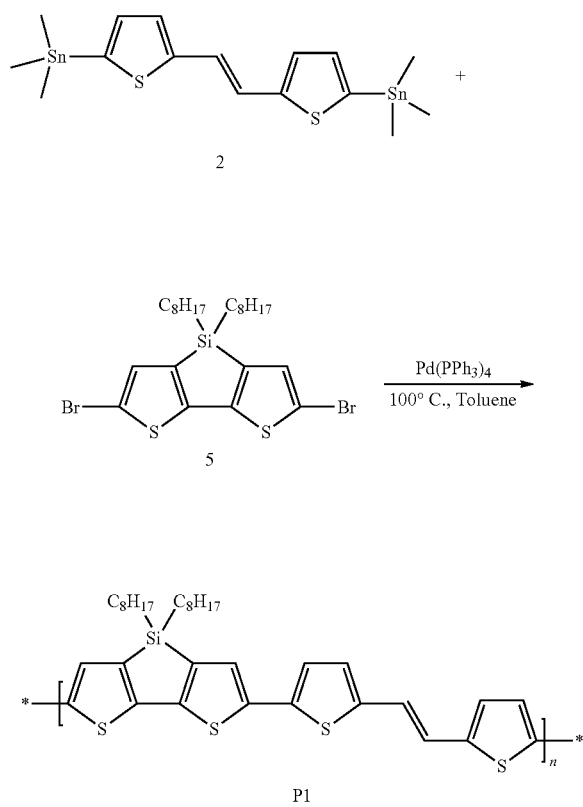

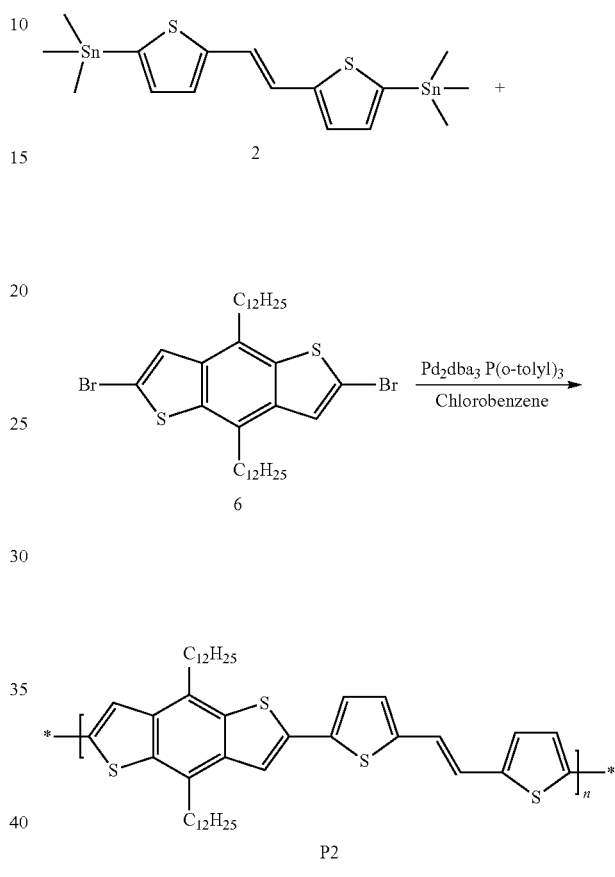

Equimolar amounts of bis(trimethylstannyl)trans-1,2-di (2-thienyl)ethylene (2) (0.50 mmol, 0.26 g) and dibromo monomer 5 (0.50 mmol, 0.29 g) were dissolved in anhydrous toluene (10.0 mL) followed by the addition of tetrakis (triphenylphosphine)palladium(0) (0.025 mmol, 29 mg) under N$_2$. The resulting mixture was refluxed for 2 days under N$_2$. Thereafter, 2-(trimethylstannyl)thiophene (0.2 mL) and 2-bromo-thiophene (0.2 mL) were added to endcap the polymer at the interval of 3 hours and the reaction mixture was refluxed for an additional 6 hours. After being cooled to room temperature, the reaction mixture was precipitated into a mixture of methanol (300 mL) and stirred for 2 h at room temperature. The polymer P1 was filtered, washed with methanol and subjected to Soxhlet extraction for 24 h in acetone. The polymer P1 was redissolved in toluene and precipitated from methanol, filtered, washed with methanol and dried. Mn=4.1×10$^4$ g/mol, Mw=2.3×10$^5$ g/mol, D=5.6. $^1$H-NMR (THF-d$_8$) (400 MHz) ppm 7.28-7.05 (m, 8H) ppm 1.54-1.16 (m, 24H) ppm 1.02 (m, 4H) ppm 0.87 (t, 6H, J=6.6 Hz). Elemental analysis (calcd): C, 66.88 (67.27); H, 6.69 (6.97).

Equimolar amounts of bis(trimethylstannyl)trans-1,2-di (2-thienyl)ethylene (2) (0.29 mmol, 0.15 g) and dibromo monomer 6 (0.29 mmol, 0.20 g) were dissolved in anhydrous chlorobenzene (10.0 mL) followed by the addition of tri(dibenzylideneacetone)dipalladium(0) (0.009 mmol, 8 mg) and tri(o-tolyl)phosphine (0.022 mmol, 6 mg) under N$_2$. The resulting mixture was refluxed for 2 days under N$_2$. Thereafter, 2-(trimethylstannyl)thiophene (0.1 mL) and 2-bromo-thiophene (0.1 mL) were added to endcap the polymer at the interval of 3 hours and the reaction mixture was refluxed for an additional 6 hours. After being cooled to room temperature, the reaction mixture was precipitated into a mixture of methanol (300 mL) and hydrochloric acid (10 mL, 2N) and stirred for 2 h at room temperature. The polymer P2 was filtered, washed with methanol and subjected to Soxhlet extraction for 24 h in acetone. The polymer P2 was redissolved in toluene and precipitated from methanol, filtered, washed with methanol and dried. Mn=2.5×10$^4$, Mw=3.5×10$^4$ g/mol, D=1.4. $^1$H-NMR (1,1,2,2-Tetrachloroethane-d$_2$) (400 MHz) ppm 7.54-7.00 (m, 8H) ppm 2.35 (t, 4H, J=7.5 Hz) ppm 1.36-1.21 (broad peak, 40H) ppm 0.89 (t, 6H, J=6.8 Hz). Elemental analysis (calcd): C, 73.21 (73.89); H, 7.60 (8.17).

Example 1C

Preparation of poly[(1,2-bis-(2'-thienyl)vinyl-5',5"-diyl)-alt-(5,5'-bis(3-tetradecylthiophen-2-yl))] (Polymer P3)

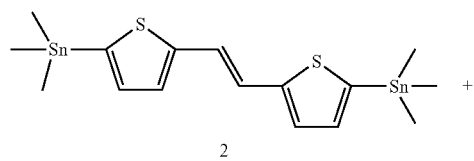

2

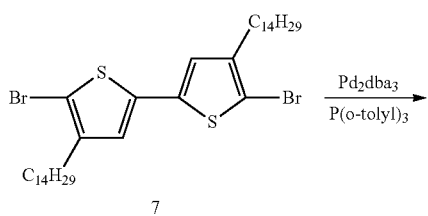

7

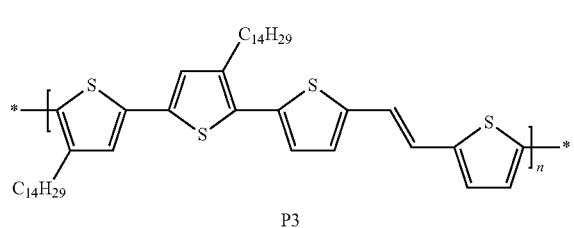

P3

Equimolar amounts of bis(trimethylstannyl)trans-1,2-di(2-thienyl)ethylene (2) (0.50 mmol, 358 mg) and 5,5'-dibromo-4,4'-ditetradecyl[2,2']bithiophene (7) (0.50 mmol, 259 mg) were dissolved in anhydrous chlorobenzene (16.7 mL) followed by the addition of tri(dibenzylideneacetone)dipalladium(0) (0.015 mmol, 14 mg) and tri(o-tolyl)phosphine (0.03 mmol, 9 mg) under $N_2$. The resulting mixture was refluxed for 2 days under $N_2$. Thereafter, 2-(trimethylstannyl)thiophene (0.2 mL) and 2-bromo-thiophene (0.2 mL) were added to endcap the polymer at the interval of 3 hours and the reaction mixture was refluxed for an additional 6 hours. After being cooled to room temperature, the reaction mixture was precipitated into a mixture of methanol (300 mL) and hydrochloric acid (10 mL, 2N) and stirred for 2 h at room temperature. The polymer P3 was filtered, washed with methanol and subjected to Soxhlet extraction for 24 h in acetone. The polymer P3 was redissolved in toluene and precipitated from methanol, filtered, washed with methanol and dried. $Mn=1.7\times10^4$ g/mol, D=1.8. $^1$H-NMR (1,1,2,2-Tetrachloroethane-$d_2$) (400 MHz) ppm 7.04 (m, 8H) ppm 2.79 (m, 4H) ppm 1.70 (m, 4H) ppm 1.35 (broad peak, 44H) ppm 0.88 (t, 6H, J=6.6 Hz). Elemental analysis (calcd): C, 74.25 (73.94); H, 8.58 (8.90).

Example 1D

Preparation of poly[(1,2-bis-(2'-thienyl)vinyl-5',5"-diyl)-alt-(5,5'-bis(3-dodecylthiophen-2-yl)] (Polymer P4)

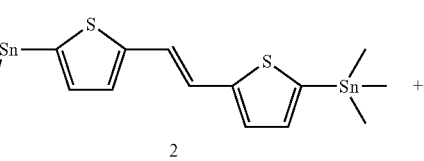

2

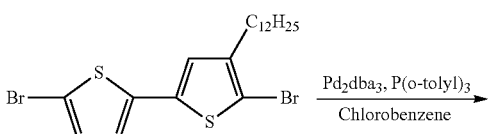

8

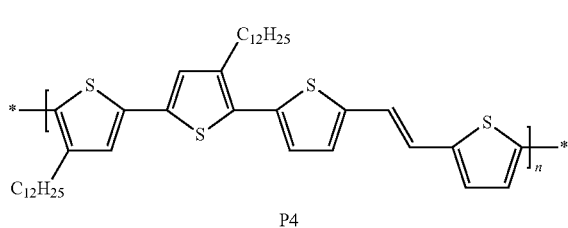

P4

Equimolar amounts of bis(trimethylstannyl)trans-1,2-di(2-thienyl)ethylene (2) (0.18 mmol, 120 mg) and 5,5'-dibromo-4,4'-didodecyl[2,2']bithiophene (8) (0.18 mmol, 93 mg) were dissolved in anhydrous chlorobenzene (6 mL) followed by the addition of tri(dibenzylideneacetone)dipalladium(0) (0.005 mmol, 4 mg) and tri(o-tolyl)phosphine (0.01 mmol, 3 mg) under $N_2$. The resulting mixture was refluxed for 2 days under $N_2$. Thereafter, 2-(trimethylstannyl)thiophene (0.1 mL) and 2-bromo-thiophene (0.1 mL) were added to endcap the polymer at the interval of 3 hours and the reaction mixture was refluxed for an additional 6 hours. After being cooled to room temperature, the reaction mixture was precipitated into a mixture of methanol (300 mL) and hydrochloric acid (10 mL, 2N) and stirred for 2 h at room temperature. The polymer P4 was filtered, washed with methanol and subjected to Soxhlet extraction for 24 h in acetone. The polymer P4 was redissolved in toluene and precipitated from methanol, filtered, washed with methanol and dried. $Mn=1.6\times10^4$ g/mol, D=2.2. $^1$H-NMR (1,1,2,2-Tetrachloroethane-$d_2$) (400 MHz) ppm 7.03 (m, 8H) ppm 2.78 (m, 4H) ppm 1.70 (m, 4H) ppm 1.35 (broad peak, 36H) ppm 0.89 (t, 6H, J=6.6 Hz). Elemental analysis (calcd): C, 73.30 (72.99); H, 8.35 (8.46).

Example 1E

Preparation of poly[(2,2'-bithiophene-2,5'-diyl)-alt-(3,3'-di-n-octylsilylene-2,2'-bithiophene-5,5'-diyl)] (Polymer P6)

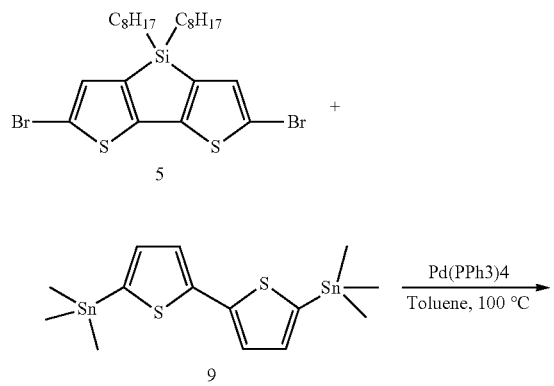

Equimolar amounts of 2, 5'-bis(trimethylstannyl)-2,2'-bithiophene monomer (9) (0.50 mmol, 0.246 g) and 5,5'-dibromo-3,3'-di-n-octylsilylene-2,2'-bithiophene (5) (0.50 mmol, 0.288 g) were dissolved in anhydrous toluene (10.0 mL) followed by the addition of tetrakis(triphenylphosphine)palladium(0) (0.025 mmol, 29 mg) under $N_2$. The resulting mixture was heated at 100° C. for 2 days under $N_2$. Thereafter, 2-(trimethylstannyl)thiophene (0.2 mL) and 2-bromo-thiophene (0.2 mL) were added to endcap the polymer at the interval of 3 hours and the reaction mixture was heated at 100° C. for an additional 6 hours. After being cooled to room temperature, the reaction mixture was precipitated into a mixture of methanol (300 mL) and stirred for 2 h at room temperature. The polymer P6 was filtered, washed with methanol and subjected to Soxhlet extraction for 24 h in acetone and dioxane sequentially. The polymer P6 was redissolved in toluene and precipitated from methanol, filtered, washed with methanol and dried. $Mn=1.05\times10^5$ g/mol, D=4.05. $^1$H-NMR (Tetrachlorethane-$d_2$) (400 MHz): ppm 7.17-7.00 (m, 6H) ppm 1.48-1.16 (m, 24H) ppm 0.94-0.83 (m, 10H). Elemental analysis (calcd): C, 66.19 (66.15); H, 6.93 (6.94); S, 21.93 (22.07).

Example 2

Device Fabrication

Figure 6:
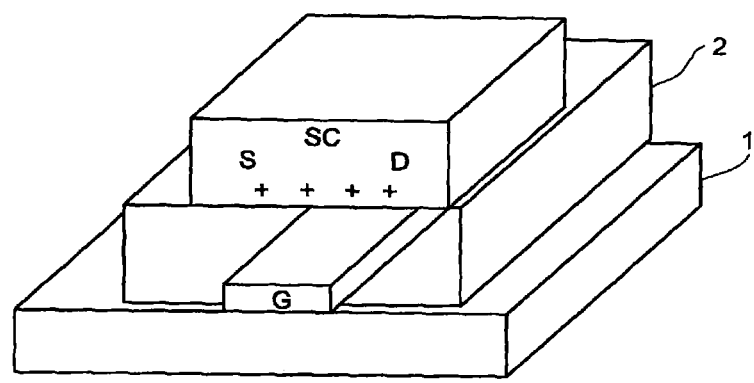
FIG. 6 shows the transistor structure used in Examples 3C-3E. Reference numeral 1 denotes the substrate, reference numeral 2 the dielectric layer.

The semiconducting properties of polymers of the present teachings were evaluated in two transistor architectures (bottom-gate top contact FIG. 6a and top-gate bottom-contact FIGS. 6c and 7a). All device fabrication processes, except metal evaporation and the film drying steps, were performed under ambient conditions. Table 1 summarizes the structure, the material for the different components, and the method of fabrication of the various devices made.

TABLE 1

| S.No. | Device Configuration | Substrate | Polymer | Annealing Temperature | Dielectric | Mobility ($cm^2/Vs$) |
|---|---|---|---|---|---|---|
| 1 | TGBC | Glass | P1 | No annealing | PMMA | $0.8\text{-}2 \times 10^{-2}$ |
| 2 | TGBC | Glass | P1 | 150° C. | PMMA | $3\text{-}6 \times 10^{-2}$ |
| 3 | TGBC | Glass | P1 | 250° C. | PMMA | $0.1\text{-}5 \times 10^{-6}$ |
| 4 | TGBC | Glass | P6 (comparative example to P1) | No annealing | PMMA | $1\text{-}4 \times 10^{-4}$ |
| 5 | TGBC | Glass | P6 (comparative example to P1) | 150° C. | PMMA | $2\text{-}5 \times 10^{-3}$ |
| 6 | TGBC | Glass | P6 (comparative example to P1) | 250° C. | PMMA | $0.5\text{-}2 \times 10^{-1}$ |
| 7 | BGBC | Silicon | P2 | No annealing | $SiO_2$ | $3\text{-}6 \times 10^{-2}$ |
| 8 | BGBC | Silicon | P3 | No annealing | $SiO_2$ | $1\text{-}3 \times 10^{-2}$ |
| 9 | BGBC | Silicon | P4 | No annealing | $SiO_2$ | $0.8\text{-}1.1 \times 10^{-1}$ |

-continued

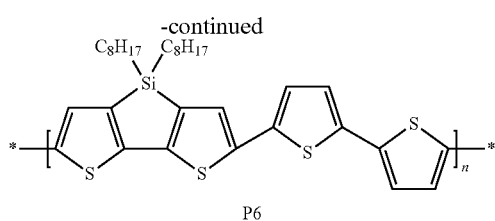

P6

Example 2A

Fabrication of Top-Gate Bottom-Contact Transistors Based on P(TS8TVT)

Top-gate bottom-contact (TGBC) TFTs were fabricated on glass (PGO glass) and were used as received. Au source-drain contacts (30 nm-thick) were thermally-evaporated. These substrates were coated with the semiconductor layer deposited by spin-coating (concentration ~5-10 mg/mL in CHCs mixture, 1500-2000 rpm, film dried at 90° C. for 30 seconds and were either used as-is or annealed at 150° C. or annealed at 250° C. for 1 hour as shown in Table 1, film thickness=10-30 nm). A 20-60 mg/ml solution of PMMA in a proprietary formulation was spincoated (1500-2000 rpm) and the dielectric film was dried at 100° C. for 1 minute. The resulting dielectric thickness is 300-400 nm. The device structure was completed by vapor deposition of patterned Au gate contacts (~30 nm thick) through a shadow mask. Channel lengths and widths are 25-75 μm and 0.5-1.5 mm, respectively, to afford W/L=20.

Comparative Example 2B

Fabrication of Top-Gate Bottom-Contact Transistors Based on P(TS8T2)

These devices were made analogous to the TGBC devices with P(TS8TVT). Identical glass substrates with patterned S/D contacts were prepared and the semiconductor layer was deposited by spin coating (conc. ~5 mg/ml in 2-MeTHF, 1000-2000 rpm, film dried at 90° C. for 30 seconds and then either used as-is or annealed at temperatures up to 250° C. for 1 hour as shown in Table 1, film thickness 10-30 nm). The same dielectric formulation as above was used to give similar films of identical thicknesses, and the devices were completed as above with deposition of patterned Au gate contacts.

Example 2C

Fabrication of Bottom-Gate Top-Contact Transistors Based on P(T2-12-TVT)

Bottom-gate top-contact (BGBC) thin film transistors (TFTs) were fabricated on $n^{++}$-Si substrates with a thermally grown $SiO_2$ (200 nm) layer, with photolithographically patterned Au S/D electrodes of different channel dimensions ranging from W=350 µm to 7 mm, and L=5 µm to 100 µm for a W/L of 70. These substrates were treated with hexamethyldisilazane vapor overnight before semiconductor deposition. All BGBC devices were completed with P(T2-12-TVT) layer deposition by spin-coating (concentration ~5-10 mg/mL in DCB, 1000-2000 rpm, film dried in ambient at ~90° C. for 30 seconds, film thickness=10-50 nm).

Example 2D

Fabrication of Bottom-Gate Top-Contact Transistors Based on P(T2-14-TVT)

These devices were fabricated in a process identical to Example 3C, using P(T2-14-TVT) deposited under identical conditions as the active layer to yield films of similar thicknesses.

Example 2E

Fabrication of Bottom-Gate Top-Contact Transistors Based on P(BDT12-TVT)

BGBC devices of P(BDT12-TVT) were fabricated analogous to Examples 3C and 3D on identically prepared substrates After surface treatment with HMDS, these BGBC devices were completed with P(BDT12-TVT) layer deposition by spin-coating (concentration ~5-10 mg/mL in DCB, 2000-3000 rpm, film dried in ambient at ~90° C. for 30 seconds, film thickness=10-50 nm).

Example 3

Device Characterization

A dual-channel Keithley 2612 or a Keithley 4200 semiconductor characterization system with 3 source measurement units (SMUs) configured with preamplifiers was used to perform all electrical characterizations of the fabricated transistors. The other major component of the test system is a Signatone probe station. A dark/metal box enclosure was used to avoid light exposure and to reduce environmental noise.

Transistor carrier mobilities (µ) were calculated by standard field effect transistor equations. In traditional metal-insulator-semiconductor FETs (MISFETs), there is typically a linear and saturated regime in the $I_{DS}$ vs $V_{DS}$ curves at different $V_G$ (where $I_{DS}$ is the source-drain saturation current, $V_{DS}$ is the potential between the source and drain, and $V_G$ is the gate voltage).

At large $V_{DS}$, the current saturates and is given by:

$$(I_{DS})_{sat} = (WC_i/2L)\mu(V_G - V_t)^2 \quad (1)$$

where L and W are the device channel length and width, respectively, $C_i$ is the specific capacitance of the gate insulator, and $V_t$ is the threshold voltage. Mobilities (µ) were calculated in the saturation regime by rearranging equation (1):

$$\mu_{sat} = (2I_{DS}L)/[WC_i(V_G - V_t)^2] \quad (2)$$

The threshold voltage ($V_t$) can be estimated as the x intercept of the linear section of the plot of $V_G$ versus $(I_{DS})^{1/2}$.

Table 2 summarizes the hole mobilities of the P(TS8TVT) and as a comparison the hole mobilities of P(TS8TVT) (devices from Examples 2A and 2B) measured (for different annealing temperatures for the semiconductor) under ambient conditions.

TABLE 2

| | Field Effect Mobility (cm²/Vs) Annealing Temp | | |
|---|---|---|---|
| Polymer | RT | 150° C. | 250° C. |
| P(TS8TVT) | 0.8-2 × 10⁻² | 3-6 × 10⁻² | 0.1-5 × 10⁻⁶ |
| P(TS8T2) | 1-4 × 10⁻⁴ | 2-5 × 10⁻³ | 0.5-2 × 10⁻¹ |

Figure 5:
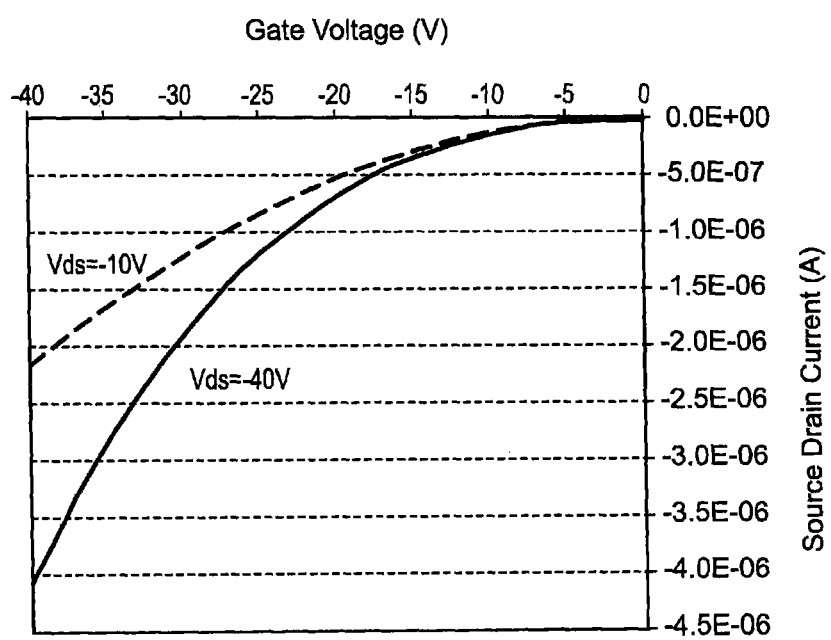
FIG. 5 shows an exemplary transfer plot for P(TS8TVT) based transistors, where the active layer was annealed at 150° C.

The hole mobilities of the TGBC TFTs for the as-spun films of P(TS8TVT) can vary between $0.8\text{-}2\times10^{-2}$ cm²/Vs. These data demonstrate P(TS8TVT) as a p-channel polymeric semiconductor readily processable from conventional organic solvents. More importantly, device performance was found negligibly improved by the P(TS8TVT) semiconductor layer thermal annealing ($T_a$). For a film annealed at 150° C. for example, the mobilities of the resultant TFTs were between $3\text{-}6\times10^{-2}$ cm²/Vs, only a factor of 2-4 times better than the films without annealing. Annealing at higher temperatures such as 250° C. resulted in degradation of FET performance with very little to no field effect demonstrated. The yields of these devices with high $T_a$ were poor, and mobilities recorded range from $0.1\text{-}5\times10^{-6}$ cm²/Vs. FIG. 5 shows a typical transfer plot for a TGBC device with P(TS8TVT), where the semiconductor was annealed at 150° C.

Devices of comparative example 2B (with the TS8T2 as the active semiconductor layer) showed poor hole mobilities ($1\text{-}4\times10^{-4}$ cm²/Vs) for the as-is films, and a steady improvement of orders of magnitude for the annealed films ($2\text{-}5\times 10^{-3}$ cm²/Vs for $T_a=150°$ C., and $0.5\text{-}2\times10^{-1}$ for $T_a=250°$ C.).

BGBC devices with P(BDT12-TVT) (Example 2E) exhibited hole mobilities of up to 0.06 cm²/Vs for the as-spun films, and showed little improvement with different annealing treatments. Devices that were annealed at 60° C. for 30 minutes, showed hole mobilities of up to 0.1 cm²/Vs, and further, devices that were annealed at 100° C. for 30 minutes showed hole mobilities of up to 0.14 cm²/Vs, and even higher temperatures (>160° C.) resulted in a decrease in the observed mobility.

As further example, BGBC devices with P(T2-14-TVT) (devices from Example 2C) exhibited hole mobilities up to 0.03 cm²/Vs for the as-spun films and showed no improvement with annealing to temperatures up to 100° C., beyond which the device performance degraded, and this performance degradation correlates with the endothermic transitions at 106° C. observed on the DSC traces for this polymer.

Figure 7:
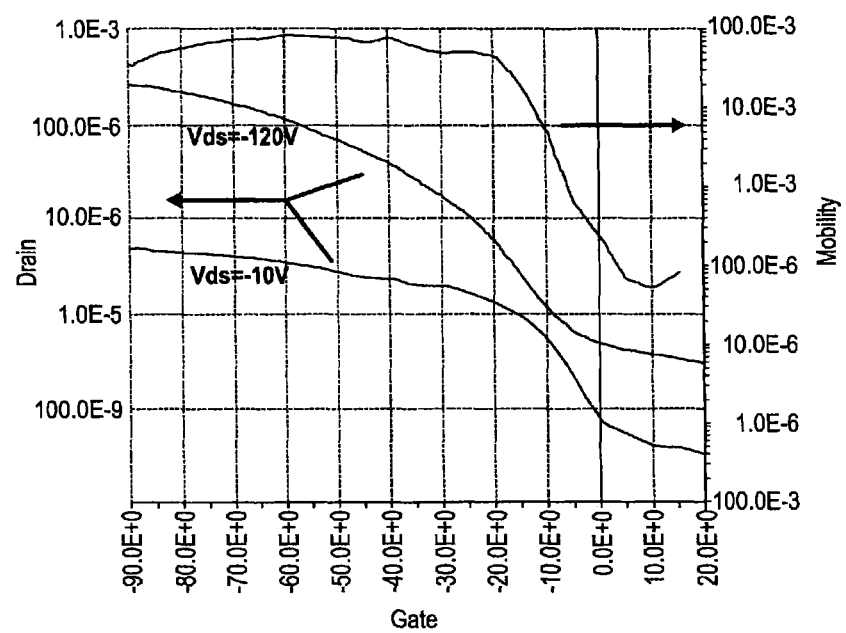
FIG. 7 shows an exemplary transfer plot and the extracted mobilities for the as-dried P(T2-12-TVT) based transistors (without any annealing).
Figure 8A:
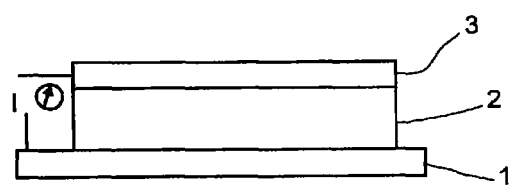
FIG. 8a illustrates a representative structure of a bulk-heterojunction organic photovoltaic device (also known as solar cell) which can incorporate one or more polymers of the present teachings as the donor and/or acceptor materials. Reference numeral 1 denotes the ITO anode, reference numeral 2 the polymer blend layer and reference numeral 3 the metal cathode.
Figure 8B:
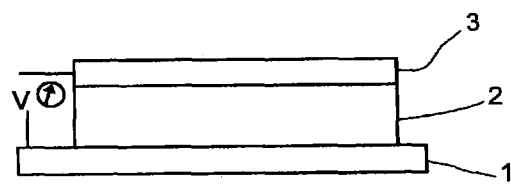
FIG. 8b illustrates a representative structure of an organic light-emitting device which can incorporate one or more polymers of the present teachings as electron-transporting and/or emissive and/or hole-transporting materials. Reference numeral 1 denotes the ITO anode, reference numeral 2 the polymer layer and reference numeral 3 the metal cathode.

As further example, BGBC devices with P(T2-12-TVT) (devices from Example 2D) exhibited hole mobilities up to 0.11 cm²/Vs for the as-spun films. A typical transfer plot (p-type) is shown in FIG. 7. It should be noted that those skilled in art would not have expected high hole mobilities for the as-spun films, given that a structurally similar polymer (PQT12) with a bithiophene instead of the dithienylvinylene moiety has an order of magnitude lower mobility for the as-spun films, and reached these high mobilities only after the films are annealed at 1200° C.-140° C. for at least 30 minutes-1 hour. Ref. Ong, B. S. et al. *J. Am. Chem. Soc.* 2004, 126, 3378-3379.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

Example 4

Monomer Synthesis

All reagents were purchased from commercial sources and used without further purification unless otherwise noted. Conventional Schlenk techniques were used, and reactions were carried out under $N_2$ unless otherwise noted. NMR spectra were recorded on a Varian 400MR spectrometer ($^1H$, 400 MHz). Polymer molecular weights were determined on Agilent 1200 series with refractive index detector in THF at room temperature versus polystyrene standards. The thermal characteristics of polymer were studied using a differential scanning calorimeter (DSC) (Mettler Toledo, DSC/823e/500/404) with a scanning rate of 10° C./min. Elemental analyses were performed at the National University of Singapore. 5,5'-Dibromo-4,4'-bi(dodecyl)-2,2'-bithiophene; 5,5'-dibromo-4,4'-bi(octyl)-2,2'-bithiophene, (McCulloch, I.; Heeney, M.; Genevicius, K.; MacDonald, I.; Shkunov, M.; Sparrowe, D.; Tierney, S.; Wagner, R.; Zhang, W.; Chabinyc, M. L.; Kline, R. J.; McGehee, M. D.; Toney, F. M. *Nat. Mater.* 2006, 5, 328), benzo[1,2-b:4,5-b']dithiophene-4,8-dione (Beimling, P.; Koβmehl, G. *Chem. Ber.* 1986, 119, 3198), 5,5'-bis(3-dodecyl-2-thienyl)-2,2'-dithiophene (Ong, B. S.; Wu, Y.; Liu, P.; Gardner, S. *J. Am. Chem. Soc.* 2004, 126, 3378), 1,3-dibromo-5-(2-hexyldecyl)thieno[3,4-c]pyrrole-4,6-dione (Nielsen, C. B.; Bjørnholm, T. *Org. Lett.* 2004, 6, 3381), 2,7-dibromo-4,4-dihexadecylcyclopentadithiophene (Zhang, M.; Tsao, H. K.; Pisula, W.; Yang, C. D.; Mishra, A. K.; Muellen, K. *J. Am. Chem. Soc.* 2007, 129, 3472), 2,5-dibromo-3,4-didodecyl-thiophene (Ashraf, R. S.; Klemm, E. *J. Polym. Sci.: Part A: Polym. Chem.* 2005, 43, 6445), 4,8-didodecylbenzo-[1,2-b:4,5-b']-dithiophene (Pan, H.; Wu, Y.; Li Y.; Liu, P.; Ong, B. S.; Zhu, S.; Xu, G. *Adv. Funct. Mater.* 2007, 17, 3574) and 2,5-bis(trimethylstannyl)-thieno[3,2-b]thiophene (Fuller, L. S.; Iddon, B.; Smith, K. A. *J. Chem. Soc. Perkin Trans.* 1, 1997, 3465) were prepared according to literature procedures.

Example 4a

Preparation of 3-dodecyl-2-thiophenecarboxaldehyde (11)

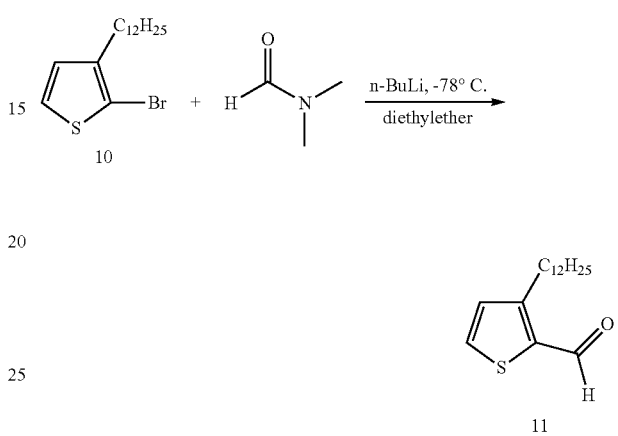

A solution of n-Butyllithium (1.6M in hexanes, 8 mL, 12.67 mmol) was added dropwise at −78° C. under $N_2$ to a stirred solution of 2-bromo-3-dodecylthiophene (10) (4 g, 12.07 mmol in 96 mL of ether). During the whole addition, the reaction temperature was kept at −78° C. At this temperature, DMF (1.4 mL, 18.11 mmol) was slowly added and the mixture was allowed to warm to room temperature. The mixture was poured into a 1 M aqueous solution of $NH_4Cl$ and extracted with $CH_2Cl_2$. The organic layer was washed with water, dried over $Na_2SO_4$, and evaporated under reduced pressure. The residue was passed through a short column (silica gel, hexane/ethylacetate, 9:1) to give a light yellow liquid compound 11 in 87% yield. $^1H$-NMR (DCM-$d_2$, 400 MHz) ppm 0.88 (t, 3H, J=6.8 Hz) ppm 1.27 (m, 18H) ppm 1.67 (td, 2H, J=7.6 Hz, J=15.1 Hz) ppm 2.96 (t, 2H) ppm 7.04 (d, 1H, J=5.0 Hz) ppm 7.66 (d, 1H, J=5.0 Hz) ppm 10.04 (s, 1H).

Preparation of (E)-1,2-bis(3-dodecylthienyl)ethylene (12)

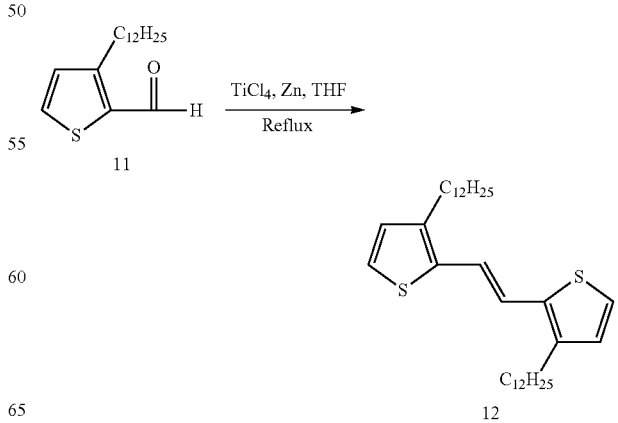

To a suspension of low-valent Ti prepared from TiCl$_4$ (0.94 mL, 8.56 mmol) and Zn (1.12 g, 17.11 mmol) in 42 mL of dry THF under N$_2$ at 0° C. was added a dry solution of 11 (2 g, 7.13 mmol) in 14 mL of dry THF. After 2 h of refluxing, the mixture was cooled to room temperature, filtered to remove excess Zn, evaporated, poured into water and extracted with CH$_2$Cl$_2$. The organic phase was washed with water and dried over MgSO$_4$. After solvent removal, the crude solid was purified by column chromatography (silica gel, hexane) to give a pale yellow solid compound 12 in 75% yield. $^1$H-NMR (CDCl$_3$, 400 MHz) ppm 0.88 (t, 6H, J=6.8 Hz) ppm 1.31 (m, 36H) ppm 1.59 (td, 4H, J=7.4 Hz, J=14.7 Hz) ppm 2.65 (m, 4H) ppm 6.84 (d, 2H, J=5.2 Hz) ppm 6.99 (s, 2H) ppm 7.07 (d, 2H, J=5.2 Hz).

Example 4c

Preparation of (E)-1,2-bis[3-dodecyl-5-(trimethyl-stannyl)-2-thienyl]ethylene (13)

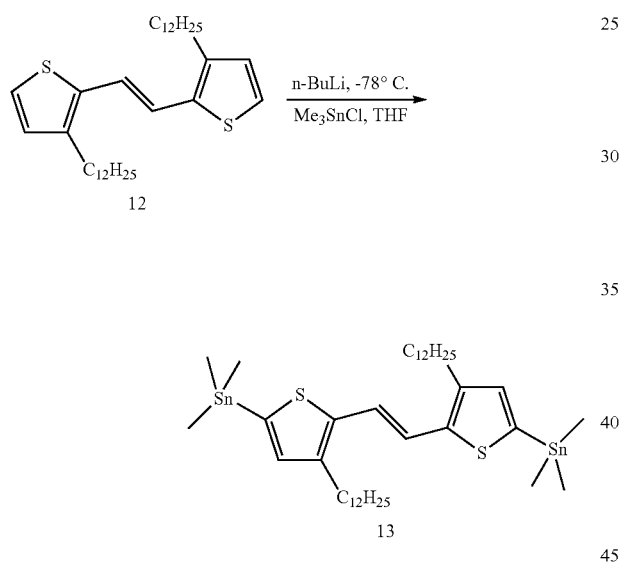

(E)-1,2-Bis(3-dodecylthienyl)ethylene (12) (10.4 mmol, 2.00 g) was dissolved in anhydrous THF (43.2 mL) and cooled to −78° C. under nitrogen. n-Butyllithium (21.84 mmol, 13.7 mL) was then added dropwise. The resulting solution was warmed to room temperature over 30 min and stirred at that temperature for 3 h. The mixture was then cooled to −78° C. before trimethyltin chloride (21.84 mmol, 4.35 g) in anhydrous THF (26 mL) was added dropwise. After addition, the mixture was warmed to room temperature over 4 h and stirred for additional 20 h at room temperature. The reaction mixture was poured into saturated NH$_4$Cl solution (100 mL) and the aqueous layer was extracted with diethyl ether. The combined organic layers were washed with water, dried over Na$_2$SO$_4$ and concentrated under reduced pressure. The crude solid was recrystallized from ethanol to give desired product 13 in 73% yield. $^1$H-NMR (CDCl$_3$, 400 MHz) ppm 0.36 (s, 18H) ppm 0.88 (t, 6H, J=6.9 Hz) ppm 1.30 (m, 36H) ppm 1.59 (td, 4H, J=7.3 Hz, J=14.9 Hz) ppm 2.65 (m, 4H) ppm 6.94 (s, 2H) ppm 7.00 (s, 2H).

Example 4d

Preparation of (E)-1,2-bis[3-dodecyl-5-bromo-2-thienyl]ethylene (14)

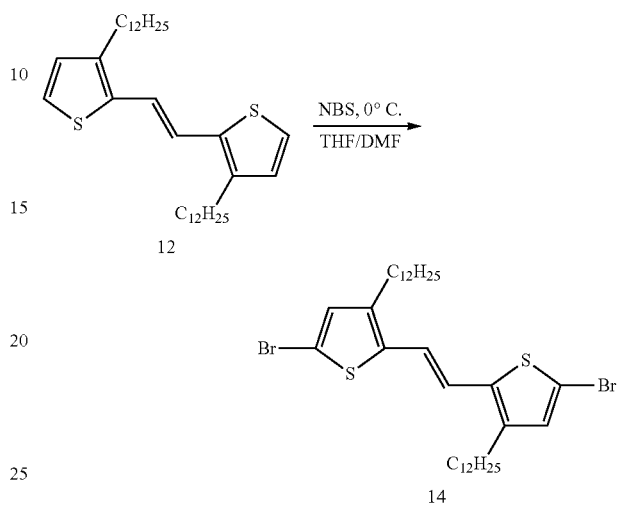

(E)-1,2-Bis(3-dodecylthienyl)ethylene (12) (1.34 g, 2.54 mmol) was dissolved in 25/25 mL of anhydrous DMF/THF and cooled to 0° C. Then, NBS (0.99 g, 5.59 mmol) dissolved in 15 mL of anhydrous DMF was added dropwise to the mixture and the reaction was monitored by TLC. The reaction was quenched with water and extracted with diethyl-ether. After washing with water, the organic phase was dried over Na$_2$SO$_4$ and concentrated. Purification using column chromatography (silica gel, hexane) gave bright yellow solid compound 14 in 78% yield. $^1$H-NMR (DCM-d$_2$, 400 MHz) ppm 0.88 (t, 6H, J=6.8 Hz) ppm 1.28 (m, 40H) ppm 2.58 (m, 4H) ppm 6.80 (s, 2H) ppm 6.83 (s, 2H).

Example 4e

Preparation of (E)-1,2-bis(4-bromothienyl)ethylene (16)

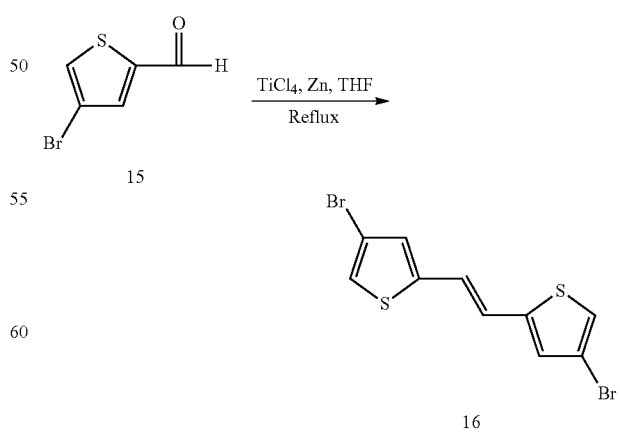

To a suspension of low-valent Ti prepared from TiCl$_4$ (2.8 mL, 25.13 mmol) and Zn (3.29 g, 50.26 mmol) in 126 mL of dry THF under N₂ at 00° C. was added a dry solution of 15 (4 g, 20.94 mmol) in 42 mL of dry THF. After 2 h of refluxing, the mixture was cooled to room temperature, filtered to remove excess Zn, evaporated, poured into water and extracted with CH₂Cl₂. The organic phase was washed with water and dried over MgSO₄. After solvent removal, the crude solid was washed with warm ethanol to give a brown solid compound 16 in 80% yield. ¹H-NMR (CDCl₃, 400 MHz) ppm 6.94 (s, 2H) ppm 6.97 (d, 2H, J=1.4 Hz) ppm 7.10 (d, 2H, J=1.1 Hz).

Example 4f

Preparation of (E)-1,2-bis(4-dodecylthienyl)ethylene (17)

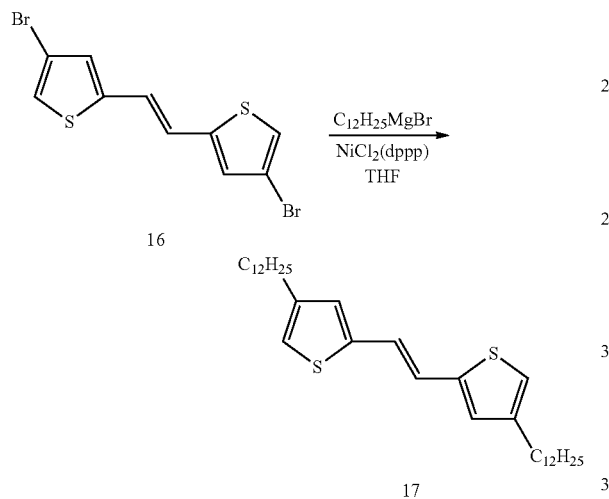

A mixture of 16 (1.1 g, 3.14 mmol) and NiCl₂(dppp) (0.17 g, 0.31 mmol) was degassed in a 2 necked RBF. Anhydrous THF (25 mL) was then added to the mixture. C₁₂H₂₅MgBr (1M in THF, 8 mL, 8 mmol) was added dropwise to the reaction mixture and heated at 60° C. overnight. The reaction was quenched with 2N aqueous HCl, extracted with CH₂Cl₂ and filtered through celite. The residue was purified by column chromatography (silica gel, hexane/CH₂Cl₂, 4:1) and recrystallized from hexane to give a yellow solid compound 17 in 38% yield. ¹H-NMR (DCM-d₂, 400 MHz) ppm 0.88 (t, 6H, J=6.8 Hz) ppm 1.29 (m, 36H) ppm 1.60 (td, 4H, J=7.2 Hz, J=14.6 Hz) ppm 2.55 (m, 4H) ppm 6.78 (s, 2H) ppm 6.88 (s, 2H) ppm 6.96 (s, 2H).

Example 4g

Preparation of (E)-1,2-Bis[4-dodecyl-5-bromo-2-thienyl]ethylene (18)

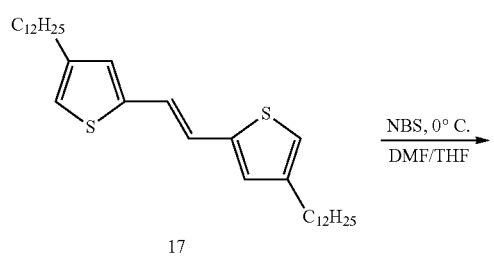

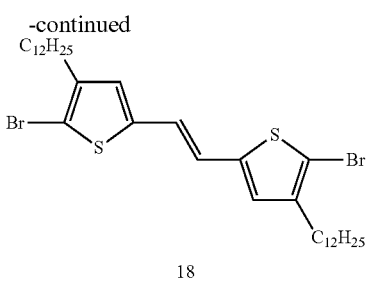

(E)-1,2-bis(4-dodecylthienyl)ethylene (17) (0.62 g, 1.17 mmol) was dissolved in 24/78 mL of anhydrous DMF/THF and cooled to 00° C. Then, NBS (0.46 g, 2.57 mmoL) dissolved in 15 mL of anhydrous DMF was added drop wise to the mixture and the reaction was monitored by TLC. The reaction was quenched with water and extracted with diethylether. After washing with water, the organic phase was dried over Na₂SO₄ and concentrated. Purification using column chromatography (silica gel, hexane) gave yellow solid compound 18 in 93% yield. ¹H-NMR (DCM-d₂, 400 MHz) ppm 0.88 (t, 6H, J=6.8 Hz) ppm 1.29 (m, 36H) ppm 1.57 (dd, 4H, J=7.3 Hz, J=14.6 Hz) ppm 2.51 (m, 4H) ppm 6.75 (s, 2H) ppm 6.79 (s, 2H).

Example 4h

Preparation of 2-(trimethylstannyl)-4-dodecyl-thiophene (20)

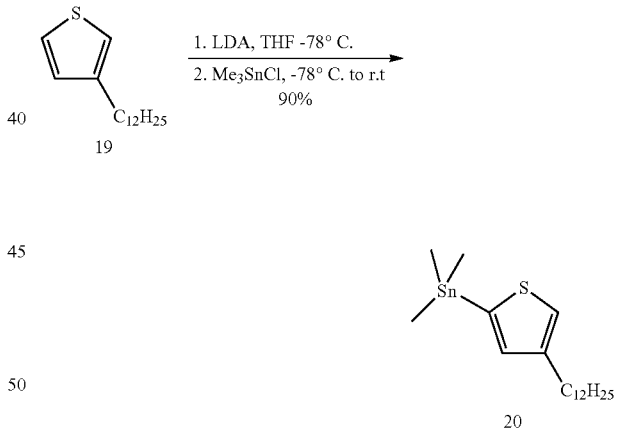

To a stirred degassed homogeneous solution of 3-dodecyl thiophene (19) (2 g, 7.92 mmol) in THF at −78° C. was added LDA (4.75 ml, 9.51 mmol) drop wise. The mixture was stirred at −78° C. for 1 h, then trimethylstannylchloride dissolved in 9.5 ml of THF was added, and the solution warmed to room temperature. Stirring was continued for 2 h at room temperature. The mixture was washed with saturated NaHCO₃ and extracted with diethylether. The organic layer was separated and dried over anhydrous sodium sulphate and concentrated under reduced pressure to give desired product 20 in 90% yield. ¹H-NMR (CD₂Cl₂, 400 MHz) δ 7.19 (s, 1H), 7.02 (s, 1H), 2.63 (t, 2H), 1.62 (m, 2H), 1.2-1.4 (m, 18H), 0.88 (t, 3H), 0.34 (s, 9H).

Example 4i

Preparation of 4, 4'''-didodecyl-2,2':5',2'':5'',2'''-quaterthiophene (21)

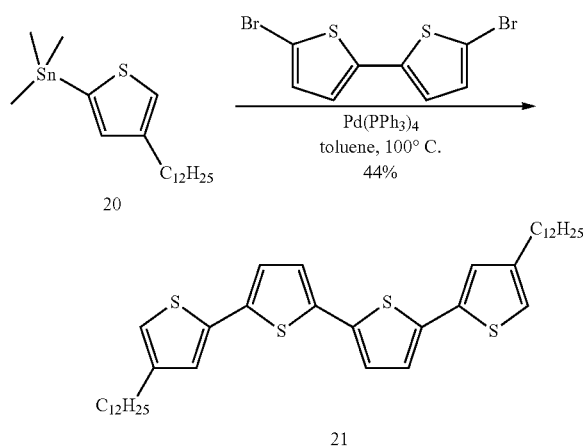

5,5'-dibromo-2,2'-bithiophene and 4-dodecyl-3-(trimethylstannyl)thiophene (20) were degassed in a 100 ml 2-neck round bottom flask. 10 ml of anhydrous toluene was added to the reaction mixture and refluxed at 100° C. After cooling, the reaction mixture was extracted using DCM, washed with water, brine, dried over anhydrous sodium sulphate and concentrated under reduced pressure. The crude mixture was purified using column chromatography using hexane as eluant to give the desired product 21 as an orange solid. Yield: 44% (0.4852 g). $^{1}$H-NMR (CD$_2$Cl$_2$, 400 MHz) δ 7.06 (s, 2H), 6.86 (s, 2H), 7.08-7.11 (m, 4H), 2.60 (t, 4H), 1.65 (m, 4H), 1.2-1.4 (m, 36H), 0.89 (t, 6H).

Example 4j

Preparation of: 5, 5'''-Dibromo-4, 4'''-Didodecyl-2, 2':5',2'':5'',2'''-quaterthiophene (22)

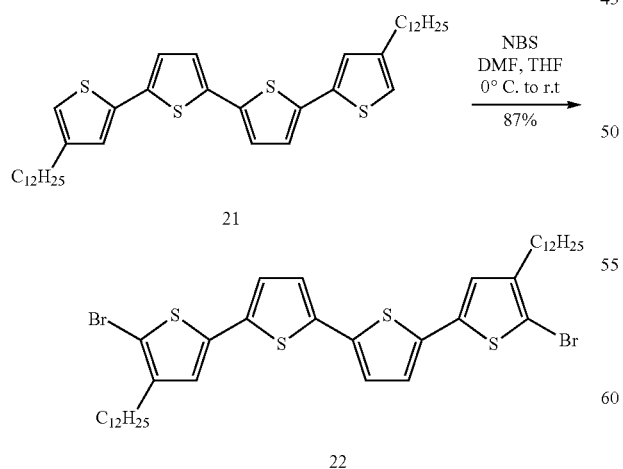

To a cooled solution of 21 in DMF/THF mixture at 0° C. was added NBS dissolved in 5 ml of DMF. The reaction mixture was stirred overnight at room temperature. Then, the reaction mixture was poured into water, extracted with DCM, washed with brine and dried over anhydrous sodium sulphate to give desired product 22 in 87% yield. (0.524 g). $^{1}$H-NMR (CD$_2$Cl$_2$, 400 MHz) δ 7.09 (d, 2H), 7.03 (d, 2H), 6.92 (s, 2H, 2.55 (t, 4H), 1.55-1.65 (4H, m), 1.2-1.4 (m, 36H), 0.88 (t, 6H).

Example 4k

Preparation of 5, 5'''-bis(trimethylstannyl)-3,3'''-didodecyl-2,2':5',2'':5'',2'''-quaterthiophene (24)

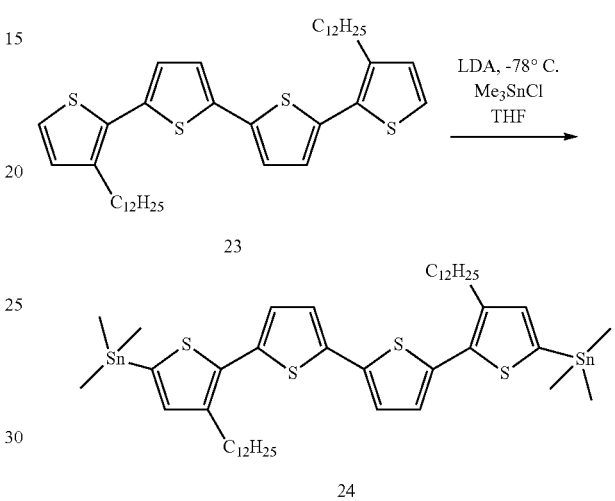

To a homogeneous degassed solution of quaterthiophene 23 (Ong, B. S.; Wu, Y.; Liu, P.; Gardner, S. *J. Am. Chem. Soc.* 2004, 126, 3378) in THF at −78° C. was added LDA drop wise. The mixture was stirred at −78° C. for 1 h, then Me$_3$SnCl dissolved in 2 ml of THF was added, and the solution was warmed to room temperature. Stirring was continued for 2 h. The reaction mixture was poured into saturated NH$_4$Cl solution and then extracted using DCM, washed with water, brine, dried over anhydrous sodium sulphate and concentrated under reduced pressure to give desired product 24 as a dark brown liquid. Yield: 93.8% (610 mg). $^{1}$H-NMR (CDCl$_3$, 400 MHz) δ 7.13 (d, 2H), 7.03 (m, 4H), 2.80 (t, 4H), 1.66 (m, 4H), 1.2-1.4 (m, 36H), 0.87 (t, 6H), 0.38 (s, 18H).

Example 4l

Preparation of 4,8-bis(2-ethylhexyl)-benzo[1,2-b:4,5-b']-dithiophene (26)

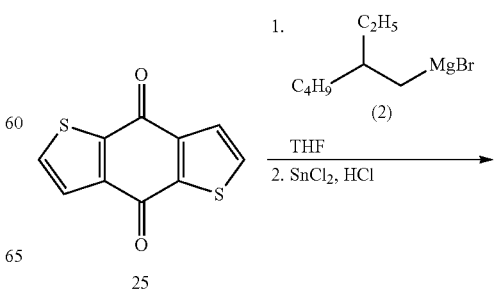

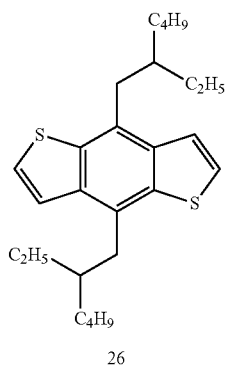

26

To a suspension of benzo[1,2-b:4,5-b']dithiophene-4,8-dione (25) (Beimling, P.; Koβmehl, G. *Chem. Ber.* 1986, 119, 3198) (4.9 g, 22.2 mmol) in 100 mL of THF was added 2-ethylhexyl magnesium bromide (111 mL, 1M in diethyl ether). The mixture was then heated at 60° C. for 24 h., and cooled to r.t. following by adding $SnCl_2$ (13.47 g, 71.04 mmol) in 190 mL of 10% HCl. The mixture was heated at 60° C. for 24 h. THF was removed under reduced pressure. The residue was dissolved in ether, washed with water, sat. $NaHCO_3$, brine and water. The organic layer was dried over $MgSO_4$ and then concentrated. Column chromatography with hexane gave 1.2 g (13%) of desired product 26. $^1$H-NMR (400 MHz, $CDCl_3$): ppm 7.46 (d, 2H, J=5.6 Hz), 7.42 (d, 2H, J=5.6 Hz), 3.18-3.06 (m, 4H), 1.97 (hep, 2H, J=6.4 Hz), 1.43-1.18 (m, 16H), 0.91-0.81 (m, 12H).

Example 4m

Preparation of 2,6-(trimethylstannyl)-4,8-bis(2-ethylhexyl)-benzo[1,2-b:4,5-b']-dithiophene (27)

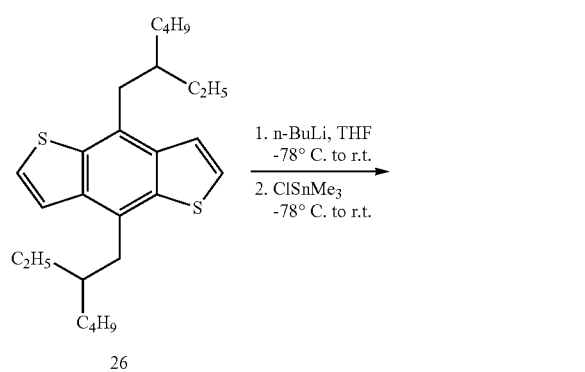

Benzodithiophene 26 (1.93 mmol, 0.8 g) was dissolved in anhydrous THF (10 mL) and cooled to −78° C. under nitrogen. n-Butyllithium (4.05 mmol, 2.5 mL) was then added drop wise. The resulting solution was continued stirring at −78° C. for 3 h and at r.t. for 1 h. The mixture was then cooled to −78° C. before trimethyltin chloride (4.05 mmol, 0.8 g) in anhydrous THF (5 mL) was added drop wise. After addition, the mixture was warmed slowly to room temperature and stirred for additional 20 h at room temperature. The reaction mixture was poured into saturated $NH_4Cl$ solution (30 mL) and the aqueous layer was extracted with diethyl ether. The combined organic layers were washed with water, dried over $Na_2SO_4$ and concentrated under reduced pressure to obtain compound 27 which become solid under long vacuum drying in 94% yield. $^1$H-NMR (400 MHz, $CD_2Cl_2$): ppm 7.53 (s, 2H), 3.21-3.08 (m, 4H), 1.93 (hep, 2H, J=6.4 Hz), 1.44-1.2 (m, 16H), 0.93-0.82 (m, 12H), 0.44 (s, 18H). HPLC ($CHCl_3$:MeOH 99:1): 98.6%.

Example 4n

Preparation of 2,6-(trimethylstannyl)-4,8-didodecyl-benzo[1,2-b:4,5-b']-dithiophene (20)

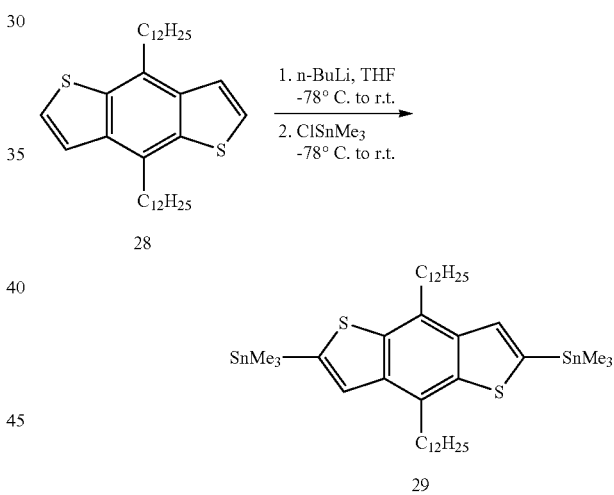

Compound 28 (1.9 mmol, 1.0 g) was dissolved in anhydrous THF (20 mL) and cooled to −78° C. under nitrogen. n-Butyllithium (4.05 mmol, 2.5 mL) was then added drop wise. The resulting solution was continued stirring at −78° C. for 3 h and at r.t. for 1 h. The mixture was then cooled to −78° C. before trimethyltin chloride (4.05 mmol, 0.8 g) in anhydrous THF (5 mL) was added drop wise. After addition, the mixture was warmed slowly to room temperature and stirred for additional 20 h at room temperature. The reaction mixture was poured into saturated $NH_4Cl$ solution (30 mL) and the aqueous layer was extracted with diethyl ether. The combined organic layers were washed with water, dried over $Na_2SO_4$ and concentrated under reduced pressure to obtain compound 29 (1.44 g, 89% yield). $^1$H-NMR (400 MHz, $CDCl_3$): ppm 7.49 (s, 2H), 3.20 (t, 4H, J=8 Hz), 1.81 (quin, 4H, J=8 Hz), 1.47 (quin, 4H, J=8 Hz), 1.37 (quin, 4H, J=8H), 1.26 (bs, 28H), 0.88 (t, 6H, J=8 Hz), 0.45 (s, 18H).

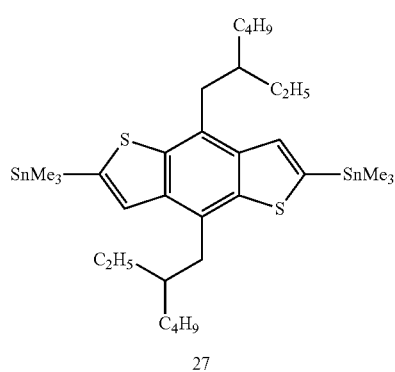

27

Example 4o

Preparation of (Z)-5,5'-bis(trimethylstannyl)-[1,2-bis(2'-thienyl)vinyl] (31)

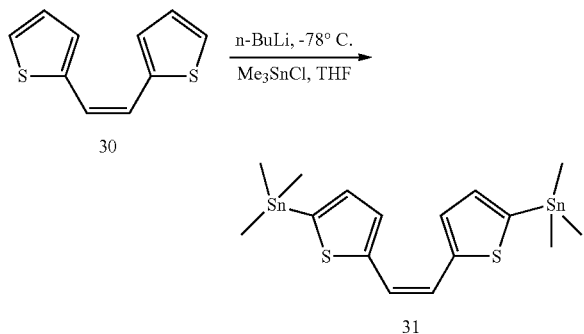

Cis-TVT 30 (0.52 mmol, 0.1 g) was dissolved in anhydrous THF (8.4 mL) and cooled to −78° C. under nitrogen. n-Butyllithium (1.09 mmol, 0.68 mL) was then added drop wise. The resulting solution was warmed to room temperature over 30 min and stirred at that temperature for 3 h. The mixture was then cooled to −78° C. before trimethyltin chloride (1.09 mmol, 0.22 g) in anhydrous THF (5 mL) was added drop wise. After addition, the mixture was warmed to room temperature over 4 h and stirred for additional 20 h at room temperature. The reaction mixture was poured into saturated $NH_4Cl$ solution (100 mL) and the aqueous layer was extracted with diethyl ether. The combined organic layers were washed with water, dried over $Na_2SO_4$ and concentrated under reduced pressure. The crude solid was recrystallized from ethanol to give desired compound 31 in 43% yield. $^1$H-NMR (CDCl$_3$, 400 MHz) ppm 0.37 (s, 18H) ppm 7.09 (d, 4H, J=4.8 Hz) ppm 7.13 (d, 2H, J=3.4 Hz).

Example 5

Polymer Synthesis

Example 5A

Polymer P7

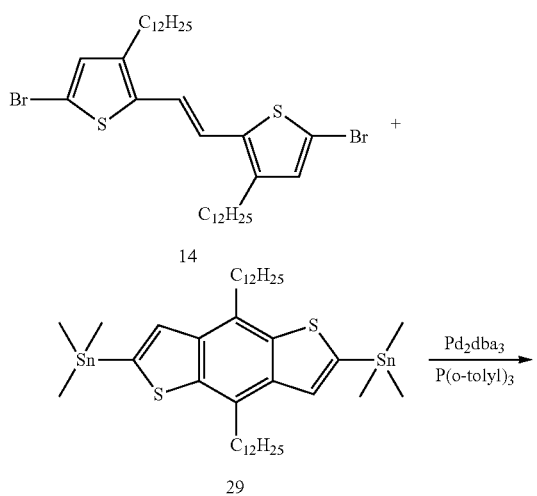

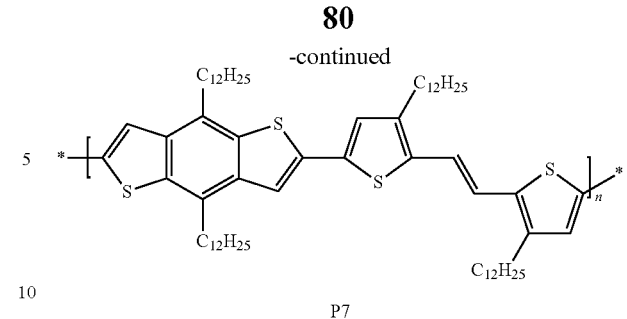

Equimolar amounts of monomer 14 (0.23 mmol, 158 mg) and monomer 29 (0.23 mmol, 200 mg) were dissolved in anhydrous chlorobenzene (7.7 mL) followed by the addition of Pd$_2$dba$_3$ (0.007 mmol, 6 mg) and tri(o-tolyl)phosphine (0.014 mmol, 4 mg) under $N_2$. The resulting mixture was refluxed for 2 days under $N_2$. 2-Bromothiophene and 2-tributylstannylthiophene were added as end cappers, with 2-bromothiophene added first followed by 2-tributylstannylthiophene. After being cooled to room temperature, the reaction mixture was precipitated in methanol (300 mL) and stirred for 2 h at room temperature. The polymer P7 was filtered, washed with methanol and subjected to Soxhlet extraction for 24 h in acetone. The polymer P7 was redissolved in toluene and precipitated from methanol, filtered, washed with methanol and dried. Mn=1.3×10$^4$, Mw=8.6× 10$^4$, PDI=6.4. $^1$H-NMR (1,1,2,2-Tetrachloroethane-d$_2$, 400 MHz) ppm 0.94 (m, 12H) ppm 1.33 (broad peak, 72H) ppm 1.78 (m, 4H) ppm 1.94 (m, 4H) ppm 2.78 (m, 4H) ppm 3.22 (m, 4H) ppm 7.11 (m, 2H) ppm 7.19 (m, 2H) ppm 7.54 (m, 2H). Anal. (calcd): C, 77.27 (77.65); H, 9.86 (10.16).

Example 5B

Polymer P8

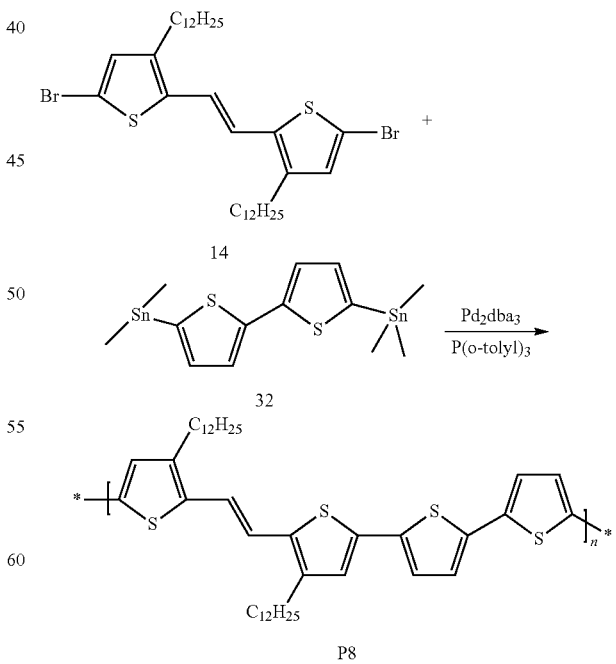

Equimolar amounts of compound 14 (0.29 mmol, 200 mg) and 5,5'-distannyl[2,2']bithiophene (32) (0.29 mmol, 143 mg) were dissolved in anhydrous chlorobenzene (20 mL) followed by the addition of $Pd_2dba_3$ (0.009 mmol, 8 mg) and tri(o-tolyl)phosphine (0.02 mmol, 6 mg) under $N_2$. The resulting mixture was refluxed for 2 days under $N_2$. 2-Bromothiophene and 2-tributylstannylthiophene were added as end cappers, with 2-bromothiophene added first followed by 2-tributylstannylthiophene. After being cooled to room temperature, the reaction mixture was precipitated in methanol (500 mL) and stirred for 2 h at room temperature. The polymer P8 was filtered, washed with methanol and subjected to Soxhlet extraction for 24 h in acetone. The polymer P8 was redissolved in toluene and precipitated from methanol, filtered, washed with methanol and dried. $Mn=9.7\times10^3$, $Mw=5.7\times10^4$, PDI=5.9. $^1$H-NMR (1,1,2,2-Tetrachloroethane-$d_2$, 400 MHz) ppm 0.94 (m, 6H) ppm 1.34 (broad peak, 36H) ppm 1.73 (m, 4H) ppm 2.72 (m, 4H) ppm 7.01 (m, 4H) ppm 7.14 (m, 4H). Anal. (calcd): C, 72.43 (72.99); H, 8.25 (8.46).

Example 5C

Polymer P9

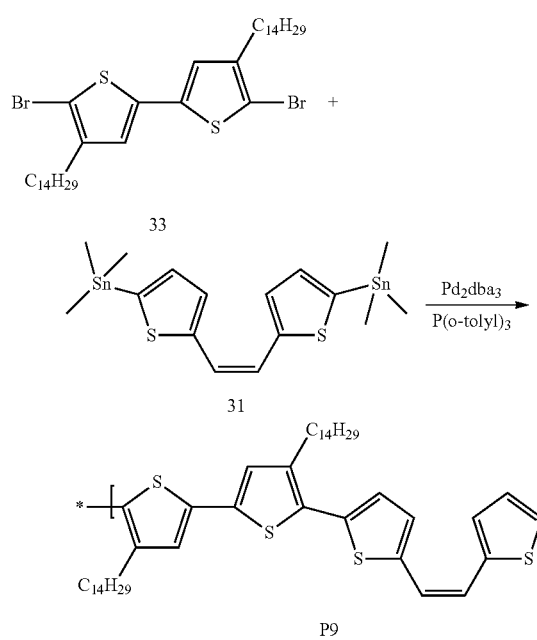

Equimolar amounts of 5,5'-Dibromo-4,4'-bi(tetradecyl)-2,2'-bithiophene (33) (0.17 mmol, 122 mg) and monomer 31 (0.17 mmol, 88 mg) were dissolved in anhydrous chlorobenzene (6.5 mL) followed by the addition of $Pd_2dba_3$ (0.005 mmol, 4.7 mg) and tri(o-tolyl)phosphine (0.01 mmol, 3.5 mg) under $N_2$. The resulting mixture was refluxed for 2 days under $N_2$. 2-Bromothiophene and 2-tributylstannylthiophene were added as end cappers, with 2-bromothiophene added first followed by 2-tributylstannylthiophene. After being cooled to room temperature, the reaction mixture was precipitated in methanol (300 mL) and stirred for 2 h at room temperature. The polymer P9 was filtered, washed with methanol and subjected to Soxhlet extraction for 24 h in acetone. The polymer P9 was redissolved in THF and reprecipitated from methanol, filtered, washed with methanol and dried. $Mn=1.6\times10^4$, $Mw=3.4\times10^4$, PDI=2.1. $^1$H-NMR (1,1,2,2-Tetrachloroethane-$d_2$, 400 MHz) ppm 0.93 (m, 6H) ppm 1.34 (broad peak, 44H) ppm 1.76 (m, 4H) ppm 2.84 (m, 4H) ppm 7.07 (m, 8H). Anal. (calcd): C, 74.67 (73.94); H, 8.44 (8.90).

Example 5D

Polymer P10

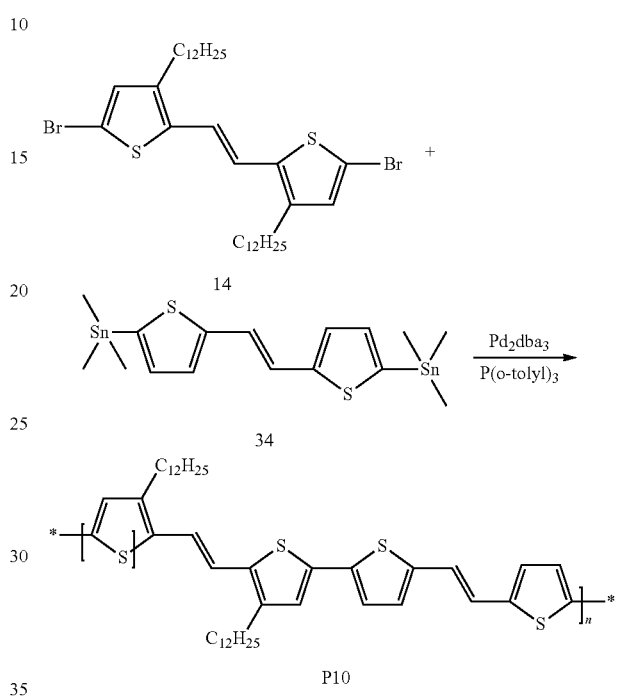

Equimolar amounts of monomer 14 (0.29 mmol, 200 mg) and monomer 34 (0.29 mmol, 150 mg) were dissolved in anhydrous chlorobenzene (20 mL) followed by the addition of $Pd_2dba_3$ (0.009 mmol, 8 mg) and tri(o-tolyl)phosphine (0.02 mmol, 6 mg) under $N_2$. The resulting mixture was refluxed for 2 days under $N_2$. 2-Bromothiophene and 2-tributylstannylthiophene were added as end cappers, with 2-bromothiophene added first followed by 2-tributylstannyl-thiophene. After being cooled to room temperature, the reaction mixture was precipitated in methanol (500 mL) and stirred for 2 h at room temperature. The polymer P10 was filtered, washed with methanol, subjected to Soxhlet extraction for 24 h in acetone and dried. $Mn=1.1\times10^4$, $Mw=3.0\times10^4$, PDI=2.8. Anal. (calcd): C, 73.18 (73.94); H, 8.19 (8.90).

Example 5E

Polymer P11

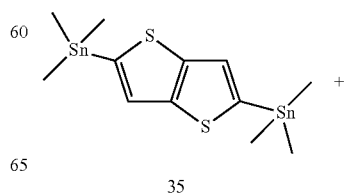

35

-continued

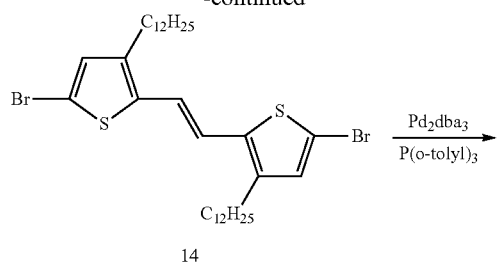

14

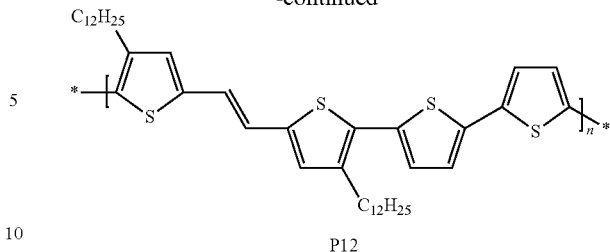

P12

Equimolar amounts of monomer 18 (0.26 mmol, 180 mg) and 5,5'-distannyl-[2,2']bithiophene (32) (0.26 mmol, 128 mg) were dissolved in anhydrous chlorobenzene (16 mL) followed by the addition of Pd$_2$dba$_3$ (0.008 mmol, 7.3 mg) and tri(o-tolyl)phosphine (0.02 mmol, 6.1 mg) under N$_2$. The resulting mixture was refluxed for 2 days under N$_2$. 2-Bromothiophene and 2-tributylstannylthiophene were added as end cappers, with 2-bromothiophene added first followed by 2-tributylstannylthiophene. After being cooled to room temperature, the reaction mixture was precipitated in methanol (500 mL) and stirred for 2 h at room temperature. The polymer P12 was filtered, washed with methanol and subjected to Soxhlet extraction for 24 h in acetone. The polymer P12 was redissolved in THF and precipitated from methanol, filtered, washed with methanol and dried. Mn=2.0×10$^4$, Mw=4.2×10$^4$, PDI=2.1. $^1$H-NMR (1,1,2,2-Tetrachloroethane-d$_2$, 400 MHz) ppm 0.95 (t, 6H, J=6.8 Hz) ppm 1.35 (broad peak, 36H) ppm 1.75 (m, 4H) ppm 2.82 (m, 4H) ppm 6.97 (d, 4H, J=6.9 Hz) ppm 7.12 (d, 2H, J=3.7 Hz) ppm 7.20 (d, 2H, J=3.6 Hz).

Example 5G

Polymer P13

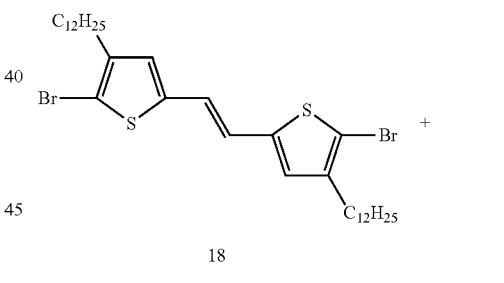

18

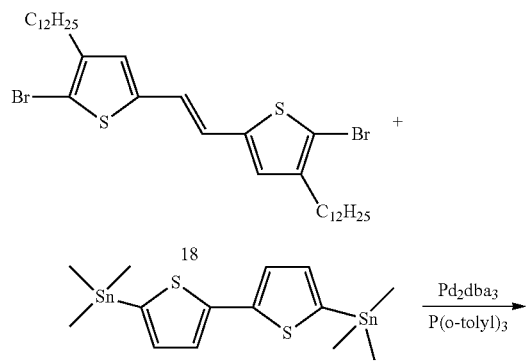

P11

Equimolar amounts of 2,5-bis(trimethylstannyl)-thieno[3,2-b]thiophene (35) (0.25 mmol, 116 mg) and monomer 14 (0.25 mmol, 170 mg) were dissolved in anhydrous chlorobenzene (20 mL) followed by the addition of Pd$_2$dba$_3$ (0.008 mmol, 7.3 mg) and tri(o-tolyl)phosphine (0.02 mmol, 6 mg) under N$_2$. The resulting mixture was refluxed for 2 days under N$_2$. 2-Bromothiophene and 2-tributylstannylthiophene were added as end cappers, with 2-bromothiophene added first followed by 2-tributylstannylthiophene. After being cooled to room temperature, the reaction mixture was precipitated in methanol (500 mL) and stirred for 2 h at room temperature. The polymer P11 was filtered, washed with methanol, subjected to Soxhlet extraction for 24 h in acetone and dried. Mn=8.3×10$^3$, Mw=4.3×10$^4$, PDI=5.2. Anal. (calcd): C, 72.12 (72.23); H, 7.79 (8.49).

Example 5F

Polymer P12

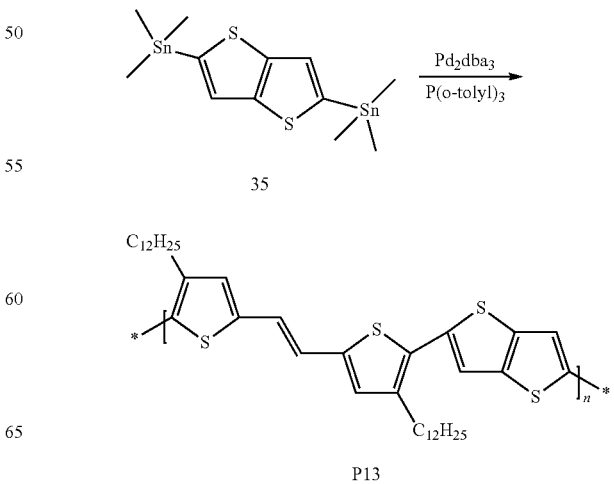

P13

Equimolar amounts of monomer 18 (0.26 mmol, 180 mg) and 2,5-bis(trimethylstannyl)-thieno[3,2-b]thiophene (35) (0.26 mmol, 122 mg) were dissolved in anhydrous chlorobenzene (16 mL) followed by the addition of $Pd_2dba_3$ (0.008 mmol, 7.3 mg) and tri(o-tolyl)phosphine (0.02 mmol, 6.1 mg) under $N_2$. The resulting mixture was refluxed for 2 days under $N_2$. 2-Bromothiophene and 2-tributylstannylthiophene were added as end cappers, with 2-bromothiophene added first followed by 2-tributylstannylthiophene. After being cooled to room temperature, the reaction mixture was precipitated into a mixture of methanol (500 mL) and stirred for 2 h at room temperature. The polymer P13 was filtered, washed with methanol and subjected to Soxhlet extraction for 24 h in acetone. The polymer P13 was redissolved in chlorobenzene and precipitated from methanol, filtered, washed with methanol and dried. $Mn=8.0\times10^3$, $Mw=1.3\times10^4$, PDI=1.6. $^1$H-NMR (1,1,2,2-Tetrachloroethane-$d_2$, 400 MHz) ppm 0.95 (t, 6H, J=6.8 Hz) ppm 1.35 (broad peak, 36H) ppm 1.76 (m, 4H) ppm 2.85 (m, 4H) ppm 6.99 (d, 4H, J=4.2 Hz) ppm 7.33 (s, 2H). Anal. (calcd): C, 72.32 (72.23); H, 7.92 (8.49).

Example 5H

Polymer P14

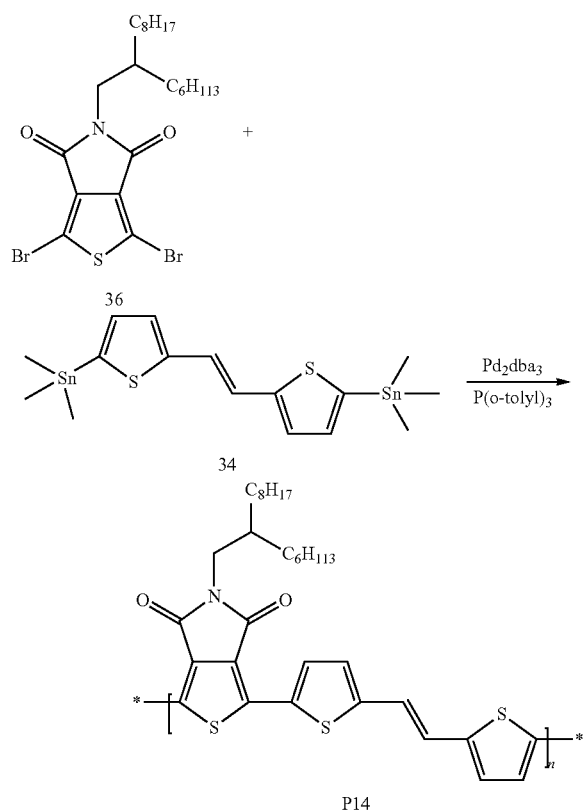

Dibromothiopheneimide 36 (0.20 g, 0.37 mmol), monomer 34 (0.19 g, 0.37 mmol), $Pd_2dba_3$ (0.010 g, 0.011 mmol), and $P(o-tolyl)_3$ (0.007 g, 0.022 mmol) were added to the rbf and degassed for 3 times. After that, chlorobenzene (12 mL) was added and the mixture was stirred at 130° C. for 2 days. 2-Bromothiophene and 2-tributylstannylthiophene were added as end cappers, with 2-bromothiophene added first followed by 2-tributylstannylthiophene. The reaction solution was then added dropwise to 400 mL methanol, filtered, and then subjected to Soxhlet extraction with acetone. The polymer P14 recovered inside the Soxhlet thimble was dissolved in toluene at 70° C. and precipitated once more in methanol. $Mn=9.54\times10^3$ g/mol, D=1.9. Elemental analysis (calcd): C, 67.96 (67.92); H, 6.80 (6.95).

Example 51

Polymer P15

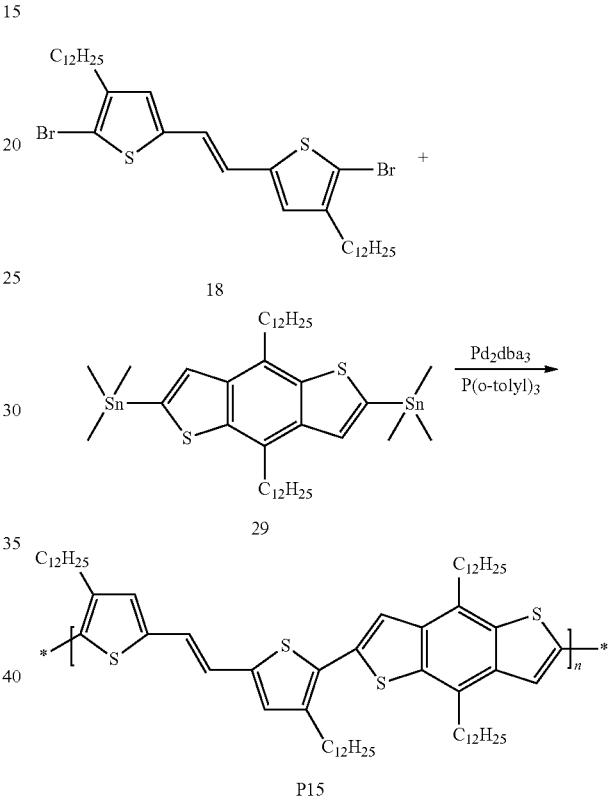

Equimolar amounts of monomer 18 (0.22 mmol, 150 mg) and monomer 29 (0.22 mmol, 188 mg) were dissolved in anhydrous chlorobenzene (7.4 mL) followed by the addition of $Pd_2dba_3$ (0.007 mmol, 6.4 mg) and tri(o-tolyl)phosphine (0.01 mmol, 3.1 mg) under $N_2$. The resulting mixture was refluxed for 2 days under $N_2$. 2-Bromothiophene and 2-tributylstannylthiophene were added as end cappers, with 2-bromothiophene added first followed by 2-tributylstannylthiophene. After being cooled to room temperature, the reaction mixture was precipitated in methanol (300 mL) and stirred for 2 h at room temperature. The polymer P15 was filtered, washed with methanol and subjected to Soxhlet extraction for 24 h in acetone. The polymer P15 was redissolved in THF and precipitated from methanol, filtered, washed with methanol and dried. $Mn=2.4\times10^3$, $Mw=4.8\times10^3$, PDI=2.0. $^1$H-NMR (1,1,2,2-tetrachloroethane-$d_2$, 400 MHz) ppm 0.93 (m, 12H) ppm 1.41 (m, 72H) ppm 1.78 (m, 4H) ppm 1.95 (m, 4H) ppm 2.92 (m, 4H) ppm 3.22 (m, 4H) ppm 7.02 (m, 4H) ppm 7.51 (m, 2H). Anal. (calcd): C, 77.98 (77.65); H, 9.91 (10.16).

Example 5J

Polymer P16

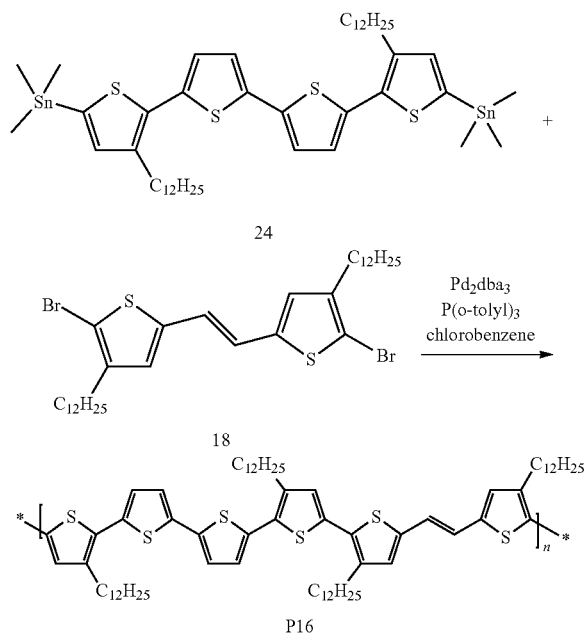

Equimolar amounts of monomer 24 (0.15 g, 0.15 mmol) and monomer 18 (0.103 g, 0.15 mmol), together with Pd$_2$dba$_3$ (0.004 g, 0.0045 mmol) and P-(o-tolyl)$_3$ (0.0027 g, 0.009 mmol) were degassed in a 50 ml 2-neck round bottom flask. Anhydrous chlorobenzene (5.6 ml) was then added to the mixture. The reaction mixture was refluxed under nitrogen at 130° C. for 48 h. 2-Bromothiophene and 2-tributyl-stannylthiophene were added as end cappers, with 2-bromothiophene added first followed by 2-tributylstannylthiophene. The polymer P16 was precipitated in methanol, filtered, subjected to Soxhlet extraction for 24 h in acetone and then redissolved in chlorobenzene and reprecipitated again in methanol. Mn: 1.5×10$^4$, PDI: 1.83 Anal. (calcd): C %, 74.79 (74.56); H %, 9.18 (9.30). 1H-NMR (C$_2$H$_2$C$_{14}$, 400 MHz) 7.18 (br s, 2H), 7.09 (br s, 2H), 7.01 (br s, 2H), 6.93 (br s, 2H), 6.91 (br s, 2H), 2.79 (t, 8H), 1.2-1.5 (m, 80H) 0.88 (t, 12H).

Example 5K

Polymer P17

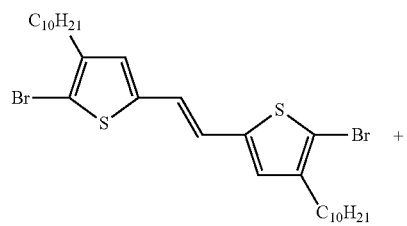

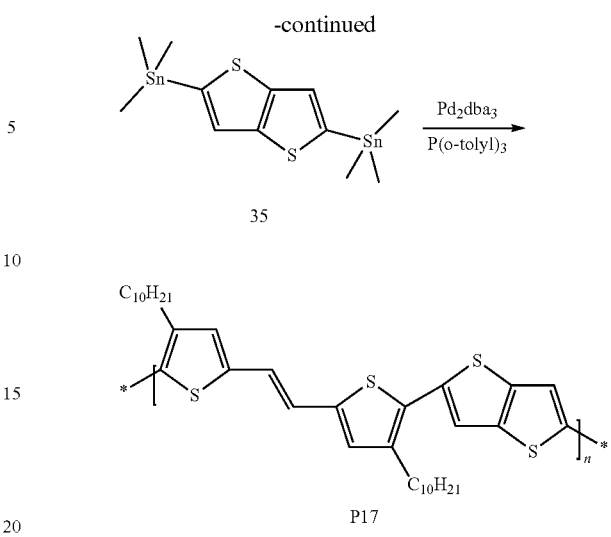

Monomer 37 (0.20 g, 0.32 mmol), 2,5-bis(trimethylstannyl)-thieno[3,2-b]thiophene 35 (0.15 g, 0.32 mmol), Pd$_2$dba$_3$ (0.009 g, 0.010 mmol), and P(o-tolyl)$_3$ (0.006 g, 0.019 mmol) were added to the two neck rbf and degassed for 3 times. After chlorobenzene (16 mL) were added, the mixture was stirred at 130° C. for 36 h. 2-Bromothiophene and 2-tributylstannylthiophene were added as end cappers, with 2-bromothiophene added first followed by 2-tributyl-stannylthiophene. The reaction mixture was cooled to room temperature. The reaction solution was then added drop wise to 400 mL methanol, filtered, and then subjected to Soxhlet extraction with acetone. The polymer P17 recovered inside the Soxhlet thimble was redissolved in chlorobenzene at 70° C. and reprecipitated in methanol. Mn=1.03×10$^4$ g/mol, Đ=1.7. Elemental analysis (calcd): C, 70.86 (71.00); H, 7.46 (7.94).

Example 5L

Polymer P18

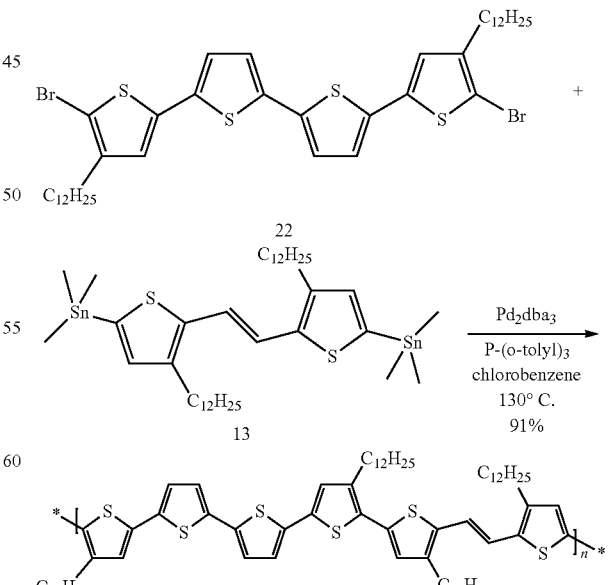

Equimolar amounts of monomer 22 (0.5 g, 0.606 mmol), monomer 13 (0.518 g, 0.606 mmol), Pd$_2$dba$_3$ (0.0167 g, 0.018 mmol) and P-(o-tolyl)$_3$ (0.011 g, 0.036 mmol) were degassed in a 50 ml schlenk tube. 6 ml of chlorobenzene was then added and the mixture refluxed at 130° C. for 2 days. 2-Bromothiophene and 2-tributylstannylthiophene were added as end cappers, with 2-bromothiophene added first followed by 2-tributylstannylthiophene. The crude polymer was precipitated in methanol, filtered. After filtering, the polymer P18 was subjected to Soxhlet extraction in acetone at 85° C. The polymer P18 was then redissolved in chlorobenzene, reprecipitated in methanol and dried. Mn: 2.7×10$^4$, PDI: 4.4 Anal. (calcd): C %, 74.56 (74.56); H %, 9.30 (9.17). 1H-NMR (C$_2$H$_2$C$_{14}$, 400 MHz) 7.14 (br s, 4H), 7.08 (br s, 2H), 7.05 (br s, 2H), 6.98 (br s, 2H), 2.85, (t, 4H), 2.75 (t, 4H), 1.75 (m, 8H), 1.3-1.5 (m, 72H), 0.95 (m, 12H).

Example 5M

Polymer P19

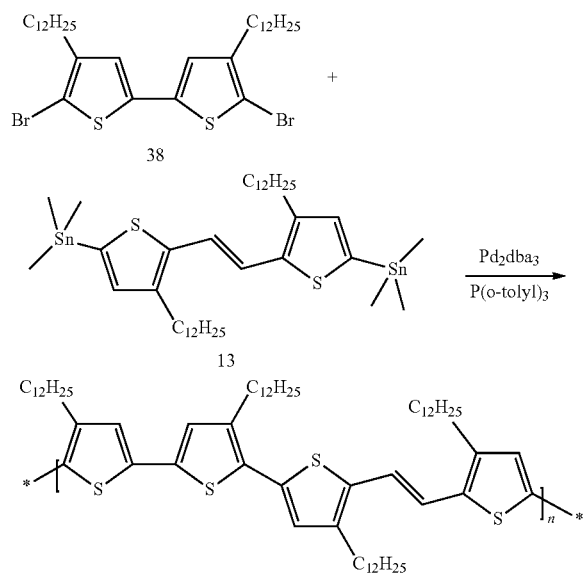

Equimolar amounts of 5,5'-Dibromo-4,4'-bi(dodecyl)-2,2'-bithiophene (38) (0.15 mmol, 100 mg) and monomer 13 (0.15 mmol, 128 mg) were dissolved in anhydrous chlorobenzene (2 mL) followed by the addition of Pd$_2$dba$_3$ (0.005 mmol, 4.6 mg) and tri(o-tolyl)phosphine (0.01 mmol, 3.1 mg) under N$_2$. The resulting mixture was refluxed for 2 days under N$_2$. 2-Bromothiophene and 2-tributylstannylthiophene were added as end cappers, with 2-bromothiophene added first followed by 2-tributylstannylthiophene. After being cooled to room temperature, the reaction mixture was precipitated into a mixture of methanol (300 mL) and stirred for 2 h at room temperature. The polymer P19 was filtered, washed with methanol and subjected to Soxhlet extraction for 24 h in acetone. The polymer P19 was redissolved in THF and precipitated from methanol, filtered, washed with methanol and dried. Mn=1.3×10$^4$, Mw=2.2×10$^4$, PDI=1.7. $^1$H-NMR (1,1,2,2-Tetrachloroethane-d$_2$, 400 MHz) ppm 0.94 (m, 12H) ppm 1.34 (broad peak, 72H) ppm 1.75 (m, 8H) ppm 2.74 (m, 4H) ppm 2.84 (m, 4H) ppm 6.97 (s, 2H) ppm 7.05 (d, 4H, J=6.8 Hz). Anal. (calcd): C, 76.67 (77.13); H, 9.72 (10.40).

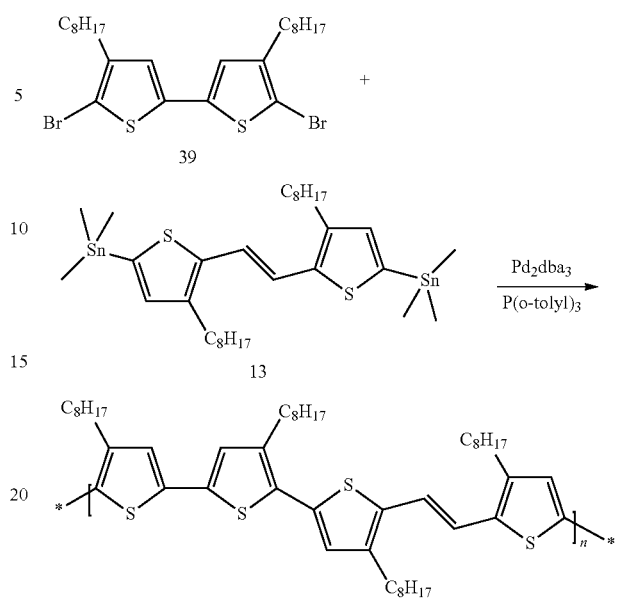

Example 5N

Polymer P20

Equimolar amounts of 5,5'-dibromo-4,4'-di(octyl)-2,2'-bithiophene (39) (0.28 mmol, 153.6 mg) and monomer 13 (0.28 mmol, 208.1 mg) were dissolved in anhydrous chlorobenzene (5.2 mL) followed by the addition of Pd$_2$dba$_3$ (0.0084 mmol, 7.7 mg) and tri(o-tolyl)phosphine (0.0168 mmol, 5.1 mg) under N$_2$. The resulting mixture was refluxed for 2 days under N$_2$. 2-Bromothiophene and 2-tributylstannylthiophene were added as end cappers, with 2-bromothiophene added first followed by 2-tributylstannylthiophene. After being cooled to room temperature, the reaction mixture was precipitated into a mixture of methanol (300 mL) and stirred for 2 h at room temperature. The polymer P20 was filtered, washed with methanol and subjected to Soxhlet extraction for 24 h in acetone. The polymer P20 was redissolved in THF and precipitated from methanol, filtered, washed with methanol and dried. Mn=6.4×10$^3$, PDI=1.55. $^1$H-NMR (CDCl$_3$, 400 MHz) ppm 0.89 (m, 12H) ppm 1.31 (m, 40H) ppm 1.67 (m, 8H) ppm 2.73 (m, 8H) ppm 6.92 (m, 6H). Anal. (calcd): C, 74.48 (74.75); H, 9.72 (9.28).

Example 5O

Polymer P21

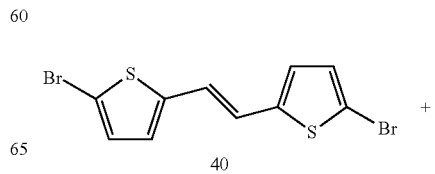

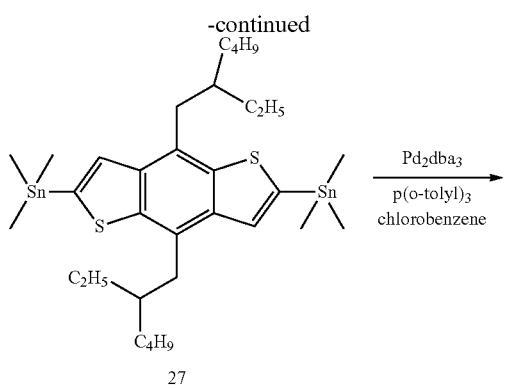

27

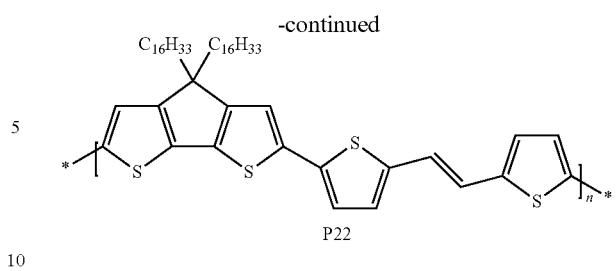

P22

Equimolar amounts of cyclopentadithiophene 41 (0.38 mmol, 300 mg) and monomer 34 (0.38 mmol, 197 mg) were dissolved in anhydrous chlorobenzene (12.7 mL) followed by the addition of $Pd_2dba_3$ (0.011 mmol, 10.4 mg) and $P(o-tolyl)_3$ (0.02 mmol, 6.9 mg) under $N_2$. The resulting mixture was refluxed for 2 days under $N_2$. Bromothiophene and 2-tributylstannyithiophene were added as end cappers, with 2-bromothiophene added first followed by 2-tributylstannylthiophene. After being cooled to room temperature, the reaction mixture was precipitated into a mixture of methanol (500 mL) and stirred for 2 h at room temperature. The polymer P22 was filtered, washed with methanol and subjected to Soxhlet extraction for 24 h in acetone. The polymer P22 was redissolved in chlorobenzene and reprecipitated from methanol, filtered, washed with methanol and dried. Mn=$3.6 \times 10^4$, PDI=2.5. $^1$H-NMR (1,1,2,2-Tetrachloroethane-$d_2$, 400 MHz) ppm 0.95 (t, 6H, J=6.8 Hz) ppm 1.24 (broad peak, 56H) ppm 1.93 (m, 4H) ppm 7.01 (s, 2H) ppm 7.12 (broad peak, 6H). Anal. (calcd): C, 75.16 (75.12); H, 8.59 (9.15).

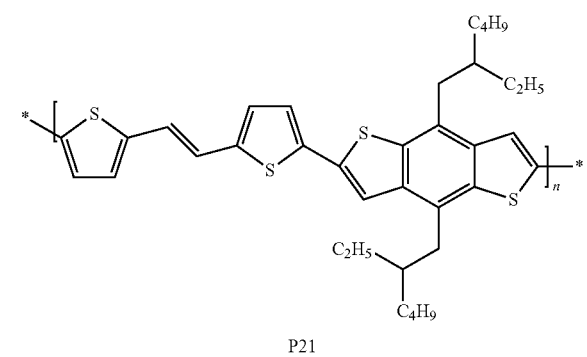

P21

Equimolar amounts of 40 (0.047 g, 0.135 mmol) and 27 (0.1 g, 0.135 mmol), together with $Pd_2dba_3$ (0.00782 g, 0.0081 mmol) and $P(o-tolyl)_3$ (0.00493 g, 0.0162 mmol) were degassed in a 50 ml schlenk tube. Anhydrous chlorobenzene (5 ml) was then added to the mixture. The reaction mixture was refluxed under $N_2$ at 130° C. 2-Bromothiophene and 2-tributylstannylthiophene were added as end cappers, with 2-bromothiophene added first followed by 2-tributylstannylthiophene. The reaction mixture was precipitated in methanol and the crude polymer P21 was filtered and subjected to Soxhlet extraction for 24 h in acetone and dried. Mn: 1640, PDI: 1.5. Anal. (calcd): C %, 71.76 (71.71); H %, 6.92 (7.02).

Example 5P

Polymer P22

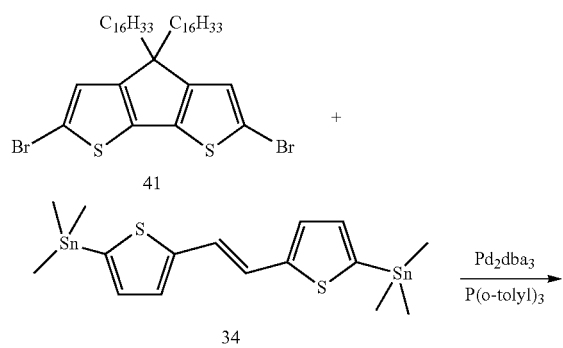

Example 5Q

Polymer P23

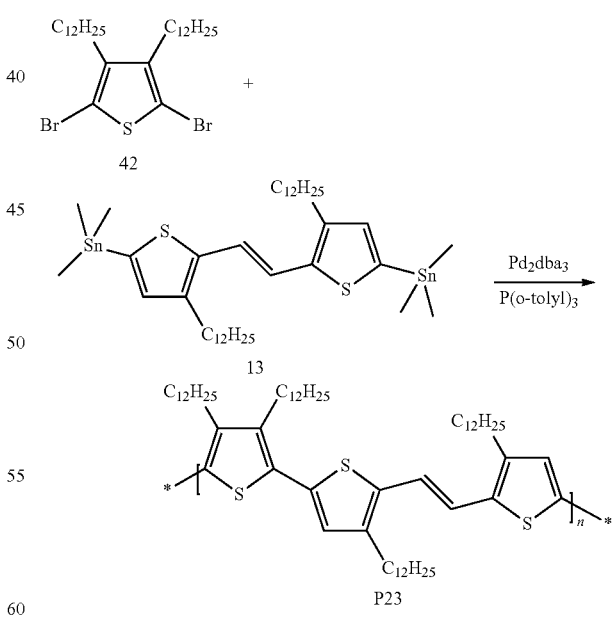

P23

Equimolar amounts of monomer 42 (0.17 mmol, 100 mg) and monomer 13 (0.17 mmol, 145 mg) were dissolved in anhydrous chlorobenzene (1 mL) followed by the addition of $Pd_2dba_3$ (0.005 mmol, 4.6 mg) and tri(o-tolyl)phosphine (0.01 mmol, 3.1 mg) under $N_2$. The resulting mixture was refluxed for 2 days under $N_2$. Bromothiophene and 2-tributylstannylthiophene were added as end cappers, with 2-bromothiophene added first followed by 2-tributylstannylthiophene. After being cooled to room temperature, the reaction mixture was precipitated into a mixture of methanol (300 mL) and stirred for 2 h at room temperature. The polymer P23 was filtered, washed with methanol and subjected to Soxhlet extraction for 24 h in acetone. The polymer P23 was redissolved in THF and precipitated from methanol, filtered, washed with methanol and dried. Mn=1.4×10$^4$, PDI=2.0. $^1$H-NMR (1,1,2,2-tetrachloroethane-d$_2$, 400 MHz) ppm 0.93 (m, 12H) ppm 1.34 (m, 72H) ppm 1.71 (m, 8H) ppm 2.71 (m, 4H) ppm 2.83 (m, 4H) ppm 7.02 (m, 4H).

Example 5R

Polymer P24

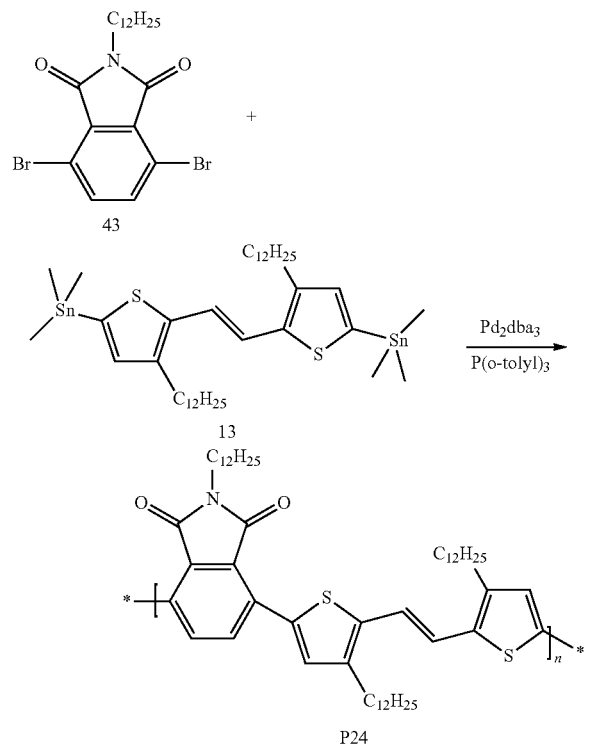

Equimolar amounts of monomer 43 (0.24 mmol, 114 mg) and monomer 13 (0.24 mmol, 205 mg) were dissolved in anhydrous chlorobenzene (4.8 mL) followed by the addition of Pd$_2$dba$_3$ (0.007 mmol, 6.6 mg) and tri(o-tolyl)phosphine (0.01 mmol, 4.4 mg) under N$_2$. The resulting mixture was refluxed for 2 days under N$_2$. Bromothiophene and 2-tributylstannylthiophene were added as end cappers, with 2-bromothiophene added first followed by 2-tributylstannylthiophene. After being cooled to room temperature, the reaction mixture was precipitated into a mixture of methanol (300 mL) and stirred for 2 h at room temperature. The polymer P24 was filtered, washed with methanol and subjected to Soxhlet extraction for 24 h in acetone. The polymer P24 was redissolved in THF and precipitated from methanol, filtered, washed with methanol and dried. Mn=3.5×10$^4$, PDI=4.7. $^1$H-NMR (1,1,2,2-Tetrachloroethane-d$_2$, 400 MHz) ppm 0.94 (m, 9H) ppm 1.35 (m, 54H) ppm 1.80 (m, 6H) ppm 2.83 (t, 4H, J=7.3 Hz) ppm 3.76 (m, 2H) ppm 7.20 (s, 2H) ppm 7.76 (s, 2H) ppm 7.85 (s, 2H).

Compound 43 as prepared according to Dierschke, F.; Jacob, J.; Muellen, K. Synth. Met. 2006, 156, 433.

Example 5S

Polymer P25

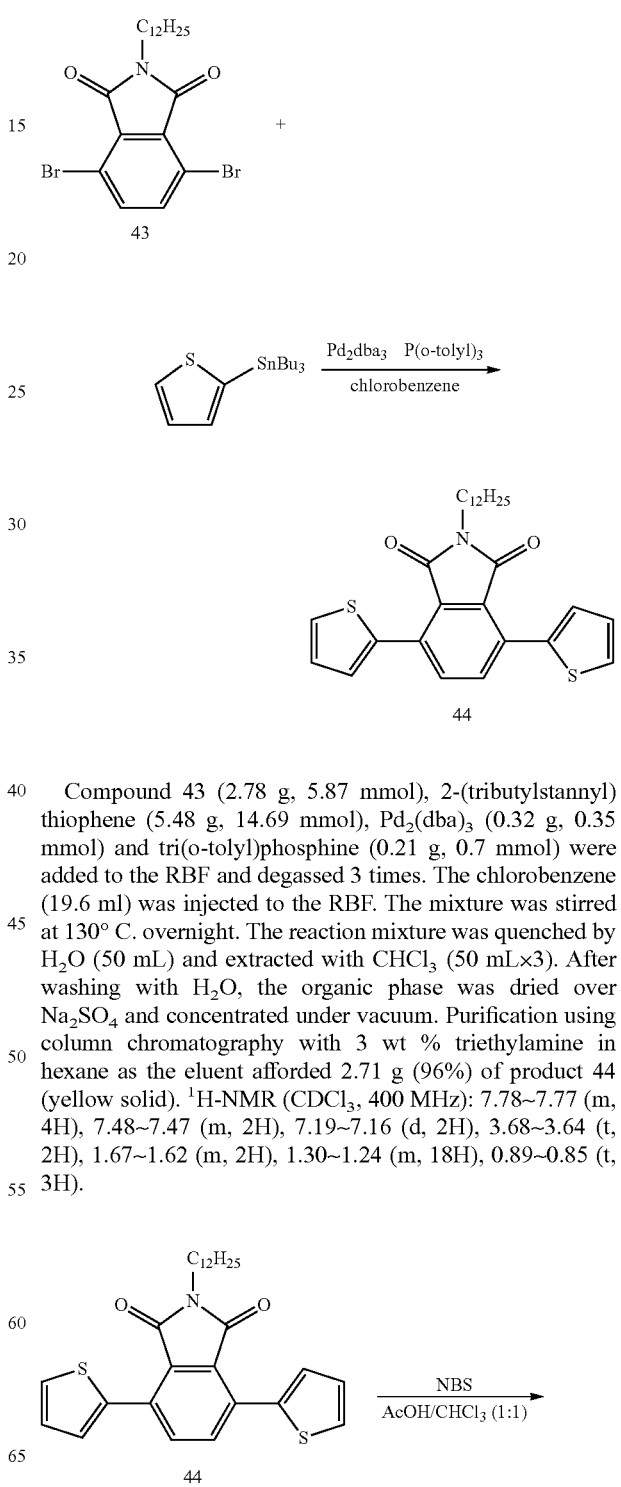

Compound 43 (2.78 g, 5.87 mmol), 2-(tributylstannyl) thiophene (5.48 g, 14.69 mmol), Pd$_2$(dba)$_3$ (0.32 g, 0.35 mmol) and tri(o-tolyl)phosphine (0.21 g, 0.7 mmol) were added to the RBF and degassed 3 times. The chlorobenzene (19.6 ml) was injected to the RBF. The mixture was stirred at 130° C. overnight. The reaction mixture was quenched by H$_2$O (50 mL) and extracted with CHCl$_3$ (50 mL×3). After washing with H$_2$O, the organic phase was dried over Na$_2$SO$_4$ and concentrated under vacuum. Purification using column chromatography with 3 wt % triethylamine in hexane as the eluent afforded 2.71 g (96%) of product 44 (yellow solid). $^1$H-NMR (CDCl$_3$, 400 MHz): 7.78~7.77 (m, 4H), 7.48~7.47 (m, 2H), 7.19~7.16 (d, 2H), 3.68~3.64 (t, 2H), 1.67~1.62 (m, 2H), 1.30~1.24 (m, 18H), 0.89~0.85 (t, 3H).

95

-continued

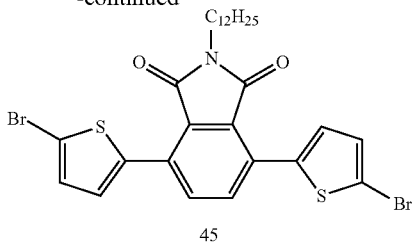

45

Compound 44 (2.61 g, 5.45 mmol), NBS (2.33 g, 13.07 mmol) were dissolved in AcOH (54 ml) and CHCl₃ (54 ml) and then stirred at room temperature overnight. The reaction mixture was quenched by H₂O (50 ml) and extracted with CH₂Cl₂ (50 mL×3). After washing with H₂O, the organic phase was dried over Na₂SO₄ and concentrated under vacuum. Purification using column chromatography with hexane as the eluent afforded 3.12 g (90%) of product 45 (yellow solid). ¹H-NMR (CDCl₃, 400 MHz): 7.69 (s, 2H), 7.52~7.51 (d, 2H), 7.13~7.12 (d, 2H), 3.68~3.64 (t, 2H), 1.31~1.24 (m, 20H), 0.89~0.86 (t, 3H).

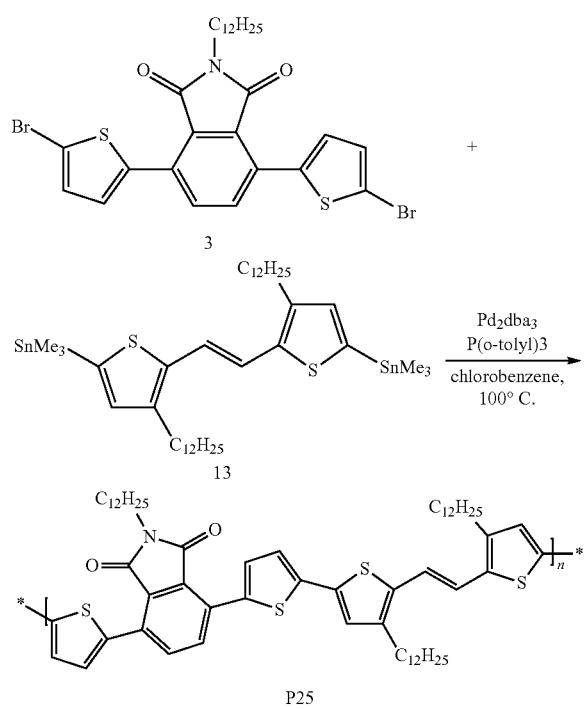

P25

Monomer 45 (200 mg, 0.31 mmol), monomer 13 (268 mg, 0.31 mmol), Pd₂dba₃ (8.6 mg, 0.009 mmol) and tri(o-tolyl)phosphine (5.7 mg, 0.019 mmol) were added into 50 ml Schlenk tube and degassed 3 times. Anhydrous chlorobenzene (6.3 ml) was then added to the mixture. The reaction mixture was stirred at 100° C. overnight. The polymer P25 was precipitated in methanol, filtered and subjected to the Soxhlet extraction in acetone at 85° C. The polymer P25 was then dissolved in chlorobenzene and reprecipitated in methanol. ¹H-NMR (Tetrachloroethane-d2, 400 MHz): 7.86 (m, 4H), 7.29 (m, 2H), 7.12~7.03 (m, 4H), 3.75 (m, 2H), 2.74 (m, 4H), 1.75 (m, 6H), 1.49~1.35 (m, 54H), 0.95 (m, 9H). Mn: 8.2×10³, PDI: 1.48.

96

Example 5T

Polymer P26

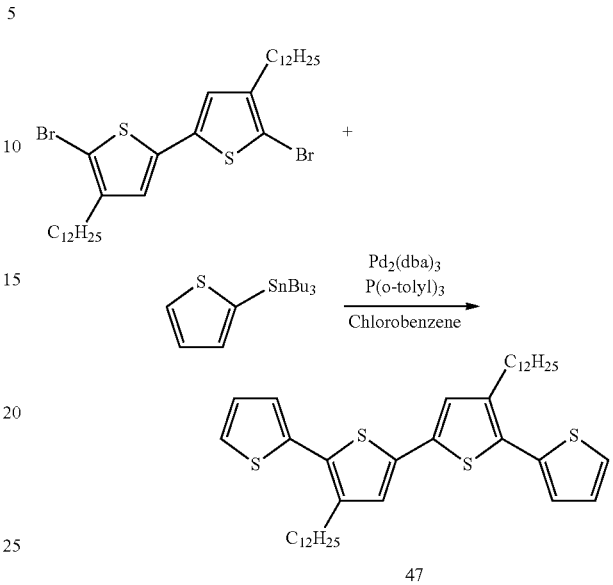

47

Compound 46 (0.5 g, 0.76 mmol), 2-(tributylstannyl) thiophene (0.71 g, 1.89 mmol), Pd₂(dba)₃ (41.7 mg, 0.046 mmol) and tri(o-tolyl)phosphine (27.7 mg, 0.091 mmol) were added to the RBF and degassed 3 times. The chlorobenzene (10 ml) was added to the RBF. The mixture was stirred at 130° C. overnight. The reaction mixture was quenched by H₂O (20 mL) and extracted with CH₂Cl₂ (20 mL×3). After washing with H₂O, the organic phase was dried over Na₂SO₄ and concentrated under vacuum. Purification using chromatography with hexane as the eluent afforded 0.5 g (99%) yellow solid. ¹H-NMR (CDCl₃, 400 MHz): 7.31~7.30 (d, 2H), 7.13~7.12 (d, 2H), 7.08~7.06 (t, 2H), 7.00 (s, 2H), 2.74~2.70 (t, 4H), 1.69~1.61 (m, 4H), 1.39~1.26 (m, 36H), 0.90~0.88 (t, 6H).

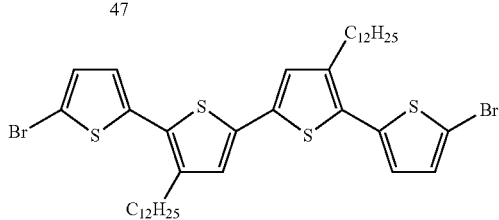

48

Compound 47 (0.1 g, 0.15 mmol) was dissolved in DMF (0.5 ml) and cooled to 0° C. NBS (0.053 g, 0.30 mmol) dissolved in 0.5 ml DMF was then added dropwise over 12 min to the mixture and the reaction was monitored by TLC.

The reaction mixture was precipitated in methanol, filtered and dried to afford 0.1 g (81%) of monomer 48 (yellow solid). $^1$H-NMR (CDCl$_3$, 400 MHz): 7.02~7.01 (d, 2H), 6.97 (s, 2H), 6.87~6.86 (d, 2H), 2.69~2.65 (t, 4H), 1.67~1.57 (m, 4H), 1.36~1.26 (m, 36H), 0.90~0.86 (t, 6H). (M+): 825.0. found: 825.1.

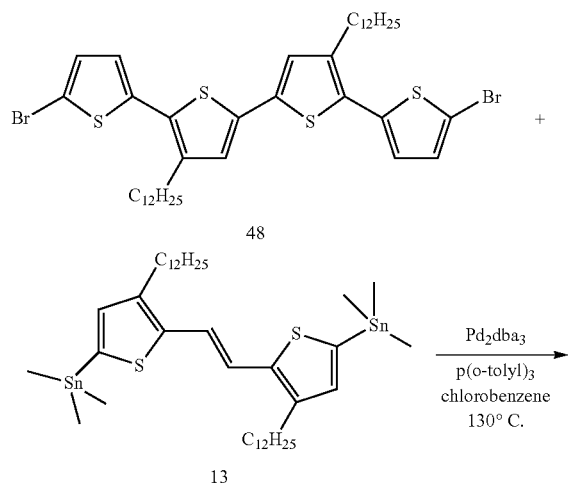

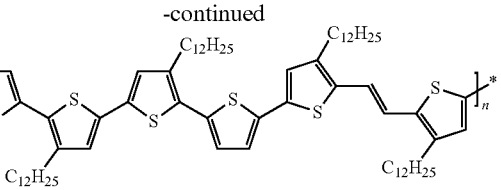

P26

Monomer 48 (200 mg, 0.24 mmol), monomer 13 (207 mg, 0.24 mmol), Pd$_2$dba$_3$ (7 mg, 0.007 mmol) and tri(o-tolyl) phosphine (4 mg, 0.014 mmol) were added into 50 ml Schlenk tube and degassed 3 times. Anhydrous chlorobenzene (8 ml) was then added to the mixture. The reaction mixture was stirred at 130° C. for 3 days. The polymer P26 was precipitated in methanol, filtered and subjected to the Soxhlet extraction in acetone at 85° C. The polymer P26 was then dissolved in THF and reprecipitated in methanol. $^1$H-NMR (Tetrachloroethane-d2, 400 MHz): 7.16~6.96 (m, 8H), 6.22 (s, 1H), 5.77 (s, 1H), 2.78~2.67 (m, 8H), 1.69~1.56 (m, 8H), 1.36~1.27 (m, 72H), 0.89~0.87 (m, 12H). Mn: 1.8×10$^4$, PDI: 2.20.

TABLE 3

| Name | Structure |
|------|-----------|
| P7 | (structure shown) |
| P8 | (structure shown) |
| P9 | (structure shown) |

TABLE 3-continued

| Name | Structure |
|---|---|
| P10 | (structure) |
| P11 | (structure) |
| P12 | (structure) |
| P13 | (structure) |
| P14 | (structure) |
| P15 | (structure) |
| P16 | (structure) |

TABLE 3-continued
| Name | Structure |
|---|---|
| P17 | 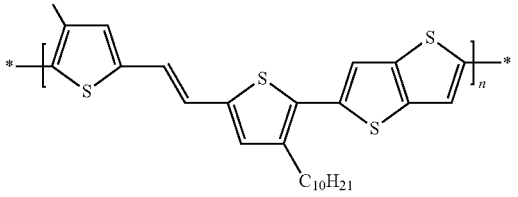 |
| P18 | 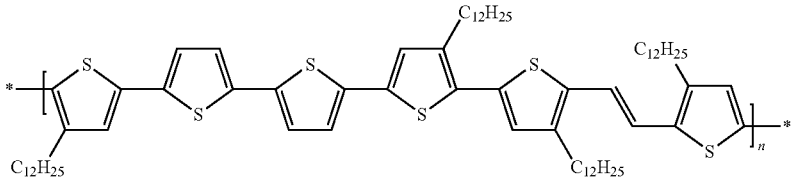 |
| P19 | 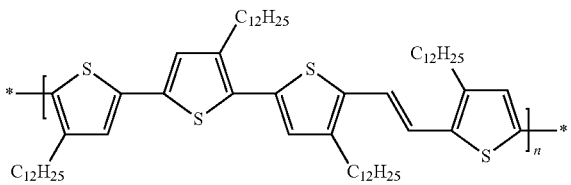 |
| P20 | 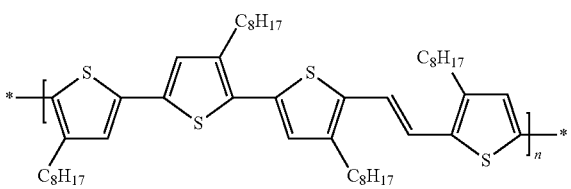 |
| P21 | 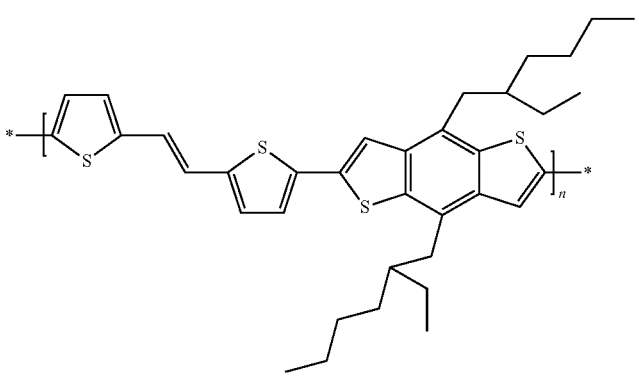 |
| P22 | 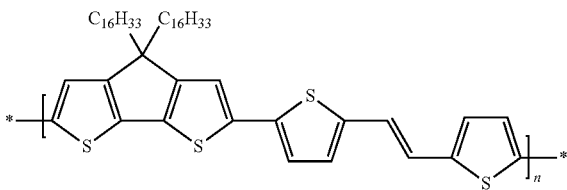 |
| P23 | 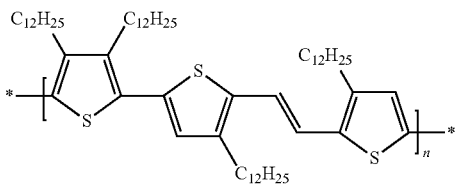 |

TABLE 3-continued

| Name | Structure |
|---|---|
| P24 | (structure shown) |
| P25 | (structure shown) |
| P26 | (structure shown) |

Example 6

Device Fabrication

Devices were made in bottom gate bottom contact (BGBC) and top gate bottom contact (TGBC) architectures by solution deposition. The polymer solutions were prepared by solubilizing the polymers in 1,2-dichlorobenzene and heating them inside oven until they became soluble (90-150° C.). Solutions were then filtered using a 0.45 μm filter. For partially soluble polymers dissolution was supported by, sonication. All transistors were made and tested in ambient environment.

Example 6a

Fabrication of Bottom-Gate Bottom-Contact Transistors (BGBC-TFT)

For preparing BGBC-TFT, heavily doped Si wafer was used as substrate and gate electrode with 200 nm thermally grown $SiO_2$ serving as gate dielectric. Source and drain electrode were made of gold which were lithographically patterned. Before semiconductor deposition, the substrates were vapor treated with hexamethyldisilazane (HMDS). Subsequently, semiconductor deposition was done by spin coating or drop casting under the conditions summarized in Table 4.

TABLE 4

| Sample | Concentration | Deposition Method | Deposition Condition |
|---|---|---|---|
| P7 | 10 mg/ml | Drop casting | Drop on 50° C. hotplate |
| P8 | 10 mg/ml | Spin coating | 2000 rpm, 1 minute |
| P9 | 10 mg/ml | Spin coating | 2000 rpm, 1 minute |
| P10 | 5 mg/ml | Spin coating | 2000 rpm, 1 minute |
| P11 | 5 mg/ml | Spin coating | 2000 rpm, 1 minute |
| P12 | 10 mg/ml | Spin coating | 2000 rpm, 1 minute |
| P13 | 10 mg/ml | Spin coating | 2000 rpm, 1 minute |
| P14 | 10 mg/ml | Spin coating | 2000 rpm, 1 minute |
| P15 | 10 mg/ml | Spin coating | 2000 rpm, 1 minute |
| P16 | 10 mg/ml | spin coating | 2000 rpm, 1 minute |
| P17 | 10 mg/ml | spin coating | 2000 rpm, 1 minute |
| P18 | 30 mg/ml | spin coating | 3500 rpm, 1 minute |
| P19 | 20 mg/ml | Spin coating | 2000 rpm, 1 minute |
| P20 | 20 mg/ml | Spin coating | 2000 rpm, 1 minute |
| P21 | 5 mg/ml | Drop casting | Drop on 90° C. hotplate |
| P22 | 10 mg/ml | Spin coating | 1500 rpm, 1 minute |
| P23 | 20 mg/ml | Spin coating | 2000 rpm, 1 minute |
| P24 | 10 mg/ml | Spin coating | 2000 rpm, 1 minute |
| P25 | 15 mg/ml | Spin coating | 2000 rpm |

Example 6b

Fabrication of Top-Gate Bottom-Contact Transistors (TGBC-TFT)

For preparing TGBC-devices, two different types of substrates, which were glass and PET (polyethylene terephthalate) substrates, were used. For glass substrates, source/drain (S/D) gold pads were deposited onto bare glass substrates by evaporation. Prior to semiconductor deposition, the surface of the substrate was blown dry to remove dust particles that might adhere to it. For PET-substrates whose source-drain layouts were lithographically patterned, substrate preparation started by rinsing them with acetone to strip off the photo-resist layer as well as adhered particles. Substrates were then heated using the hot plate (90° C. for 30 seconds) to further enhance the adhesion of gold S/D lines.

Semiconductor deposition: Subsequently, semiconductor deposition was done by spincoating based on the conditions summarized in Table 5. Annealing was done a glove box using a hot plate.

Dielectric deposition: Dielectrics solution was prepared by dissolving 4 wt % polystyrene (PS) in isopropylacetate. It was then deposited on top of semiconductor layer also by spincoating applying the following conditions: 3600 rpm, 255 acc, 30 s; 90° C., 30 s. After dielectric encapsulation, gold gate pads were also deposited by evaporation. For glass substrates, prior to IV measurement, S/D contact pads were exposed by dipping into 1,2-dichlorobenzene to dissolve the PS layer.

TABLE 5

| Sample | Concentration | Dielectric Material | Annealing temperature* | Thickness | Spin coat condition |
|---|---|---|---|---|---|
| P9 | 10 mg/ml | PS | RT | [30]/[400] | 1500 rpm; 120° C. 10 s |
| P12 | 10 mg/ml | PS | RT | [27]/[560] | 2000 rpm; 100° C. 30 s |
| P12 | 10 mg/ml | PS | 80° C. 1 hour | [27]/[560] | 2000 rpm; 100° C. 30 s |
| P13 | 7 mg/ml | PS | RT | [26]/[560] | 1000 rpm; 100° C. 30 s |
| P13 | 7 mg/ml | PS | 100° C. 1 hour | [26]/[560] | 1000 rpm; 100° C. 30 s |
| P16 | 10 mg/ml | PS | RT | [25]/[400] | 1000 rpm; 100° C. 30 s |
| P17 | 10 mg/ml | PS | RT | [40]/[400] | 1000 rpm,; 100° C. 30 s |
| P24 | 5 mg/ml | PS | RT | [30]/[400] | 1500 rpm; 130° C. 30 s |
| P19-PET | 20 mg/ml | PS | RT | [60]/[400] | 1000 rpm; 120° C. 30 s |
| P18-PET | 15 mg/ml | PS | RT | [50]/[400] | 1000 rpm; 130° C. 30 s |
| P24-PET | 5 mg/ml | PS | RT | [30]/[400] | 1500 rpm; 90° C. 30 s |
| P25-PET | 15 mg/ml | PS | | | 2000 rpm |
| P26-PET | 15 mg/ml | PS | | | |

*room temperature

Example 7

Device Characterization

Example 7a

BGBC-TFTs

The measurements were carried out on transistors with a channel length of 5 μm and channel width of 350 μm. The results are summarized in Table 6 below (Vd=drain voltage, Vg=gate voltage).

I-V Measurement:
Measurement Condition for P7, P8, P9, P10, P11, P12:
 Vd=−10V and −120V
 Vg sweep from 20- to −90V
Measurement Condition for P14:
 Vd=−10V and −60V
 Vg sweep from 20 to −60V
Measurement Condition for Other Polymers:
 Vd=−10V and −90V
 Vg sweep from 20 to −90V

TABLE 6

| Sample | μ (cm$^2$/Vs) | $V_{on}$(V) | On/Off |
|---|---|---|---|
| P7-RT | 1.05E−02 | 0 | 3.80E+03 |
| P8-RT | 1.14E−02 | 0 | 1.05E+05 |

TABLE 6-continued

| Sample | μ (cm$^2$/Vs) | $V_{on}$(V) | On/Off |
|---|---|---|---|
| P9-RT | 1.23E−02 | 0 | 2.14E+04 |
| P10-RT | 2.41E−02 | 10 | 6.78E+05 |
| P11-RT | 3.47E−03 | −25 | 2.31E+03 |
| P12-RT | 1.88E−02 | 0 | 2.49E+03 |
| P13-RT | 1.37E−01 | 10 | 1.11E+05 |
| P14-RT | 5.60E−06 | −10 | 4.11E+02 |
| P15-RT | 1.20E−02 | 0 | 1.01E+05 |
| P16-RT | 2.85E−02 | 5 | 5.99E+04 |
| P17-RT | 2.92E−02 | 0 | 1.30E+04 |
| P18-RT | 1.62E−01 | 15 | 3.85E+04 |
| P19-RT | 2.80E−01 | 15 | 4.26E+04 |
| P20-RT | 1.62E−01 | 15 | 6.65E+03 |
| P21-RT | 2.67E−05 | 0 | 2.08E+02 |
| P22-RT | 7.76E−03 | 5 | 2.42E+04 |

TABLE 6-continued

| Sample | μ (cm$^2$/Vs) | $V_{on}$(V) | On/Off |
|---|---|---|---|
| P23-RT | 6.03E−02 | 0 | 1.29E+03 |
| P24-RT | 1.12E−01 | −15 | 1.41E+07 |
| P25-RT | 1.46E−03 | 5 | 6.23E+03 |

Example 7b

TGBC-TFTs

I-V Measurement:
Measurement Condition for P18:
 Vd=−80V and −1V
 Vg sweep from 40 to −40V
Measurement Condition for P16:
 Vd=−60V and −1V
 Vg sweep from 60 to −60V
Measurement Condition for P24:
 Vd=−60V and −1V
 Vg sweep from 10 to −40V
Measurement Condition for P24-PET:
 Vd=−40V and −1V
 Vg sweep from 10 to −40V
Measurement Condition for Other Polymers:
 Vd=−60V and −1V
 Vg sweep from 20 to −60V The results are summarized in Table 7 below.

TABLE 7

| Sample | μ (cm²/Vs) | $V_{on}$(V) | On/Off |
|---|---|---|---|
| P9-RT | 1E−02 | −8 | 2.79E+02 |
| P12-RT | 3.04E−02 | −2 | 1.32E+02 |
| P12-80° C. | 2.47E−02 | −4 | 37 |
| P13-RT | 5.32E−02 | −18 | 6 |
| P13-100° C. | 7.85E−02 | −6 | 33 |
| P16-RT | 2.42E−04 | −5 | 7.55E01 |
| P17-RT | 3.10E−04 | −10 | 14.6 |
| P24-RT | 2.14E−01 | 0 | 2.91E+03 |
| P19-PET-RT | 4.34E−02 | — | 1.37E+02 |
| P18-PET-RT | 0.309 | 20 | 2.08E+03 |
| P24-PET-RT | 0.138 | 2.5 | 5.03E+06 |
| P25-PET-RT | 1.09E−05 | 0 | 1.36E+02 |
| P26-PET-RT | 0.157 | 20 | 1.85E+04 |

Example 7C

BGTC-TFT

TABLE 8

| Sample | Conc. | Dielectric Material | Spin Coat Condition | μ (cm²/Vs) | $V_{on}$ (V) | On/Off |
|---|---|---|---|---|---|---|
| P25 | 15 mg/ml | SiO₂ | 2000 rpm | 4.84E−04 | 0 | 2.04E03 |

The invention claimed is:

1. A polymer, comprising a repeat unit is selected from the group consisting of the formula Ia and Ia':

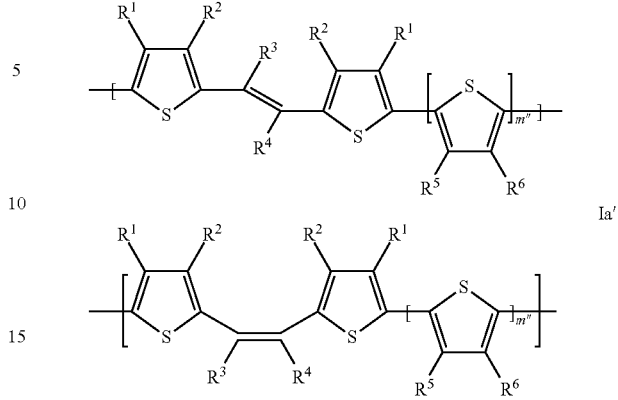

wherein:
R¹ and R² are selected from the group consisting of H, halogen, CN, a
C₁₋₃₀ alkyl group, a C₂₋₃₀ alkenyl group, a C₁₋₃₀ habalkyl group, a C₁₋₂₀ alkoxy group and a C₁₋₂₀ alkylthio group,
R³ and R⁴ are selected from the group consisting of H, CN, halogen, a C₁₋₃₀ alkyl group, a C₂₋₃₀ alkenyl group, a C₁₋₃₀ habalkyl group, a C₁₋₂₀ alkoxy group and a C₁₋₂₀ alkylthio group,
R⁵ and R⁶ are defined as R¹, and
m" is 2, 3, 4, 5, 6, 7, 8, 9 or 10.

2. The polymer of claim 1, wherein the repeat unit is selected from the group consisting of:

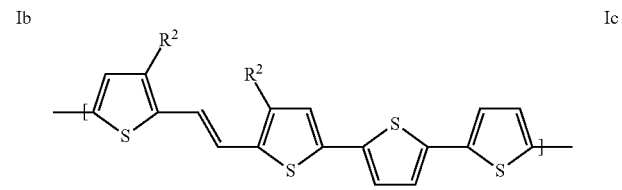

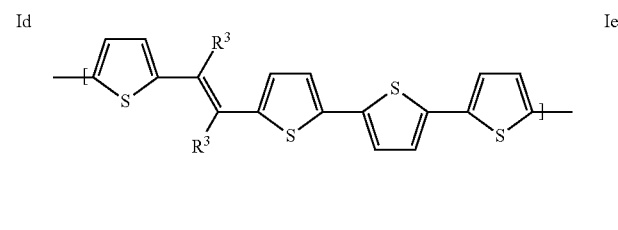

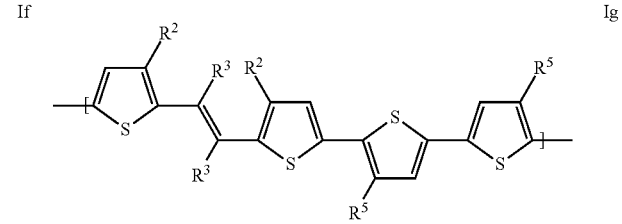

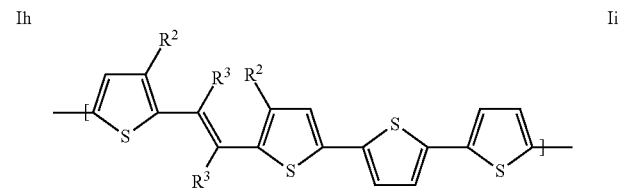

-continued
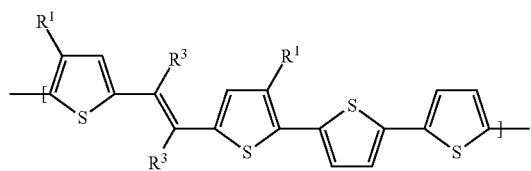
Ij
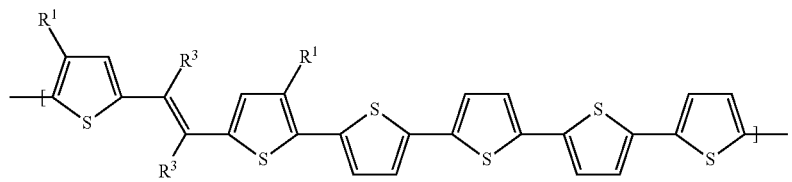
Ik
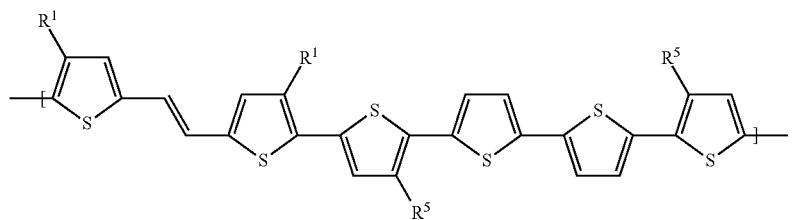
Il
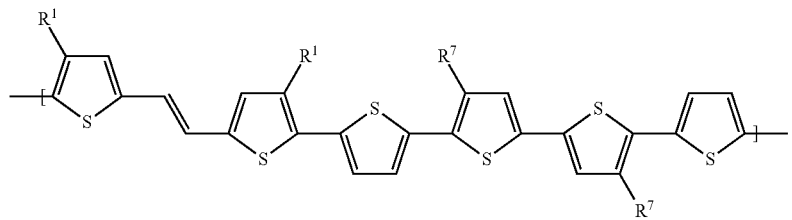
Im
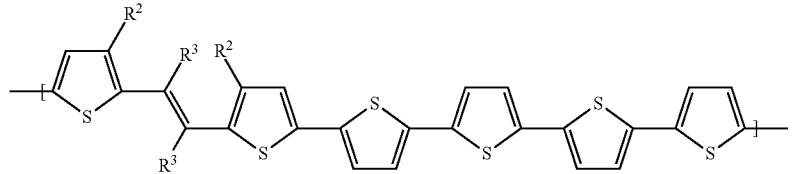
In
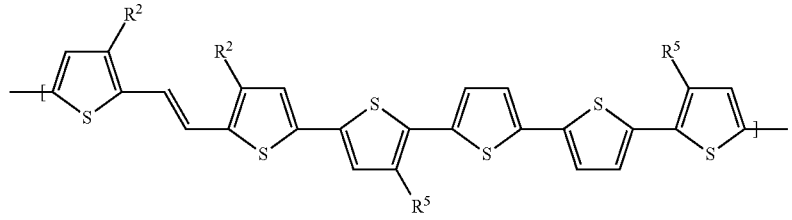
Io
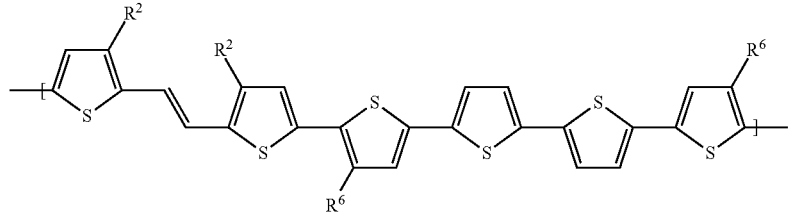
Ip

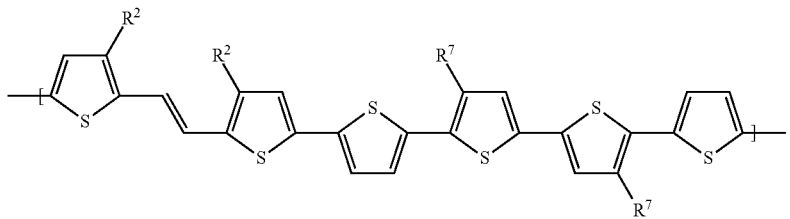
Iq
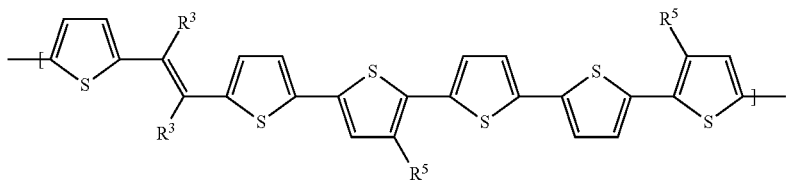
Ir
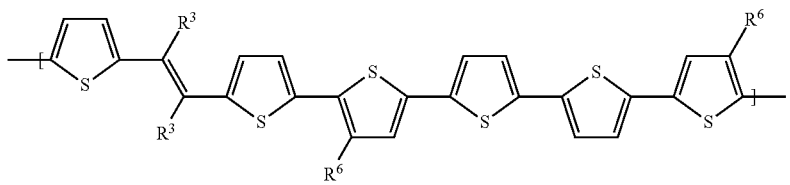
Is
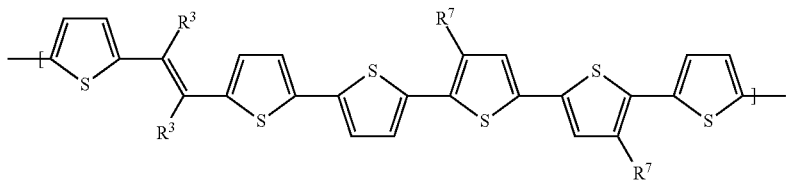
It
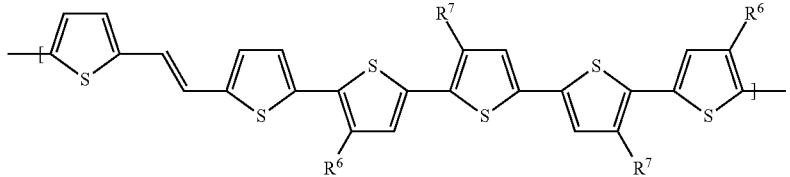
Iu
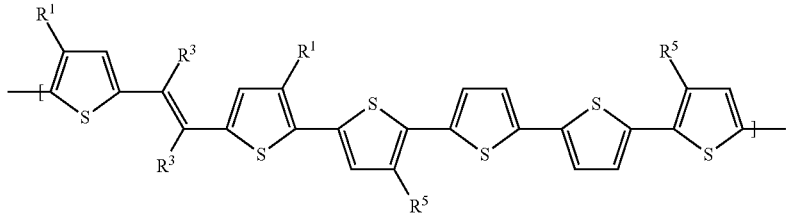
Iv
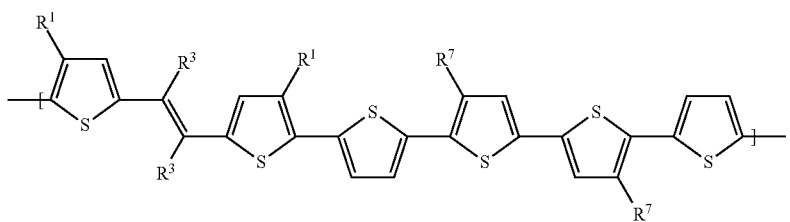
Iw -continued
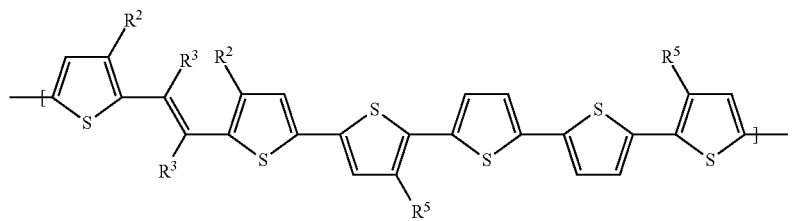
Ix
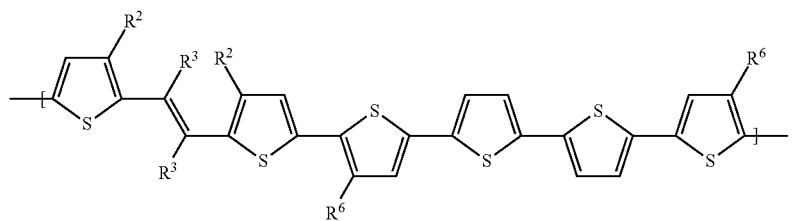
Iy
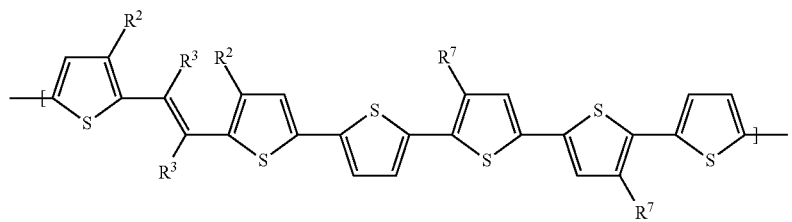
Iz
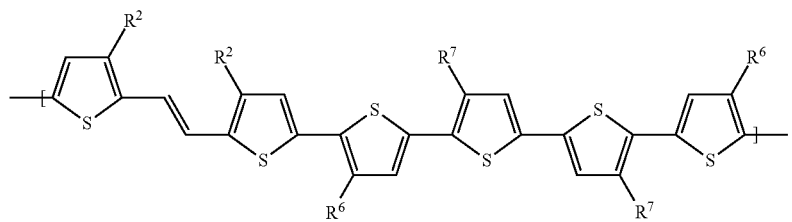
Iaa
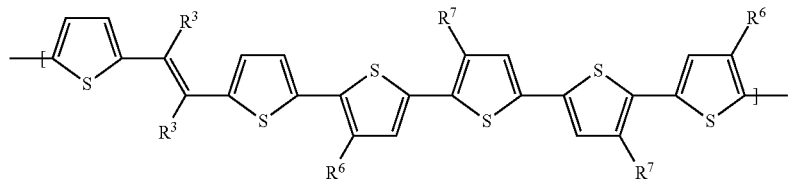
Iab
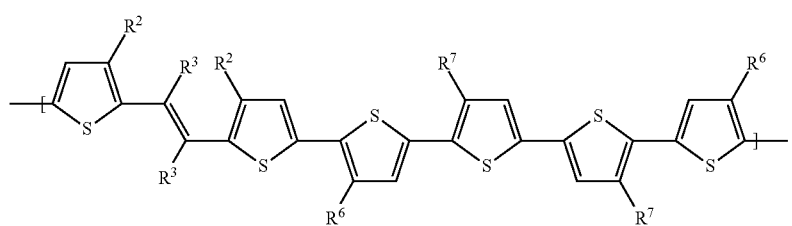
Iac wherein $R^1$, $R^2$, $R^3$, $R^4$, $R^5$, $R^6$, $R^7$ and $R^8$ are as defined herein.

3. The polymer according to claim 1, wherein the repeat unit is the formula:

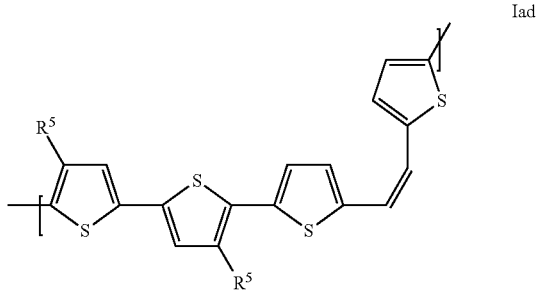

Iad wherein $R^5$ is as defined herein.

4. The polymer according to claim 1, wherein n is an integer between 2 and 5000.

5. A composition, comprising one or more polymers of claim 1 dissolved or dispersed in a liquid medium.

6. The composition of claim 5, wherein the liquid medium comprises water or an organic solvent.

7. The composition of claim 5, further comprising one or more additives.

8. The composition of claim 7, wherein the additives are independently selected from the group consisting of viscosity modulators, detergents, dispersants, binding agents, compatiblizing agents, curing agents, initiators, humectants, antifoaming agents, wetting agents, pH modifiers, biocides, and bactereriostats.

9. A thin film semiconductor, comprising one or more polymers of claim 1.

10. A field effect transistor device, comprising the thin film semiconductor of claim 9.

11. The field effect transistor device of claim 10, wherein the field effect transistor has a structure selected from top-gate bottom-contact structure, bottom-gate top-contact structure, top-gate top-contact structure, and bottom-gate bottom-contact structure.

12. A photovoltaic device, comprising the thin film semiconductor of claim 9.

13. An organic light emitting device, comprising the thin film semiconductor of claim 9.

14. The polymer according to claim 1, wherein when the repeat unit is a structure of formula Ia, m" is 2, 3, 4, 5, 6, 7, 8, 9 or 10, and when the repeat unit is a structure of formula Ia', m" is 3, 4, 5, 6, 7, 8, 9 or 10.

* * * * *